United States Patent
Barth et al.

(10) Patent No.: US 8,560,797 B2
(45) Date of Patent: *Oct. 15, 2013

(54) METHOD AND APPARATUS FOR INDICATING MASK INFORMATION

(75) Inventors: Richard M. Barth, Palo Alto, CA (US); Frederick A. Ware, Los Altos Hills, CA (US); Donald C. Stark, Los Altos, CA (US); Craig E. Hampel, San Jose, CA (US); Paul G. Davis, San Jose, CA (US); Abhijit M. Abhyankar, Sunnyvale, CA (US); James A. Gasborro, Mountain View, CA (US); David Nguyen, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/421,701

(22) Filed: Mar. 15, 2012

(65) Prior Publication Data

US 2012/0173810 A1 Jul. 5, 2012

Related U.S. Application Data

(60) Continuation of application No. 13/230,741, filed on Sep. 12, 2011, now Pat. No. 8,205,056, which is a continuation of application No. 12/875,483, filed on Sep. 3, 2010, now Pat. No. 8,019,958, which is a continuation of application No. 12/349,485, filed on Jan. 6, 2009, now Pat. No. 7,793,039, which is a continuation of application No. 11/953,803, filed on Dec. 10, 2007, now Pat. No. 7,496,709, which is a continuation of application No. 11/692,159, filed on Mar. 27, 2007, now Pat. No. 7,330,952, which is a continuation of application No. 11/059,216, filed on Feb. 15, 2005, now Pat. No. 7,197,611, which is a continuation of application No. 10/128,167, filed on Apr. 22, 2002, now Pat. No. 6,868,474, which is a division of application No. 09/169,206, filed on Oct. 9, 1998, now Pat. No. 6,401,167.

(60) Provisional application No. 60/061,770, filed on Oct. 10, 1997.

(51) Int. Cl.
*G06F 12/00* (2006.01)

(52) U.S. Cl.
USPC ...... 711/167; 711/105; 711/106; 711/E12.001

(58) Field of Classification Search
USPC .................... 711/105, 167, E12.001, 106
See application file for complete search history.

(56) References Cited

U.S. PATENT DOCUMENTS

| | | |
|---|---|---|
| 3,950,735 A | 4/1976 | Patel |
| 4,183,095 A | 1/1980 | Ward |
| 4,315,308 A | 2/1982 | Jackson |
| 4,330,852 A | 5/1982 | Redwine et al. |
| 4,337,523 A | 6/1982 | Hotta et al. |
| 4,445,204 A | 4/1984 | Nishiguchi |
| 4,499,536 A | 2/1985 | Gemma et al. |
| 4,528,661 A | 7/1985 | Bahr et al. |
| 4,637,018 A | 1/1987 | Flora et al. |
| 4,646,270 A | 2/1987 | Voss |
| 4,712,190 A | 12/1987 | Guglielmi et al. |
| 4,719,568 A | 1/1988 | Carrubba et al. |
| 4,719,602 A | 1/1988 | Hag et al. |
| 4,755,937 A | 7/1988 | Glier |
| 4,763,249 A | 8/1988 | Bomba et al. |
| 4,792,926 A | 12/1988 | Roberts |
| 4,792,929 A | 12/1988 | Olson et al. |
| 4,799,199 A | 1/1989 | Scales, III et al. |
| 4,800,530 A | 1/1989 | Itoh et al. |
| 4,821,226 A | 4/1989 | Christopher et al. |
| 4,825,411 A | 4/1989 | Hamano |
| 4,845,644 A | 7/1989 | Anthias et al. |
| 4,845,664 A | 7/1989 | Aichelmann, Jr. et al. |
| 4,845,677 A | 7/1989 | Chappell et al. |
| 4,849,937 A | 7/1989 | Yoshimoto |
| 4,866,675 A | 9/1989 | Kawashima |
| 4,875,192 A | 10/1989 | Matsumoto |
| 4,882,712 A | 11/1989 | Ohno et al. |
| 4,891,791 A | 1/1990 | Iijima |
| 4,916,670 A | 4/1990 | Suzuki et al. |
| 4,920,483 A | 4/1990 | Pogue et al. |
| 4,928,265 A | 5/1990 | Higuchi et al. |

| Patent | Date | Inventor |
|---|---|---|
| 4,937,734 A | 6/1990 | Bechtolsheim |
| 4,945,516 A | 7/1990 | Kashiyama |
| 4,953,128 A | 8/1990 | Kawai |
| 5,001,672 A | 3/1991 | Ebbers et al. |
| 5,022,004 A | 6/1991 | Kurtze et al. |
| 5,077,693 A | 12/1991 | Hardee et al. |
| 5,083,296 A | 1/1992 | Hara et al. |
| 5,111,386 A | 5/1992 | Fujishima et al. |
| 5,124,589 A | 6/1992 | Shiomi et al. |
| 5,140,688 A | 8/1992 | White et al. |
| 5,150,467 A | 9/1992 | Hayes et al. |
| 5,159,676 A | 10/1992 | Wicklund et al. |
| 5,179,687 A | 1/1993 | Hidaka et al. |
| 5,260,905 A | 11/1993 | Mori |
| 5,272,664 A | 12/1993 | Alexander et al. |
| 5,276,858 A | 1/1994 | Oak et al. |
| 5,301,278 A | 4/1994 | Bowater et al. |
| 5,305,278 A | 4/1994 | Inoue |
| 5,311,483 A | 5/1994 | Takasugi |
| 5,319,755 A | 6/1994 | Mark et al. |
| 5,323,358 A | 6/1994 | Toda et al. |
| 5,327,390 A | 7/1994 | Takasugi |
| 5,337,285 A | 8/1994 | Ware et al. |
| 5,339,276 A | 8/1994 | Takasugi |
| 5,341,341 A | 8/1994 | Fukuzo |
| 5,345,573 A | 9/1994 | Bowden, III et al. |
| 5,365,489 A | 11/1994 | Jeong |
| 5,375,089 A | 12/1994 | Lo |
| 5,381,376 A | 1/1995 | Kim et al. |
| 5,381,538 A | 1/1995 | Amini et al. |
| 5,384,745 A | 1/1995 | Konishi et al. |
| 5,386,385 A | 1/1995 | Stephens, Jr. |
| 5,388,222 A | 2/1995 | Chisvin et al. |
| 5,388,250 A | 2/1995 | Lewis et al. |
| 5,390,149 A | 2/1995 | Vogley et al. |
| 5,392,239 A | 2/1995 | Margulis et al. |
| 5,404,338 A | 4/1995 | Murai et al. |
| 5,404,463 A | 4/1995 | McGarvey |
| 5,430,676 A | 7/1995 | Ware et al. |
| 5,432,468 A | 7/1995 | Moriyama et al. |
| 5,438,535 A | 8/1995 | Lattibeaudiere |
| 5,444,667 A | 8/1995 | Obara |
| 5,452,401 A | 9/1995 | Lin |
| 5,455,803 A | 10/1995 | Kodama |
| 5,471,607 A | 11/1995 | Garde |
| 5,483,640 A | 1/1996 | Isfeld et al. |
| 5,504,874 A | 4/1996 | Galles et al. |
| 5,508,960 A | 4/1996 | Pinkham |
| 5,511,024 A | 4/1996 | Ware et al. |
| 5,533,054 A | 7/1996 | DeAndrea et al. |
| 5,533,204 A | 7/1996 | Tipley |
| 5,542,067 A | 7/1996 | Chappell et al. |
| 5,548,786 A | 8/1996 | Amini et al. |
| 5,553,248 A | 9/1996 | Melo et al. |
| 5,560,000 A | 9/1996 | Vogley |
| 5,568,445 A | 10/1996 | Park et al. |
| 5,577,236 A | 11/1996 | Johnson et al. |
| 5,581,746 A | 12/1996 | Watanabe |
| 5,588,130 A | 12/1996 | Fujishima et al. |
| 5,594,704 A | 1/1997 | Konishi et al. |
| 5,598,376 A | 1/1997 | Merritt et al. |
| 5,611,058 A | 3/1997 | Moore et al. |
| 5,613,075 A | 3/1997 | Wade et al. |
| 5,615,358 A | 3/1997 | Vogley |
| 5,623,607 A | 4/1997 | Kodama et al. |
| 5,636,173 A | 6/1997 | Schaefer |
| 5,638,531 A | 6/1997 | Crump et al. |
| 5,646,904 A | 7/1997 | Ohno et al. |
| 5,649,161 A | 7/1997 | Andrade et al. |
| 5,652,723 A * | 7/1997 | Dosaka et al. ............ 365/189.2 |
| 5,655,113 A | 8/1997 | Leung |
| 5,659,515 A | 8/1997 | Matsuo et al. |
| 5,673,226 A | 9/1997 | Yumitori et al. |
| 5,673,252 A | 9/1997 | Johnson et al. |
| 5,680,361 A | 10/1997 | Ware et al. |
| 5,708,622 A | 1/1998 | Ohtani et al. |
| 5,715,407 A | 2/1998 | Barth et al. |
| 5,737,587 A | 4/1998 | Leung et al. |
| 5,740,398 A | 4/1998 | Quattromani et al. |
| 5,748,914 A | 5/1998 | Ware et al. |
| 5,758,132 A | 5/1998 | Stråhlin |
| 5,764,963 A | 6/1998 | Ware et al. |
| 5,765,020 A | 6/1998 | Barth et al. |
| 5,774,409 A | 6/1998 | Yamazaki et al. |
| 5,777,942 A | 7/1998 | Dosaka et al. |
| 5,778,419 A | 7/1998 | Hansen et al. |
| 5,781,918 A | 7/1998 | Lieberman et al. |
| 5,793,227 A | 8/1998 | Goldrian |
| 5,796,995 A | 8/1998 | Nasserbakht et al. |
| 5,802,356 A | 9/1998 | Gaskins et al. |
| 5,802,555 A | 9/1998 | Shigeeda |
| 5,805,873 A | 9/1998 | Roy |
| 5,815,693 A | 9/1998 | McDermott et al. |
| 5,819,076 A | 10/1998 | Jeddeloh et al. |
| 5,828,606 A | 10/1998 | Mick |
| 5,844,855 A | 12/1998 | Ware et al. |
| 5,857,095 A | 1/1999 | Jeddeloh et al. |
| 5,870,350 A | 2/1999 | Bertin et al. |
| 5,872,996 A | 2/1999 | Barth et al. |
| 5,884,100 A | 3/1999 | Normoyle et al. |
| 5,886,948 A | 3/1999 | Ryan |
| 5,896,545 A | 4/1999 | Barth et al. |
| 5,917,760 A | 6/1999 | Millar |
| 5,918,058 A | 6/1999 | Bud |
| 5,940,340 A | 8/1999 | Ware et al. |
| 5,948,081 A | 9/1999 | Foster |
| 5,953,263 A | 9/1999 | Farmwald et al. |
| 5,956,284 A | 9/1999 | Ware et al. |
| 5,966,343 A | 10/1999 | Thurston |
| 5,970,019 A | 10/1999 | Suzuki et al. |
| 5,978,296 A | 11/1999 | Zibert |
| 5,987,620 A | 11/1999 | Tran |
| 6,006,290 A | 12/1999 | Suh |
| 6,021,264 A | 2/2000 | Morita |
| 6,034,916 A | 3/2000 | Lee |
| 6,035,369 A | 3/2000 | Ware et al. |
| 6,041,419 A | 3/2000 | Huang et al. |
| 6,044,429 A | 3/2000 | Ryan et al. |
| 6,065,092 A | 5/2000 | Roy |
| 6,075,730 A | 6/2000 | Anderson et al. |
| 6,088,774 A | 7/2000 | Gillingham |
| 6,105,144 A | 8/2000 | Wu |
| 6,111,445 A | 8/2000 | Zerbe et al. |
| 6,115,318 A | 9/2000 | Keeth |
| 6,125,078 A | 9/2000 | Ooishi et al. |
| 6,131,149 A | 10/2000 | Lu et al. |
| 6,134,638 A | 10/2000 | Olarig et al. |
| 6,151,239 A | 11/2000 | Batra |
| 6,151,648 A | 11/2000 | Haq |
| 6,182,207 B1 | 1/2001 | Poivre et al. |
| 6,185,151 B1 | 2/2001 | Cho |
| 6,209,071 B1 | 3/2001 | Hampel et al. |
| 6,226,723 B1 | 5/2001 | Gustavson et al. |
| 6,226,757 B1 | 5/2001 | Ware et al. |
| 6,256,716 B1 | 7/2001 | Pham |
| 6,260,097 B1 | 7/2001 | Farmwald et al. |
| 6,263,448 B1 | 7/2001 | Tsern et al. |
| 6,266,285 B1 | 7/2001 | Farmwald et al. |
| 6,266,737 B1 | 7/2001 | Ware et al. |
| 6,279,077 B1 | 8/2001 | Nasserbakht et al. |
| 6,292,903 B1 | 9/2001 | Coteus et al. |
| 6,301,627 B1 | 10/2001 | Neal et al. |
| 6,304,937 B1 | 10/2001 | Farmwald et al. |
| 6,314,051 B1 | 11/2001 | Farmwald et al. |
| 6,321,316 B1 | 11/2001 | Manning |
| 6,343,352 B1 | 1/2002 | Davis et al. |
| 6,359,815 B1 | 3/2002 | Sato et al. |
| 6,401,167 B1 | 6/2002 | Barth et al. |
| 6,404,178 B2 | 6/2002 | Kato |
| 6,404,258 B2 | 6/2002 | Ooishi |
| 6,437,619 B2 | 8/2002 | Okuda et al. |
| 6,442,644 B1 | 8/2002 | Gustavson et al. |
| 6,456,544 B1 | 9/2002 | Zumkehr |
| 6,462,998 B1 | 10/2002 | Proebsting |
| 6,463,066 B2 | 10/2002 | Moriwaki et al. |
| 6,470,405 B2 | 10/2002 | Barth et al. |
| 6,493,789 B2 | 12/2002 | Ware et al. |
| 6,496,897 B2 | 12/2002 | Ware et al. |

| | | | |
|---|---|---|---|
| 6,510,503 | B2 | 1/2003 | Gillingham et al. |
| 6,526,462 | B1 | 2/2003 | Elabd |
| 6,560,652 | B1 | 5/2003 | Larson et al. |
| 6,570,873 | B1 | 5/2003 | Isoyama et al. |
| 6,584,037 | B2 | 6/2003 | Farmwald et al. |
| 6,591,353 | B1 | 7/2003 | Ware et al. |
| 6,629,222 | B1 | 9/2003 | Jeddeloh |
| 6,640,292 | B1 | 10/2003 | Barth et al. |
| 6,658,578 | B1 | 12/2003 | Laurenti et al. |
| 6,677,791 | B2 | 1/2004 | Okuda et al. |
| 6,681,288 | B2 | 1/2004 | Ware et al. |
| 6,701,446 | B2 | 3/2004 | Tsern et al. |
| 6,748,507 | B2 | 6/2004 | Kawasaki et al. |
| 6,757,779 | B1 | 6/2004 | Nataraj et al. |
| 6,868,474 | B2 | 3/2005 | Barth et al. |
| 6,889,300 | B2 | 5/2005 | Davis et al. |
| 6,892,273 | B1 | 5/2005 | James et al. |
| 6,928,571 | B1 | 8/2005 | Bonella et al. |
| 6,931,467 | B2 | 8/2005 | Ware et al. |
| 6,934,201 | B2 | 8/2005 | Ware et al. |
| 7,047,375 | B2 | 5/2006 | Davis et al. |
| 7,177,998 | B2 | 2/2007 | Ware et al. |
| 7,197,611 | B2 | 3/2007 | Barth et al. |
| 7,210,016 | B2 | 4/2007 | Ware et al. |
| 7,287,103 | B2 | 10/2007 | Ganfield et al. |
| 7,287,109 | B2 | 10/2007 | Barth et al. |
| 7,287,119 | B2 | 10/2007 | Barth et al. |
| 7,330,952 | B2 | 2/2008 | Barth et al. |
| 7,330,953 | B2 | 2/2008 | Barth et al. |
| 7,336,729 | B2 | 2/2008 | Agazzi ............ 375/316 |
| 7,360,050 | B2 | 4/2008 | Barth et al. |
| 7,496,709 | B2 | 2/2009 | Barth et al. |
| 2007/0147143 | A1 | 6/2007 | Barth et al. |
| 2007/0198868 | A1 | 8/2007 | Barth et al. |
| 2009/0129178 | A1 | 5/2009 | Barth et al. |

FOREIGN PATENT DOCUMENTS

| | | |
|---|---|---|
| EP | 0339224 | 11/1989 |
| EP | 487819 A2 | 6/1992 |
| EP | 0535670 A1 | 4/1993 |
| EP | 0561370 A2 | 9/1993 |
| EP | 0605887 A2 | 7/1994 |
| EP | 0638858 A1 | 2/1995 |
| EP | 0709786 A1 | 5/1996 |
| EP | 0778575 A2 | 6/1997 |
| EP | 0605887 B1 | 9/2001 |
| FR | 2695227 A1 | 3/1994 |
| JP | 57-210495 | 12/1982 |
| JP | SHO 58-192154 | 11/1983 |
| JP | SHO 61-107453 A2 | 5/1986 |
| JP | SHO 61-160556 A | 7/1986 |
| JP | SHO 62-016289 A2 | 1/1987 |
| JP | 63-34795 | 2/1988 |
| JP | SHO 63-091766 A2 | 4/1988 |
| JP | SHO 63-217452 | 9/1988 |
| JP | 1-236494 | 9/1989 |
| SH | SHO 63-239676 A2 | 10/1988 |
| WO | WO 96/30838 A1 | 10/1996 |
| WO | WO 99/46687 A1 | 9/1999 |

OTHER PUBLICATIONS

Synchronous DRAM Module, Micron Technology, Inc., 2001, pp. 1-28.*

"MT4LC4M4E9 (S) 4 MEG X DRAM," Micron Semiconductor, Inc., 1994, pp. 1-183/1-196.

U.S. Appl. No. 60/026,594 File Wrapper for Provisional Application, filed Sep. 20, 1996, Gillingham, Peter, 11 pages.

U.S. Appl. No. 60/055,349 File Wrapper for the Provisional Application, filed Aug. 11, 1997, Ryan et al., 86 pages.

U.S. Appl. No. 60/057,09 File Wrapper for the Provisional Application, filed Sep. 27, 1997, Gustayson et al., 342 pages.

Arimoto, K., et al. "A Circuit Design of Intelligent Cache DRAM with Automatic Write-Back Capability", IEEE J. Of Solid-State Circuits, vol. 26, No. 4, Apr. 1991, pp. 560-565.

Ayukawa, K. et al., "An Access-Sequence Control Scheme to Enhance Random-Access Performance of Embedded DRAM's," IEEE Journal of Solid-State Circuits, vol. 33, No. 5, May 1998, 7 pages.

Barth et al, "Integrated Circuit Memory Device Having Delayed Write timing Based on Read Response Time", U.S. Control No. 95/001,196 filed Jun. 4, 2009 (Pending Inter Partes Reexamination of U.S. Pat. No. 7,330,952) dated Sep. 29, 2009, 98 pages.

Barth et al., "Integrated Circuit Memory Device Having Delayed Write Capability," U.S. Control No. 90/009,370, filed Dec. 23, 2008 (pending *Ex Parte* Reexamination of U.S. Pat. No. 7,360,050), 37 pages.

Barth et al., "Integrated Circuit Memory Device Having Delayed Write Timing Based on Read Response Time," U.S. Control No. 90/009,371, filed Dec. 22, 2008 (pending *Ex Parte* Reexamination of U.S. Pat. No. 7,330,952), 43 pages.

Barth et al., "Integrated Circuit Memory device Having Delayed Write Capability", U.S. Control No. 95/001,205 filed Jul. 1, 2009 (pending Inter Partes Reexamination of U.S. Pat. No. 7,360,050, dated Jul. 1, 2009), 101 pages.

Barth et al., "Integrated Circuit Memory Device With Delayed Write Command Processing," U.S. Control No. 90/010,365 filed Dec. 18, 2008 (pending *Ex Parte* Reexamination of U.S. Pat. No. 7,287,119), 34 pages.

Barth et al., "Integrated Circuit Memory Device With Delayed Write Command Processing", U.S.Control No. 95/001,189 filed May 18, 2009 (pending Inter Partes Reexamination of U.S. Pat. No. 7,287,119 dated Sep. 29, 2009, 107 pages.

Barth et al., "Memory System Having Delayed Write Timing", U.S. Control No. 90/009,369, filed Dec. 23, 2008 (pending *Ex Parte* Reexamination of U.S. Pat. No. 7,330,953), 34 pages.

Barth et al., "Memory System Having Delayed Write Timing", U.S. Control No. 95/001,201 filed Jul. 14, 2009 (pending Inter Partes Reexamination of U.S. Pat. No. 7,330,953) dated Sep. 29, 2009, 100 pages.

Barth II Patents, Markman 7.0, Final, Mar. 2009, 72 pages.

Barth II ReExams "Rambus Overview // Barth II Technical Review," Examiner Interview Slides, dated Jul. 23, 2009, 54 pages.

Barth, Richard et al., Control No. 95/001,205 Filed Jul. 1, 2009, re Respondent's Brief (Patent Owner) dated Oct. 24, 2011. 12 pages.

Barth, Richard re Control No. 90/009,371 filed Dec. 22, 2008 re Final Office Action in *Ex Parte* Reexamination with mail date of Aug. 9, 2010, 15 pages.

Barth, Richard re Control No. 90/009,371 filed Dec. 22, 2008 re Notification of Prior or Concurrent Proceedings as filed for U.S. Patent 7,330,952 dated Apr. 30, 2009, 5 pages.

Barth, Richard re Control No. 90/009,371 filed Dec. 22, 2008 re Office Action re *Ex Parte* Reexamination for U.S. Patent 7,330,952 mailed Apr. 15, 2009 3 pages.

Barth, Richard re Control No. 90/010,365 filed Dec. 18, 2008 re Office Communication re Order Granting *Ex Parte* Reexamination re U.S. Patent 7,287,119 mailed Feb. 20, 2009, 9 pages.

Barth, Richard re Control No. 95/001,189 filed May 18, 2009 re Office Action in Inter Partes Reexamination with mail date of Aug. 9, 2010, 28 pages.

Barth, Richard re U.S. Appl. No. 12/875,483 filed Sep. 3, 2010 re Office Action with mail date of Jan. 7, 2011. 40 pages.

Barth, Richard re U.S. Appl. No. 12/875,483 filed Sep. 3, 2010 re Notice of Allowance and Fee(s) Due dated May 13, 2011. 23 Pages.

Barth, Richard re U.S. Appl. No. 12/875,483 filed Sep. 3, 2010 re Response to the Office Action and Substance of the Interview dated Jan. 7, 2011, filed Apr. 20, 2011. 9 Pages.

Barth, Richard, Control No. 95/001,201 filed Jun. 23, 2009, re Respondent's Brief (Patent Owner) dated Oct. 17, 2011, re Inter Partes Reexamination of U.S. Patent No. 7,330,953. 13 pages.

Barth, Richard, Control No. 95/001,201 filed Jun. 23, 2009, re Third Party Requester's Respondent Brief dated Oct. 7, 2011. 17 pages.

Barth, Richard, Inter Parte Reexamination Control No. 95/001,189 filed May 18, 2009, re Respondent's Brief (Patent Owner) dated Aug. 19, 2011. 12 pages.

Barth, Richard, Inter Partes Reexamination Control No. 95/001,189 filed May 18, 2009, re Third Party Requester's Cross-Appeal Brief in *Inter Partes* Reexamination Pursuant to 37 C.F.R. ss 41.67 dated Jul.19, 2011. 25 pages.
Barth, Richard, Inter Partes Reexamination Control No. 95/001,189 filed May 18, 2009, re Third Party.Requester's Respondent Brief dated Aug. 25, 2011. 17 pages.
Barth, Richard, Inter Partes Reexamination Control No. 95/001,196 filed Jun. 4, 2009, re Third Party.Requester's Cross-Appeal Brief in *Inter Partes* Reexamination Pursuant to 37 C.F.R. ss 41.67 dated Jul.28, 2011. 34 pages.
Barth, Richard, Inter Partes Reexamination Control No. 95/001,196 filed Jun. 4, 2009, re Respondent's Brief (Patent Owner) dated Aug. 29, 2011. 13 pages.
Barth, Richard, Inter Partes Reexamination Control No. 95/001,201 filed Jun. 23, 2009, re Third Party Requester's Cross-Appeal Brief in Inter Partes Reexamination Pursuant to 37 C.F.R. ss 41.67 dated Sep. 16, 2011. 27 pages.
Barth, Richard, Inter Partes Reexamination Control No. 95/001,205 filed Jul. 1, 2009, re Third Party Requester's Cross-Appeal Brief in Inter Partes Reexamination Pursuant to 37 C.F.R. ss 41.67 dated Sep. 23, 2011. 25 pages.
Barth, Richard, Inter Partes Reexamination Control No. 95/001,205 filed Jul. 1, 2009, re Patent Owner's Brief on Appeal Under 37 C.F.R. ss 41.67 dated Sep. 26, 2011. 51 pages.
CC-J1—Claim Chart comparing Claims 1-3, 18, 19, 26-28, 31, 32, 35, and 38 of U.S. Patent No. 7,209,997 to the disclosure in iAPX Manual in view of Bennett, further in view of iRAM, and further in view of Olson, NVIDIA's Request for Inter Partes Reexamination Pursuant to 37 C.F.R. 1.510 of U.S. Patent No. 7,209,997, filed May 15, 2009, 202 pages.
Commission Investigative Staff's Responsive Brief Regarding Disputed Claim Terms, Inv. No. 337-TA-661 dated Mar. 20, 2009, 204 pages.
Courtesy Service Letter (Finnegan) for Reexamination of U.S. Patent No. 7,287,119 dated May 18, 2009. 1 page.
Courtesy Service Letter (Finnegan) for Reexamination of U.S. Patent No. 7,330,952 dated Jun. 4, 2009. 1 page.
Courtesy Service Letter (McKool) for Reexam of U.S. Patent No. 7,330,952 dated Jun. 5, 2009. 1 page.
Courtesy Service Letter (McKool) for Reexamination of U.S. Patent No. 7,287,119 dated May 18, 2009. 1 page.
Courtesy Service Letter (Turner) for Reexam of U.S. Patent No. 7,330,952 dated Jun. 4, 2009. 1 page.
Courtesy Service Letter (Turner) for Reexamination of U.S. Patent No. 7,287,119 dated May 18, 2009. 1 page.
D6—Prince, B., "Semiconductor Memories: A Handbook of Design, Manufacture, and Application," Second Edition, 1991, John Wily & Sons, pp. 248, 273-290, from the Opposition of Hynix dated Oct. 6, 2009, in Patent No. DE 1 816 569 issued Jan. 7, 2009 with Application No. 06 125 946.1, 22 pages.
Declaration of Robert J. Murphy dated Jul. 29, 2009, In Re Reexamination on U.S. Patent Nos. 7,287,119 (Control No. 90/010,365) filed Dec. 18, 2008, and 7,330,952 (Control No. 90/009,371) filed Dec. 22, 2008, 15 pages.
Diamond, S., "SyncLink: High-Speed DRAM for the Future," Micro Standards, IEEE Micro, IEEE Computer Society, vol. 16, No. 6, Dec. 1996, 2 pages.
Electronic Acknowledgement Receipt for U.S. Appl. No. 95/001,189 dated May 18, 2009. 6 pages.
Electronic Acknowledgement Receipt for Inter Partes Reexamination of U.S. Patent No. 7,330,952 dated Jun. 4, 2009. 6 pages.
English Abstract and brief description for JP61-160556U published Oct. 4, 1986, 13 pages.
English Abstract and brief description for JP62-016289 published Jan. 24, 1987, 1 page.
English Abstract and brief description for JP63-034795A published Feb. 15, 1988, 3 pages.
English Abstract and Translation for JP63-091766A published Apr. 22, 1988, 11 pages.
English Abstract for JP1-236494A published Sep. 21, 1989, 1 page.
English Abstract for JP63-217452A published Sep. 9, 1988, 1 page.
English Abstract of Japanese Publication No. JP5192154A published Nov. 9, 1983, 1 page.
English Abstract of Japanese Publication No. JP61107453A published May 26, 1986, 1 page.
Exhitib 1—Declaration of Robert J. Murphy dated Aug. 19, 2009, re Ex Parte Reexamination of U.S. Patent Nos. 7,330,953 and 7,360,050, Barth et al., dated Aug. 19, 2009, both filed Dec. 23, 2008, with Control Nos. 90/009,369 and 90/009,370, 16 pages.
Exhibit 1—Request for Inter Partes Reexamination claim charts, Exhibits K through O, dated Richard, Control No. 95/001,201, filed Jun. dated Oct. 7, 2011. 327 pages.
Exhibit 1—Request for Inter Partes Reexamination under 35 U.S.C. ss 311-318 ("Request") including claim charts, Exhibits L through Q, dated May 18, 2009, re Barth, Richard, Inter Partes Reexamination Control No. 95/001,189, filed May 18, 2009, re Respondent Brief of Third Party Requester dated Aug. 25, 2011. 260 pages.
Exhibit 1—Request for Inter Partes Reexamination under 35 U.S.C. ss 311-318 ("Request") including claim charts, Exhibits L through Q, dated Jun. 4, 2009, per Respondent Brief of Third Party Requester in Inter Partes Reexamination of U.S. Patent No. 7,330,952 with Control No. 95/001,196 dated Sep. 8, 2011. 248 pages.
Exhibit 1—U.S. Patent No. 5,430,676 to Ware et al. ("Ware") issued Jul. 4, 1995, per Patent Owner's Brief on Appeal dated Sep. 19, 2011, re Control No. 95/001,201. 27 pages.
Exhibit 1—Supplemental Declaration of Robert J. Murphy, mailed on Aug. 25, 2009, with the Patent Owner's First Supplemental Reply to Office Action in Ex Parte Reexamination of U.S. Patent 7,330,952, Control No. 90/009,371, filed on Dec. 22, 2008, 4 pages.
Exhibit 1 U.S. Patent No. 7,330,952 and Certificate of Correction dated Jun. 17, 2008, 61 pages.
Exhibit 1 US Patent No. 7,330,953 and Certificate of Correction dated Jun. 10, 2008, 62 pages.
Exhibit 10—Comments by Third Party Requester Pursuant to 37 CFR ss 1.951 ("NVIDIA's Second Comments") dated Feb. 18, 2011, per Respondent Brief of Third Party Requester in Inter Partes Reexamination of U.S. Patent No. 7,330,952 with Control No. 95/001,196 dated Sep. 8, 2011. 14 pages.
Exhibit 10 U.S. Appl. No. 60/061,770, filed Oct. 10, 1997, Barth et al., related to U.S. Patent No. 7,287,119, 76 pages.
Exhibit 10 U.S. Appl. No. 60/061,770, filed Oct. 10, 1997, Barth et al., related to U.S. Patent No. 7,330,952, 76 pages.
Exhibit 10: Post Markman Hearing Joint Claim Construction Chart, Mar. 31, 2009.
Exhibit 11—Declaration of Fred A. Ware Under 37 C.F.R.ss 1.132, dated Mar. 4, 2011 in re Inter Partes Reexamination of U.S. Patent No. 7,330,953 with Control No. 95/001,201 and In re Inter Partes Reexamination of U.S. Patent No. 7,360,050 with Control No. 95/001,205, per Patent Owner's Brief on Appeal dated Sep. 19, 2011, re Control No. 95/001,201. 4 pages.
Exhibit 11—Right of Appeal Notice entered by the Examiner on May 4, 2011, per Respondent Brief of Third Party Requester in Inter Partes Reexamination of U.S. Patent No. 7,330,952 with Control No. 95/001,196 dated Sep. 8, 2011. 49 pages.
Exhibit 11A—"Core Signalling Paths," Revision 1.0, Rambus Confidential, undated, R8211653-660, per Patent Owner's Brief on Appeal dated Sep. 19, 2011, re Control No. 95/001,201. 9 pages.
Exhibit 12—Decision Dismissing Petition dated Jun. 6, 2011, per Respondent Brief of Third Party Requester in Inter Partes Reexamination of U.S. Patent No. 7,330,952 with Control No. 95/001,196 dated Sep. 8, 2011. 7 pages.
Exhibit 12: Ohshima et al., "High Speed DRAMs with Innovative Architectures," vol. E77-C, No. 8 of IEICE Transactions on Electron Devices, pp. 1303-1315, Aug. 1994.
Exhibit 17: Kushiyama et al., A 500-Megabyte/s Data-Rate 4.5 M DRAM, IEEE Journal of Solid-State Circuits, vol. 28, No. 4 pp. 3.11-1-3.11.5-18, Nov. 1993.
Exhibit 19: JEDEC Standard No. 21-C, Release 4, pp. 3.11-1-3.11. 5-18, Nov. 1993.
Exhibit 2—Declaration re Craig E. Hampel, mailed on Aug. 25, 2009 with the Patent Owner's First Supplemental Reply to Office Action in *Ex Parte* Reexamination of U.S. Patent 7,330,952, Control No. 90/009,371, filed Dec. 22 2008, 24 pages.

Exhibit 2—U.S. Patent No. 5,430,676 to Ware ("Ware"), issued Jul. 4, 1995, per Respondent Brief of Third Party Requester in Inter Partes Reexamination of U.S. Patent No. 7,330,952 with Control No. 95/001,196 dated Sep. 8, 2011. 27 pages.
Exhibit 2—U.S. Patent No. 6,088,774 to Gillingham issued Jul. 11, 2000, re Barth, Richard, Inter Partes Reexamination Control No. 95/001,205 filed Jul. 1, 2009, re Patent Owner's Brief on Appeal Under 37 C.F.R. ss 41.67 dated Sep. 26, 2011. 16 pages.
Exhibit 2—U.S. Patent No. 6,226,723 to Gustavson et al. ("Gustavson"), Issued May 1, 2001, re U.S. Patent No. 7,330,953, re Barth, Richard, Control No. 95/001,201 filed Jun. 23, 2009, re Third Party Requester's Respondent Brief dated Oct. 7, 2011. 88 pages.
Exhibit 20: Amendment dated Sep. 22, 2006, U.S. Appl. No. 11/335,029, filed Jan. 18, 2006, Exhibits to the Initial Expert Report of Vivek Subramanian filed Jun. 12, 2009, In the Matter of Certain Semiconductor Chips Having Synchronous Dynamic Random Access Memory Controllers and Products Containing Same, U.S. International Trade Commission, Investigation No. 337-TA-661, filed Nov. 6, 2008, 15 pages.
Exhibit 26: Yang et al., "A Scalable 32Gb/s Parallel Data Tranceiver with On-chip Timing Calibration Circuits," Presented at ISSCC, pp. 258-259, 2000, 2 pages.
Exhibit 27: Yang et al., "A Scalable 32Gb/s Parallel Data Transceiver with On-chip Timing Calibration Circuits," Presented at ISSCC 2000, Feb. 8, 2000, 7 pages (with figures).
Exhibit 2A—Conception Claim Chart for Barth 11, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 23 pages.
Exhibit 2C—Diligence Calendar Showing Barth II Activity, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 7 pages.
Exhibit 3—Comments by Third Party Requester Pursuant to 37 CFR ss 1.947 ("NVIDIA's First Comments"), dated Oct. 8, 2010, re Barth, Richard, Inter Partes Reexamination Control No. 95/001,189, filed May 18, 2009, re Respondent Brief of Third Party Requester dated Aug. 25, 2011. 29 pages.
Exhibit 3—JEDEC Standard No. 21-C, Release 4, Nov. 1993 ("JEDEC"), per Respondent Brief of Third Party Requester in Inter Partes Reexamination of U.S. Patent No. 7,330,952 with Control No. 95/001,196 dated Sep. 8, 2011. 185 pages.
Exhibit 3—List of Exhibits, re Ex Parte Reexamination of U.S. Patent Nos. 7,330,953 and 7,360,050.Barth et al. dated Aug. 19, 2009, both filed Dec. 23, 2008, with Control Nos. 90/009,369 and 90/009,370, 3 pages.
Exhibit 3—U.S. Appl. No. 60/026,419, filed Sep. 1996, incorporated by reference in Gustavson, re U.S. Patent No. 7,330,953, re Barth, Richard, Control No. 95/001,201, filed Jun. 23, 2009, re Third Party Requester's Respondent Brief dated Oct. 7, 2011. 13 pages.
Exhibit 3—U.S. Patent No. 6,226,723 to Gustayson et al., issued May 1, 2001, re Barth, Richard, Inter Partes Reexamination Control No. 95/001,205, filed Jul. 1, 2009, re Patent Owner's Brief on Appeal Under 37 C.F.R. ss 41.67 dated Sep. 26, 2011. 88 pages.
Exhibit 31: Office Action dated May 8, 2009, received in Reexamination Control No. 90/009,357, 24 pages.
Exhibit 32: Office Action dated May 8, 2009, received in Reexamination Control No. 90/009,358, 13 pages.
Exhibit 33: Chart Demonstrating Anticipation and Obviousness of the Asserted Rambus Patent Claims with U.S. Patent 5,315,755 ("Farmland") as the Primary Reference, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S.International Trade Commission, Investigation No. 337-TA-661, 47 pages.
Exhibit 34: Chart Demonstrating Anticipation and Obviousness of the Asserted Rambus Patent Claims with *High Speed DRAMS with Innovative Architectures* by Ohshima et al. ("Ohshima") as the Primary Reference, Exhibit to the Initial Expert Report of Vivek Subramanian, filed Jun. 12, 2009, in the Matter of "Certain Semiconductor Chips Having Synchronous Dynamic Random Access Memory Controllers and Products Containing Same," U.S. International Trade Commission, Investigation No. 337-TA-661, 40 pages.
Exhibit 35: Chart Demonstrating Anticipation and Obviousness of the Asserted Barth I Patent Claims with U.S. Patent 6,748,507 ("Kawasaki") as the Primary Reference, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 75 pages.
Exhibit 36: Chart Demonstrating Anticipation and Obviousness of the Asserted Barth I Patent Claims with European Patent Application 0,605,887 ("Watanabe") as the Primary Reference, Exhibit to the Initial Expert Report of Vivek Subramanian, filed Jun. 12, 2009, in the Matter of "Certain Semiconductor Chips Having Synchronous Dynamic Random Access Memory Controllers and.Products Containing Same," U.S. International Trade Commission, Investigation No. 337-TA-661, 91 pages.
Exhibit 37: Chart Demonstrating Anticipation and Obviousness of the Asserted Barth I Patent Claims with U.S. Patent 5,272,664 ("Alexander") as the Primary Reference, Exhibit to the Initial Expert Report of Vivek Subramanian, filed Jun. 12, 2009, in the Matter of "Certain Semiconductor Chips Having Synchronous Dynamic Random Access Memory Controllers and Products Containing Same," U.S.International Trade Commission, Investigation No. 337-TA-661, filed Nov. 6, 2008, 75 pages.
Exhibit 38: Chart Demonstrating Anticipation and Obviousness of the Asserted Barth I Patent Claims with U.S. Patent 5,150,467 ("Hayes") as the Primary Reference, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, filed Nov. 6, 2008, 80 pages.
Exhibit 39: Chart Demonstrating Anticipation and Obviousness of the Asserted Rambus Patent Claims with A 500-Megabyte/s Data-Rate 4.5M DRAM-by Kushiyama et al. ("Kushiyama") as the Primary Reference, Exhibit to the Initial Expert Report of Vivek Subramanian, filed Jun. 12, 2009, in the Matter of "Certain Semiconductor Chips Having Synchronous Dynamic Random Access Memory Controllers and Products Containing Same," U.S. International Trade Commission, Investigation No. 337-TA-661, 34 pages.
Exhibit 3B—U.S. Patent No. 5,966,343 to Thurston, issued Oct. 12, 1999, re Barth, Richard, Inter Partes Reexamination Control No. 95/001,205, filed Jul. 1, 2009, re Patent Owner's Brief on Appeal Under 37 C.F.R. ss 41.67 dated Sep. 26, 2011. 20 pages.
Exhibit 3C—JEDEC Standard No. 21-C, Release 4, Nov. 1993, re Barth, Richard, Inter Partes Reexamination Control No. 95/001,205, filed Jul. 1, 2009, re Patent Owner's Brief on Appeal Under 37 C.F.R. ss 41.67 dated Sep. 26, 2011. 130 pages.
Exhibit 4—Declaration of Craig E. Hampel Under 37 C.F.R. ss. 1.131, dated Sep. 8, 2010, re Barth, Richard, Control Nos. 95/001,189 and 95/001,196, filed May 18, 2009 and Jun. 4, 2009 respectively, In re Inter Partes Reexaminations for U.S. Patent Nos. 7,287,119 and 7,330,952 respectively. 41 pages.
Exhibit 4—U.S. Appl. No. 60/026,896, filed Sep. 1996, incorporated by reference in Gustavson, re U.S. Patent No. 7,330,953, re Barth, Richard, Control No. 95/001,201, filed Jun. 23, 2009, re Third Party Requester's Respondent Brief dated Oct. 7, 2011. 24 pages.
Exhibit 4—RDRAM Technology Summary, dated 2005, re Barth, Richard, Inter Partes Reexamination Control No. 95/001,189, filed May 18, 2009, re Respondent Brief of Third Party Requester dated Aug. 25, 2011. 3 pages.
Exhibit 4—U.S. Patent No. 5,568,445 to Park et al. ("Park") issued on Oct. 22, 1996, per Respondent Brief of Third Party Requester in Inter Partes Reexamination of U.S. Patent No. 7,330,952 with Control No. 95/001,196 dated Sep. 8, 2011. 21 pages.
Exhibit 40: Chart Demonstrating Obviousness Type Double Patenting of Certain of the Asserted Barth I Patent Claims over U.S. Patent 6,584,037 ("Farmwald '037 patent"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 18 pages.

Exhibit 41: Comparison of Asserted Claims of U.S. Patent 7,177,998 to Prior Art Reference U.S. Patent 6,292,903 ("Coteus"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 25 pages.

Exhibit 42: Comparison of Asserted Claims of U.S. Patent 7,210,016 to Prior Art Reference U.S. Patent 6,292,903 ("Coteus"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 26 pages.

Exhibit 43: Comparison of Asserted Claims of U.S. Patent 7,177,998 to Prior Art References U.S. Patent 6,292,903 ("Coteus") and the Hotrail Paper, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 27 pages.

Exhibit 44: Comparison of Asserted Claims of U.S. Patent 7,210,016 to Prior Art References U.S. Patent 6,292,903 ("Coteus") and the Hotrail Paper, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 26 pages.

Exhibit 45: Comparison of Asserted Claims of U.S. Patent 7,177,998 to Prior Art Reference WO99/46687 ("Sato"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 34 pages.

Exhibit 46: Comparison of Asserted Claims of U.S. Patent 7,210,016 to Prior Art Reference WO99/46687 ("Sato"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 24 pages.

Exhibit 47: Comparison of Asserted Claims of U.S. Patent 7,177,998 to Prior Art References WO99/46687 ("Sato") and U.S. Patent 6,292,903 ("Coteus") or 5,646,904 U.S. Patent ("Ohno"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 42 pages.

Exhibit 48: Comparison of Asserted Claims of U.S. Patent 7,210,016 to Prior Art References WO99/46687 ("Sato") and U.S. Patent 6,292,903 ("Coteus") or 5,646,904 U.S. Patent ("Ohno"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 38 pages.

Exhibit 49: Comparison of Asserted Claims of U.S. Patent 7,177,998 to Prior Art Reference U.S. Patent 6,226,757 ("The Intel-Ware Patent"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 22 pages.

Exhibit 5—"8-MBIT (512K x 16, 1024K x 8) SmartVoltage Boot Block Flash Memory Family" product preview ("Intel Datasheet") dated Sep. 1995, per Respondent Brief of Third Party Requester in Inter Partes Reexamination of U.S. Patent No. 7,330,952 with Control No. 95/001,196 dated Sep. 8, 2011. 79 pages.

Exhibit 5—Action Closing Prosecution ("ACP") entered by the Examiner on Dec. 21, 2010, re Barth, Richard, Inter Partes Reexamination Control No. 95/001,189 filed May 18, 2009, re Respondent Brief of Third Party Requester dated Aug. 25, 2011. 29 pages.

Exhibit 5—U.S. Patent No. 5,430,676 to Ware ("Ware"), Issued Jul. 4, 1995, re U.S. Patent No. 7,330,953, re Barth, Richard, Control No. 95/001,201 filed Jun. 23, 2009, re Third Party Requester's Respondent Brief dated Oct. 7, 2011. 27 pages.

Exhibit 50: Comparison of Asserted Claims of U.S. Patent 7,210,016 to Prior Art Reference U.S. Patent 6,226,757 ("The Intel-Ware Patent"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 28 pages.

Exhibit 51: Comparison of Asserted Claims of U.S. Patent 7,177,998 to Prior Art References U.S. Patent 6,292,903 ("Coteus") and U.S. Patent 6,226,757 ("the Intel-Ware Patent"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 26 pages.

Exhibit 52: Comparison of Asserted Claims of U.S. Patent 7,210,016 to Prior Art References U.S. Patent 6,292,903 ("Coteus") and U.S. Patent 6,226,757 ("the Intel-Ware Patent"), Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 25 pages.

Exhibit 5B—Conception Prior to Jan. 2, 1997, undated, re Declartion of Craig E. Hampel dated Sep. 17, 2010, In re Inter Partes Reexamination of U.S. Patent No. 7,330,953 for Barth et al., with Control No. 95/001,201 and in re Inter Partes Reexamination of U.S. Patent No. 7,360,050 for Barth et al., with Control No. 95/001,205, 106 pages.

Exhibit 6—Claim Charts for Actual Reduction to Practice, per Patent Owner's Brief on Appeal dated Sep. 19, 2011, re Control No. 95/001,201. 127 pages.

Exhibit 6—Comments by Third Party Requester Pursuant to 37 CFR ss. 1.947 ("NVIDIA's First Comments"), dated Oct. 15, 2010, re U.S. Patent No. 7,330,953, re Barth, Richard, Control No. 95/001,201 filed Jun. 23, 2009, re Third Party Requester's Respondent Brief dated Oct. 7, 2011. 25 pages.

Exhibit 6—Comments by Third Party Requester Pursuant to 37 CFR ss 1.947 ("NVIDIA's First Comments") dated Oct. 8, 2010, per Respondent Brief of Third Party Requester in Inter Partes Reexamination of U.S. Patent No. 7,330,952 with Control No. 95/001,196 dated Sep. 8, 2011. 29 pages.

Exhibit 6—Non-Final Office Action entered by the Examiner on Aug. 9, 2010, re Barth, Richard, Inter Partes Reexamination Control No. 95/001,189 filed May 18, 2009, re Respondent Brief of Third Party Requester dated Aug. 25, 2011. 29 pages.

Exhibit 6 Complaint filed by Patent Owner in "Certain Semiconductor Chips Having Synchronous Dynamic Random Access Memory Controllers and Products Containing Same, Including Graphics Cards and Motherboards," (U.S. ITC) filed Nov. 6, 2008, 219 pages.

Exhibit 6: Claim Charts for Actual Reduction to Practice, undated, re Patent Owner's Response to First Office Action of Aug. 9, 2010 with Control No. 95/001,196 re: reexam.

Exhibit 6: CV of Vivek Subramanian, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 3 pages.

Exhibit 7—Comments by Third Party Requester Pursuant to 37 CFR ss1.951 ("NVIDIA's Second Comments"), dated Feb. 18, 2011, re Barth, Richard, Inter Partes Reexamination Control No. 95/001,189, filed May 18, 2009, re Respondent Brief of Third Party Requester dated Aug. 25, 2011. 13 pages.

Exhibit 7—RDRAM Technology Summary, 2005, per Respondent Brief of Third Party Requester in Inter Partes Reexamination of U.S. Patent No. 7,330,952 with Control No. 95/001,196 dated Sep. 8, 2011. 3 pages.
Exhibit 7 Complaint in *Rambus Inc.* v. *NVIDIA Corp.*, C-08-03343JCS, filed in the Northern District of California, Jul. 10, 2008, 17 pages.
Exhibit 7: Vivek Subramanian List of Depositions and Trial Testimonies, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 2 pages.
Exhibit 8—Action Closing Prosecution ("ACP") entered by the Examiner on Dec. 21, 2010 for Control No. 95/001,196, per Respondent Brief of Third Party Requester in Inter Partes Reexamination of U.S. Patent No. 7,330,952 with Control No. 95/001,196 dated Sep. 8, 2011. 30 pages.
Exhibit 8—Comments by Third Party Requester Pursuant to 37 CFR ss. 1.951 ("NVIDIA's Second Comments"), dated Apr. 4, 2011, re U.S. Patent No. 7,330,953, re Barth, Richard, Control No. 95/001,201, filed Jun. 23, 2009, re Third Party Requester's Respondent Brief dated Oct. 7, 2011. 14 pages.
Exhibit 8—Right of Appeal Notice entered by the Examiner on Apr. 22, 2011, re Barth, Richard, Inter Partes Reexamination Control No. 95/001,189, filed May 18, 2009, re Respondent Brief of Third Party Requester dated Aug. 25, 2011. 44 pages.
Exhibit 8 Amendment to Final Office Action dated Aug. 21, 2006, U.S. Appl. No. 11/059,216, 9 pages.
Exhibit 8: Vivek Subramanian List of Publications and Presentations, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, Nov. 6, 2008, 10 pages.
Exhibit 9—Decision Dismissing Patent Owner's Petition Under 37 CFR 1.183 to Waive ss 1.116(f) and Admit Evidence, dated Aug. 17, 2011, re Barth, Richard, Inter Partes Reexamination Control No. 95/001,189, filed May 18, 2009, re Respondent Brief of Third Party Requester dated Aug. 25, 2011. 7 pages.
Exhibit 9—Non-final Office Action entered by the Examiner on Aug. 9, 2010, per Respondent Brief of Third Party Requester in Inter Partes Reexamination of U.S. Patent No. 7,330,952 with Control No. 95/001,196 dated Sep. 8, 2011. 33 pages.
Exhibit 9—Right of Appeal Notice entered by the Examiner on Jun. 15, 2011, re U.S. Patent No. 7,330,953, re Barth, Richard, Control No. 95/001,201, filed Jun. 23, 2009, re Third Party Requester's Respondent Brief dated Oct. 7, 2011. 41 pages.
Exhibit 9 Notice of Allowability dated Oct. 4, 2007, U.S. Appl. No. 11/692,162, which issued as U.S. Patent No. 7,330,953, 7 pages.
Exhibit 9 Notice of Allowability dated Oct. 9, 2007, U.S. Appl. No. 11/692,159, which issued as US Patent No. 7,330,952, 6 pages.
Exhibit 9 Notice of Allowability, dated Jun. 19, 2007, U.S. Appl. No. 11/681,384, which issued as US Patent 7,287,119, 18 pages.
Exhibit 9 Notice of Allowability, dated of Oct. 4, 2007, received in U.S. Appl. No. 11/681,375, which issued as US Patent No. 7,360,050, 6 pages.
Exhibit 9: Vivek Subramanian Materials Considered, Exhibit to the Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, filed Nov. 6, 2008, 3 pages.
Exhibit A—Barth et al., U.S. patent No. 7,287,119 (the '119 patent) re Request for Inter Partes Reexamination dated May 18, 2009, 59 pages.
Exhibit A—Barth et al., U.S. Patent No. 7,330,952 filed Mar. 27, 2009 ("the '952 patent"), 61 pages.
Exhibit A—Barth et al., U.S. Patent No. 7,330,953 ("the '953 patent"), Request for Inter Partes Reexamination, mailed Jun. 23, 2009, of U.S. Patent No. 7,330,953, issued Feb. 12, 2008, 62 pages.
Exhibit A—Barth et al., U.S. Patent No. 7,360,050 ("The '050 patent") Request for Inter Partes Examination Under 35 U.S. C. ss.

311-318 Inter Partes Reexamination, Control No. 95/001,205, for U.S. Patent No. 7,360,050, filed on Jul. 1, 2009, 60 pages.
Exhibit A-1—Background of Robert J. Murphy regarding Patent Owner's Response to Office Action dated Aug. 17, 2009, 6 pages.
Exhibit AA—Handwritten Notes dated Sep. 3, 1997 through Oct. 6, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 15 pages.
Exhibit AB—Direct Implementation & Verification Meeting dated Sep. 9, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 4 pages.
Exhibit AB—Office Action issued Jul. 3, 2008 for patent 6,426,916 in reexamination ser. No. 95/000,166 re Inter Partes Reexamination for U.S. Patent 6,546,446 dated Nov. 11, 2008. 88 pages.
Exhibit AC—Handwritten Notes dated Sep. 30, 1997 through Oct. 17, 1999, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 10 pages.
Exhibit AC—Office Action issued Jul. 3, 2008 for patent 6,324,120 in reexamination ser. No. 95/000,178 re Inter Partes Reexamination for U.S. Patent 6,546,446 dated Nov. 11, 2008. 85 pages.
Exhibit AD—Excerpts from Radical Source Code File "Channel C," modified Aug. 11, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 16 pages.
Exhibit AE—Steven Woo E-mail Notice that Radical 4.01 is Available dated Aug. 14, 1997, Note the Change in Write_Track, Activate_Only, and Print_Bank at the End, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.
Exhibit AF—Rick Barth E-mail dated Aug. 15, 1997, Re: Radical 4.01 Resend, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AG—Rambus Inc.—Company Confidential, Project: Direct RDRAM, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 348 pages.
Exhibit AH—Steven Woo E-mail dated Aug. 16, 1997, "Radical 4.02 and packer 1.05," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AH, Tab 1—In the matter of Rambus, Inc., FTC Docket No. 9302 Opinion of the Commission, No Date Listed, re Request for Inter Partes Reexamination of U.S. Patent No. 6,426,916, Jul. 18, 2006. 121 pages.
Exhibit AH, Tab 1—In the matter of Rambus, Inc., FTC Docket No. 9302 Opinion of the Commission, re Request for Inter Partes Reexamination of U.S. Patent No. 6,426,916. 122 pages, Aug. 2, 2006 (date shown on page from FTC website for Docket No. 9302).
Exhibit AI—Steven Woo E-mail dated Aug. 18, 1997, "Format of Radical Parameter File," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.
Exhibit AJ—"RMC.dl.v.vv—Verilog," —Verilog Source Files for the Rambus Controller Which Manages a One-Channel-Direct Memory Subsystem, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 229 pages.
Exhibit AI—Fred Ware E-mail dated Sep. 5, 1997, "RMC.c2.v.vv (Vhdl) - Instructions for Receiving Files," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.

Exhibit AM—Steven Woo E-mail dated Sep. 10, 1997, "—called . . . " re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AN—E-mail with Unknown Sender dated Sep. 11, 1997, "Re: Hello!" re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.
Exhibit AO—Steven Woo E-mail dated Sep. 12, 1997, "Re: hello!," Confidential—FTC Docket No. 9302, RF0692380, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AP—Laura Fleming E-mail dated Sep. 15, 1997, "—gfx update," (part blacked out) of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AQ—Laura Fleming E-mail dated Sep. 24, 1997, "—simultaion/emulation meeting," (parts blacked out) R2963344, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AR—Don Stark E-mail dated Sep. 26, 1997, "Re: Functional Breakdown of Logic," R1790497-R1790499, combined with Don Stark E-mail with same date titled, "Standard Cell Count*Width, Count," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 8 pages.
Exhibit AS—E-mail (Sender blacked out) dated Oct. 3, 1997, "Re: Copies of Programs," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AT—Steven Woo E-mail dated Oct. 10, 1997, "New Version of Radical," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AU—"Rambus Direct Series Technical Description, version 0.6," Rambus Confidential Trade Secret Information, Modified Aug. 12, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 280 pages.
Exhibit AV—"Power Control of a Synchronous Memory Device," Rambus Confidential, Modified Aug. 22, 1997, R2531794-R2531803, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 11 pages.
Exhibit AW—Fred Ware E-mail dated Sep. 13, 1997, "64M Direct Datasheet 0.6," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit AX—"Direct Logical Application," Rambus Confidential, Modified Sep. 14, 1997, R2703435-R2703451, re Ex Parte Reexamination et al. U.S. Patent Nos. 7,330,953 and 7,360,050 Barth et al. dated Aug. 19, 2009, both filed Dec. 23, 2008, with Control Nos. 90/009,369 and 90/009,370, 18 pages.
Exhibit AY—"Direct Series Technical Description: Direct Logical Application," Rambus Confidential, Modified on Sep. 14, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 68 pages.
Exhibit AZ—Rambus Inc., "Direct RDRAM 64/72-Mbit (256Kx16/18x16d)—Advance Information," Last Modified Sep. 15, 1997, R08395-R08443, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 50 pages.
Exhibit B—"Rambus Direct Series Technical Description, version 0.5," (date blacked out), R4382681-R4382981, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 302 pages.
Exhibit B—U.S. Patent No. 6,044,429 to Ryan et al. ("Ryan") filed on Jul. 10, 1997 re Request for Inter Partes Reexamination for U.S. Patent No. 7,330,952, 19 pages.
Exhibit B—U.S. Patent No. 6,044,429, Ryan et al. ("Ryan"), Request for Inter Partes Examination Under 35 U.S.C. §§311-318, Re U.S. Patent No. 7,360,050, Control No. 95/001,205, filed Jul. 1, 2009, 19 pages.
Exhibit BA—Rambus Confidential, "5.0 Interconnect," Modified Sep. 16, 1997, R2531947-R2531976, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 31 pages.
Exhibit BB—Fred Ware E-mail sent Sep. 19, 1997, "DataSheet," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit BC—Rambus Confidential, "ET—Interface Overview," Modified Sep. 22, 1997, R2535135-R2535155, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 22 pages
Exhibit BD—Rambus Inc., "Direct RDRAM, 64/72-Mbit (256Kx16/18x16d)—Advance Information," Last Modified Oct. 2, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 49 pages.
Exhibit BI—Barth E-mail sent Oct. 1, 1997, (Subject blacked out), R66634251, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit BM—Exhibit (JSC1) Excerpts from out), RAdical Source Code File "genmaster.C," (date blacked out), re Ex Parte Reexamination of U.S. Patent Nos. 7,330,953 and 7,360,050 Barth et al. dated Aug. 19, 2009, both filed Dec. 23, 2008, with Control Nos. 90/009.369 and 90/009,370, 8 pages.
Exhibit BN—Exhibit (JSC2) Excerpts from Radical Source Code File "rb2master.C," (date blacked out), re Ex Parte Reexamination of U.S. Patent Nos. 7,330,953 and 7,360,050 Barth et al. dated Aug. 18, 2009, both filed Dec. 23, 2008, with Control Nos. 90/009,369 and 90/009,370, 8 pages.
Exhibit BO—Exhibit (JSC3) Excerpts from Radical Source Code File "rb2master.H," (date blacked out), re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit BP—Exhibit (JSC4) Excerpts from Radical Source Code File "tile.out.save," (date blacked out), re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 7 pages.
Exhibit BQ—Attorney Client Privileged Work Product from genmaster.C (date blacked out), re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 17 pages.
Exhibit C—Greg Davis E-mail (date blacked out), "Direct-Summary.Txt, Revision 2.11," re Ex Parte.Reexamination of U.S. Patent Nos. 7,330,953 and 7,360,050 Barth et al. dated Aug. 19, 2009, both filed Dec. 23, 2008, with Control Nos. 90/009,369 and 90/009,370, 8 pages.
Exhibit C, Tab 1—U.S. Patent No. 6,088,774 to Gillingham ("Gillingham") Request for Inter Partes Examination Under 35 U.S.C. §§311-318, Re U.S. Patent No. 7,360,050, Control No. 95/001,205, filed on Jul. 1, 2009, 16 pages.
Exhibit C, Tab 1—U.S. Patent No. 6,088,774 to Gillingham ("Gillingham") filed Sep. 19, 1997 re Request for Inter Partes Reexamination for U.S. Patent No. 7,330,952, 16 pages.
Exhibit C, Tab 2—U.S. Appl. No. 60/026,594, filed Sep. 20, 1996 (incorporated by reference in Gillingham), in Request for Inter Partes Examination Under 35 U.S.C. §§311-318 Re U.S.Patent No. 7,360,050, Control No. 95/001,205, filed Jul. 1, 2009,12 pages.
Exhibit C, Tab 2—U.S. Appl. No. 60/026,594, filed Sep. 20, 1996, incorporated by reference in Gillingham, Request for Inter Partes Examination Under 35 U.S.C. ss 311-318 Inter Partes.Reexamination U.S. Patent No. 7,287,119 with Control No. 95/001,189, filed May 18, 2009. 12 pages.
Exhibit C, Tab 3—U.S. Appl. No. 60/055,349 filed Aug. 11, 1997 (incorporated by reference in Gillingham) in Request for Inter Partes Examination Under 35 U.S.C. §§311-318 Re U.S.Patent No. 7,360,050, Control No. 95/001,205, filed Jul. 1, 2009, 87 pages.
Exhibit C, Tab 3—U.S. Appl. No. 60/055,349, filed Aug. 11, 1997, incorporated by Gillingham, Request for Inter Partes Examination Under 35 U.S.C. ss 311-318 Inter Parties Reexamination U.S. Patent No. 7,287,119, with Control No. 95/001,189, filed May 18, 2009, 87 pages.
Exhibit C, Tab 4—U.S. Appl. No. 60/057,092 filed Aug. 27, 1997 (incorporated by reference in Gillingham) Request for Inter Partes Examination Under 35 U.S.C. ss 311-318 Inter Partes Reexamination U.S. Patent No. 7,287,119 with Control No. 95/001,189, filed May 18, 2009, 345 pages.
Exhibit CC—A re US Patent No. 6,292,903 Claim Charts. (Mar. 2009) pp. 17.
Exhibit D, Tab 1—Inagaki, Y., JP 57-210495, Applicant NEC Corp., published Dec. 24, 1982 ("Inagaki"), English Translation is in Tab 2, Request for Inter Partes Reexamination mailed Jun. 23, 2009 of U.S. Patent No. 7,330,953 issued Feb. 12, 2008, 9 pages.
Exhibit D, Tab 2—English translation of Inagaki, Y., JP 57-210495, Applicant NEC Corp., published Dec. 24, 1982 ("Inagaki"), in Request for Inter Partes Reexamination mailed Jun. 23, 2009, of U.S. Patent No. 7,287,119, issued Oct. 23, 2007, 16 pages.
Exhibit DE—Ely Tsern E-mail dated Mar. 18, 1997, "re: *Write* vs. *Transport/Retire*, "RMAIL Emacs Buffer, re Patent Owner's Response dated Sep. 20, 2010 in re Inter Partes Reexam of U.S. Patent.No. 7,330,953 to Barth et al., with Control No. 95/001,201, 2 pages.
Exhibit E—Fred Ware E-mail (date blacked out), "Further Feedback on 0.04 Proposal," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.
Exhibit E—Kushiyama et al., "A 500-Megabyte/s Data-Rate 4.5M DRAM," ("Kushiyama"), in.Request for Inter Partes Reexamination mailed Jun. 23, 2009 of U.S. Patent No. 7,287,119, issued Oct. 23, 2007, 12 pages.
Exhibit E-A—Request for Inter Partes Reexamination under 35 U.S.C. ss 311-318 ("Request") including claim charts, Exhibits K through O, dated Jun. 23, 2009 in U.S. Patent No. 7,330,953, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 100 pages.
Exhibit E-A—Request for Inter Partes Reexamination under 35 U.S.C. ss 311-318 ("Request") including claim charts, Exhibits L through Q, dated Jul. 1, 2009, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 102 pages.
Exhibit E-A—Request for Inter Partes Reexamination under 35 U.S.C. ss 311-318 ("Request") dated May 18, 2009, re Barth, Richard, Inter Partes Reexamination Control No. 95/001,189, filed May 18,. 2009, re Third Party Requester's Cross-Appeal Brief in Inter Partes Reexamination Pursuant to 37 C.F.R. ss 41.67 dated Jul. 19, 2011. 260 pages.
Exhibit E-A—Request for Inter Partes Reexamination under 35 U.S.C. ss 311-318 ("Request") including claim charts, Exhibits M through Q, dated Jun. 4, 2009, re Barth, Richard, Inter Partes Reexamination Control No. 95/001,196 filed Jun. 4, 2009, re Third Party Requester's Cross-Appeal Brief in Inter Partes Reexamination Pursuant to 37 C.F.R. ss 41.67 dated Jul. 28, 2011. 248 pages.
Exhibit E-AA—Part 1&2—The JEDEC Standard No. 21-C, Release 4, Nov. 1993 ("JEDEC"), re Barth, Richard Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 19, 2011. 186 pages.
Exhibit EB—Craig Hampel E-mail dated Jun. 9, 1997,"re: Implicit Retire Mechanism—some implications for the memory controller," re Patent Owner's Response dated Sep. 20, 2010, in re Inter Partes Reexam of U.S. Patent No. 7,330,953 to Barth et al., with Control No. 95/001,201 2 pages.
Exhibit E-B—U.S. Patent No. 7,287,119 Barth et al., ("the '119 patent") issued Oct. 23, 2007, re Barth, Richard, Inter Partes Reexamination Control No. 95/001,189 filed May 18, 2009, re Third Party Requester's Cross-Appeal Brief in Inter Partes Reexamination Pursuant to 37 C.F.R. ss 41.67 dated Jul.19, 2011. 59 pages.
Exhibit E-B—U.S. Patent No. 7,330,952 Barth et al., ("the '952 patent") issued Feb. 12, 2008, re Barth, Richard, Inter Partes Reexamination Control No. 95/001,196 filed Jun. 4, 2009, re Third Party Requester's Cross-Appeal Brief in Inter Partes Reexamination Pursuant to 37 C.F.R. ss 41.67 dated Jul. 28, 2011. 61 pages.
Exhibit E-B—U.S. Patent No. 7,330,953 Barth et al., ("the '953 patent") issued Feb. 12, 2008, Barth, Richard, Inter Partes Reexamination Control No. 95/001,201 filed Jun. 23, 2009, re Third Party Requester's Cross-Appeal Brief in Inter Partes Reexamination Pursuant to 37 C.F.R. ss 41.67 dated.Sep. 16, 2011. 62 pages.
Exhibit E-B—U.S. Patent No. 7,360,050 Barth et al., ("the '050 patent") issued Apr. 15, 2008, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 60 pages.
Exhibit E-C—Inagaki, Japanese Patent Publication JP 57-210495 to NEC Corp., published Dec. 24, 1982 ("Inagaki") with English translation (Ex. D, tab 2.), Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 24 pages.
Exhibit E-D—"A 500-Megabyte/s Data-Rate 4.5 MDRAM" by Natsuki Kushiyama et al.("Kushiyama"), 1993, re Barth, Richard, Inter Partes Reexamination Control No. 95/001,189, filed May 18, 2009, re Third Party Requester's Cross-Appeal Brief in Inter Partes Reexamination Pursuant to 37.C.F.R. ss 41.67 dated Jul. 19, 2011. 12 pages.
Exhibit E-D—The JEDEC Standard No. 21-C, Release 4, Nov. 1993 ("JEDEC"), Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011, 130 pages.
Exhibit E-D—U.S. Patent No. 6,226,723 to Gustavson et al., ("Gustavson") issued May 1, 2001, re Barth, Richard, Inter Partes Rexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011, 88 pages.
Exhibit E-E—U.S. Appl. No. 60/026,419, filed Sep. 1996, incorporated by reference in Gustayson, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 13 pages.
Exhibit E-E—U.S. Patent No. 6,226,723 to Gustavson, et al. ("Gustavson") issued May 1, 2001, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 88 pages.
Exhibit E-F—U.S Appl. No. 60/026,419, filed Sep. 1996, incorporated by reference in Gustavson, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 13 pages.
Exhibit E-F—U.S Appl. No. 60/026,896, filed Sep. 1996, incorporated by reference in Gustavson, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 24 pages.
Exhibit E-G—U.S. Appl. No. 60/026,896 filed Sep. 1996, incorporated by reference in Gustavson, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 24 pages.
Exhibit E-G—U.S. Patent No. 5,966,343 to Thurston ("Thurston") issued Oct. 12, 1999, re Barth, Richard, Inter Partes Reexamination Control No. 95/001,196 filed Jun. 4, 2009, re Third Party Requester's Cross-Appeal Brief in Inter Partes Reexamination Pursuant to 37 C.F.R. ss 41.67 dated Jul. 28, 2011. 20 pages.
Exhibit E-H—U.S. Appl. No. 60/034,470, filed Jan. 2, 1997, Thurston claims priority to the '470 application, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 37 pages.
Exhibit E-H—U.S. Patent No. 5,966,343 to Thurston ("Thurston") issued Oct. 12, 1999, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 20 pages.
Exhibit E-1—U.S Appl. No. 60/021,565, filed Jul. 11, 1996, incorporated by reference by Thurston, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 72 pages.
Exhibit E-I—U.S. Appl. No. 60/034,470, filed Jan. 2, 1997, Thurston claims priority to the '470 application, Barth, Richard, Inter Partes Reexamination Control No. 95/001,201, filed Jun. 23,.2009, re Third Party Requester's Cross-Appeal Brief in Inter Partes Reexamination Pursuant to 37.C.F.R. ss 41.67 dated Sep. 16, 2011. 37 pages.
Exhibit E-J—U.S. Appl. No. 60/021,565, filed Jul. 11, 1996, incorporated by reference by Thurston, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 72 pages.
Exhibit E-J—U.S. Appl. No. 60/021,567, filed Jul. 11, 1996, incorporated by reference by Thurston, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 75 pages.
Exhibit E-K—U.S. Appl. No. 60/021,524, filed Jul. 11, 1996, incorporated by reference by Thurston, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 74 pages.
Exhibit E-K—U.S. Appl. No. 60/021,567 filed Jul. 11, 1996, incorporated by reference by Thurston, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 75 pages.
Exhibit E-L—U.S. Appl. No. 60/021,524, filed Jul. 11, 1996, Incorporated by reference by Thurston, re Barth, Richard, Inter Partes Reexamination Control No. 95/001,201, filed Jun. 23, 2009, re.Third Party Requester's Cross-Appeal Brief in Inter Partes Reexamination Pursuant to 37 C.F.R. ss 41.67 dated Sep. 16, 2011. 74 pages.
Exhibit E-L—U.S. Patent No. 6,044,429 to Ryan et al., ("Ryan"), issued Mar. 28, 200, re Barth, Richard, Inter Partes Reexamination Control No. 95/001,196, filed Jun. 4, 2009, re Third Party.Requester's Cross-Appeal Brief in Inter Partes Reexamination Pursuant to 37 C.F.R. ss 41.67 dated Jul. 28, 2011. 19 pages.
Exhibit E-M—Full complaint filed by Patent Owner in "Certain Semiconductor Chips Having Synchronous Dynamic Random Access Memory Controllers and Products Containing Same, Including Graphics Cards and Motherboards," Docket No. 2637 (U.S. ITC), dated Nov. 5, 2008, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 215 pages.
Exhibit E-M—U.S. Patent No. 6,044,429 to Ryan et al. ("Ryan") issued Mar. 28, 2000, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 19 pages.
Exhibit E-N—Full first amended complaint filed by Patent Owner in *Rambus, Inc.* v. *NVIDIA Corporation*, 3:08-cv-03343-S1 (ND. Cal.), dated Jul. 10, 2008, re Barth, Richard, Inter Partes Reexamination Control No. 95/001,196 filed Jun. 4, 2009, re Third Party Requester's Cross-Appeal Brief in Inter Partes Reexamination Pursuant to 37 C.F.R. ss 41.67 dated Jul. 28, 2011. 18 pages.
Exhibit E-N—The complaint filed by Patent Owner in "Certain Semiconductor Chips Having Synchronous Dynamic Random Access Memory Controllers and Products Containing Same, Including Graphics Cards and Motherboards," Docket No. 2637 (U.S. ITC) dated Nov. 6, 2008, Barth, Richard, Inter Partes Reexamination Control No. 95/001,201, filed Jun. 23, 2009, re Third Party.Requester's Cross-Appeal Brief in Inter Partes Reexamination Pursuant to 37 C.F.R. ss 41.67 dated Sep. 16, 2011. 215 pages.
Exhibit E-O—The first amended complaint filed by Patent Owner in *Rambus, Inc.* v. *NVIDIA Corporation*, 3:08-cv-03343-Si (N.D. Cal.) dated Jul. 10, 2008, re Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 18 pages.
Exhibit E-O—Rambus Inc.'s Opening Brief on Disputed Claim Terms, In the Matter of "Certain Semiconductor Chips Having Synchronous Dynamic Random Access Memory Controllers and Products Containing Same," United States International Trade Commission, Investigation No. 337-661, dated Mar. 2, 2009, re Barth, Richard, Inter Partes Reexamination Control No. 95/001,196, filed Jun. 4, 2009, re Third Party Requester's Cross-Appeal Brief in Inter Partes Reexamination Pursuant to 37.C.F.R. ss 41.67 dated Jul. 28, 2011. 63 pages.
Exhibit E-P—Non-Final Office Action entered by the Examiner on Aug. 9, 2010, re Barth, Richard, Inter Partes Reexamination Control No. 95/001,196, filed Jun. 4, 2009, re Third Party Requester's.Cross-Appeal Brief in Inter Partes Reexamination Pursuant to 37 C.F.R. ss 41.67 dated Jul. 28, 2011. 35 pages.
Exhibit E-P—Rambus Inc.'s Opening Brief on Disputed Claim Terms, In the Matter of "Certain Semiconductor Chips Having Synchronous Dynamic Random Access Memory Controllers and Products Containing Same," United States International Trade Commission, Investigation No. 337-661 dated Mar. 2, 2009, re Barth, Richard, Inter Partes Reexamination Control No. 95/001,201, filed Jun.23, 2009, re Third Party Requester's Cross-Appeal Brief in Inter Partes Reexamination Pursuant to 37.C.F.R. ss 41.67 dated Sep. 16, 2011. 63 pages.
Exhibit E-Q—Comments by Third Party Requester Pursuant to 37 CFR 1.947, dated Oct. 8, 2010, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 29 pages.
Exhibit E-Q—Non-Final Office Action entered by the Examiner on Aug. 20, 2010, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 24 pages.
Exhibit E-Q—Non-Final Office Action entered by the Examiner on Aug. 20, 2010, re Barth, Richard, Inter Panes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 30 pages.
Exhibit E-Q—Non-Final Office Action entered by the Examiner on Aug. 9, 2010, re Barth, Richard, Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 19, 2011. 29 pages.
Exhibit E-R—Action Closing Prosecution entered by the Examiner on Dec. 21, 2010, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 30 pages.
Exhibit E-R—Comments by Third Party Requester Pursuant to 37 CFR 1.947, dated Oct. 15, 2010, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 25 pages.
Exhibit E-R—Comments by Third Party Requester Pursuant to 37 CFR 1.947 dated Oct. 15, 2010, re Barth, Richard, Inter Partes Reexamination Control No. 95/001,205 filed Jul. 1, 2009, re Third Party Requester's Cross-Appeal Brief in Inter Partes Reexamination Pursuant to 37 C.F.R. ss 41.67 dated Sep. 23, 2011. 26 pages.
Exhibit E-R—Comments by Third Party Requester Pursuant to 37 CFR 1.947 (Includes Exhibit A), dated Oct. 8, 2010, re Barth, Richard, Inter Partes Reexamination Control No. 95/001,189, filed May 2009, re Third Party Requester's Cross-Appeal Brief in Inter Partes Reexamination Pursuant to 37 C.F.R. ss 41.67 dated Jul. 19, 2011. 29 pages.
Exhibit E-S—Action Closing Prosecution entered by the Examiner on Feb. 7, 2011, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 27 pages.
Exhibit E-S—Action Closing Prosecution entered by the Examiner on Feb. 7, 2011, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 28 pages.
Exhibit E-S—Action Closing Prosecution entered by the Examiner on Dec. 21, 2010, re Barth, Richard, Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 2011. 29 pages.
Exhibit E-S—Comments by Third Party Requester Pursuant to 37 C.F.R. 1.951, dated Feb. 18, 2011, re Barth, Richard, Inter Partes Reexamination Control No. 95/001,196 filed Jun. 4, 2009, re Third Party Requester's Cross-Appeal Brief in Inter Partes Reexamination Pursuant to 37 C.F.R. ss 41.67 dated Jul. 28, 2011. 14 pages.
Exhibit E-T—Comments by Third Party Requester Pursuant to 37 C.F.R. 1.951 dated Apr. 4, 2011, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 14 pages.
Exhibit E-T—Comments by Third Party Requester Pursuant to 37 C.F.R. 1.951 dated Apr. 4, 2011, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 13 pages.
Exhibit E-T—Comments by Third Party Requester Pursuant to 37 C.F.R. 1.951 dated Feb. 18, 2011, re Barth, Richard, Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 19, 2011. 13 pages.
Exhibit E-T—Right of Appeal Notice entered by the Examiner on May 4, 2011, re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 49 pages.
Exhibit E-U—Exhibit 5B of Patent Owner's Response to Non-Final Action, (Conception Charts pre-Jan. 2, 1997), re Barth, Richard, Inter Partes Reexamination Control No. 95/001,196, filed Jun. 4,.2009, re Third Party Requester's Cross-Appeal Brief in Inter Partes Reexamination Pursuant to 37.C.F.R. ss 41.67 dated Jul. 28, 2011. 93 pages.
Exhibit E-U—Right of Appeal Notice entered by the Examiner on Apr. 22, 2011, re Barth, Richard, Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 19, 2011. 44 pages.
Exhibit E-U —Right of Appeal Notice entered by the Examiner on Jun. 15, 2011, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 41 pages.
Exhibit E-U—Right of Appeal Notice entered by the Examiner on Jun. 20, 2011, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 42 pages.
Exhibit E-V—Exhibit 5A of Patent Owner's Response to Non-Final Action, (Conception Claim Charts pre-Jul. 10, 1997), re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 75 pages.
Exhibit E-V—Exhibit 5B of Patent Owner's Response to Non-Final Action, (Conception Charts pre-Jan. 27, 1997), Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 107 pages.
Exhibit E-V—Exhibit 5B of Patent Owner's Response to Non-Final Action, (Conception Charts pre-Jul. 10, 1997), re Barth, Richard, Inter Partes Reexamination Control No. 95/001,189, filed May 18, 2009, re Third Party Requester's Cross-Appeal Brief in Inter Partes Reexamination Pursuant to 37 C.F.R. ss 41.67 dated Jul. 19, 2011. 93 pages.
Exhibit E-W—Exhibit 5A of Patent Owner's Response to Non-Final Action, (Conception Claim Charts pre-Jul. 10, 1997), Barth, Richard, Inter Partes Reexamination Control No. 95/001,201 filed Jun. 23, 2009, re Third Party Requester's Cross-Appeal Brief in Inter Partes Reexamination Pursuant to 37 C.F.R. ss 41.67 dated Sep. 16, 2011. 85 pages.
Exhibit E-W—Exhibit 5A of Patent Owner's Response to Non-Final Action, (Conception Claim Charts pre-Jan. 2, 1997), re Barth, Richard, Inter Partes Reexamination Control No. 95/001,189, filed May. 18, 2009, re Third Party Requester's Cross-Appeal Brief in Inter Partes Reexamination Pursuant to 37 C.F.R. ss 41.67 dated Jul. 19, 2011. 75 pages.
Exhibit E-W—Exhibit CD of Patent Owner's Response to Non-Final Action ("Ware2email") date blacked out, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 5 pages.
Exhibit E-X—Exhibit Cd of Patent Owner's Response to Non-Final Action ("Ware2email") date blacked out, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 5 pages.
Exhibit E-X—Exhibit CE of Patent Owner's Response to Non-Final Action, ("Davis 4 email"), date blacked out, re Barth, Richard, Inter Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 4 pages.
Exhibit E-Y—Exhibit CE of Patent Owner's Response to Non-Final Action, ("Davis 4 email"), date blacked out, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 4 pages.
Exhibit E-Y—U.S. Patent No. 5,430,676 to Ware ("Ware") issued Jul. 4, 1995, re Barth, Richard, Inter.Partes Reexamination Control No. 95/001,205, filed Jul. 1, 2009, re Third Party Requester's Cross-Appeal Brief in Inter Partes Reexamination Pursuant to 37 C.F.R. ss 41.67 dated Sep. 23, 2011. 27 pages.
Exhibit E-Z—The JEDEC Standard No. 21-C, Release 4, Nov. 1993 ("JEDEC"), re Barth, Richard, Inter Partes Reexamination Control No. 95/001,196, filed Jun. 4, 2009, re Third Party Requester's Cross-Appeal Brief in Inter Partes Reexamination Pursuant to 37 C.F.R. ss 41.67 dated Jul. 28, 2011. 185 pages.
Exhibit E-Z—U.S. Patent No. 5,430,676 to Ware ("Ware") issued Jul. 4, 1995, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 27 pages.
Exhibit F—David Roberts E-mail sent Aug. 6, 1997, "MTD 64MD Project Review: Aug. 1997," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 5 pages.
Exhibit F, Tab 1—U.S. Patent No. 6,226,723, Gustayson, et al. ("Gustayson"), in Request for Inter Partes Reexamination mailed Jun. 23, 2009 of U.S. Patent No. 7,287,119, issued Oct. 23, 2007, 88 pages.
Exhibit F, Tab 2—Gustavson, D., et al., "Packetized Communicated for a High Performance Random Access Memory System," U.S. Appl. No. 60/026,419, filed Sep. 20, 1996, 13 pages.

Exhibit F, Tab 2—U.S. Appl. No. 60/026,419, filed Sep. 1996, incorporated by reference in Gustayson, in Request for Inter Partes Reexamination mailed Jun. 23, 2009 of U.S. Patent No.7,287,119, Oct. 23, 2007, 13 pages.
Exhibit F, Tab 3—Gustavson, D., et al. "Packets for a High Performance Random Access Memory System," U.S. Appl. No. 60/026,896, filed Sep. 20, 1996, re Request for Inter Partes Reexamination filed Jul. 1, 2009, for U.S. Patent 7,287,119, Control No. 95/001,189, 24 pages.
Exhibit F, Tab 3—U.S. Appl. No. 60/026,896, filed Sep. 1996, incorporated by reference in Gustayson, Request for Inter Partes Reexamination mailed Jun. 23, 2009 of U.S. Patent No. 7,287,119, issued Oct. 23, 2007, 24 pages.
Exhibit G—Michael Ching E-mail dated Nov. 15, 1999, "Intel 820 Product Launch," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 4 pages.
Exhibit G—Oshima et al. ("Oshima"), "High Speed DRAMs with Innovative Architectures," Aug. 1994, re Request for Inter Partes Reexamination dated Jul. 1, 2009, Control No. 95/001,196 for U.S. Patent 7,330,952, 14 pages.
Exhibit G—U.S. Patent No. 7,287,109 issued Oct. 23, 2007, to Barth et al. ("Barth '109"), 47 pages.
Exhibit GV—"pinout011497-6858," dated Jan. 14, 1997, per Patent Owner's Brief on Appeal dated Sep. 19, 2011, re Control No. 95/001,201. 5 pages.
Exhibit H—Ohshima et al. ("Ohshima"), "High Speed DRAMs with Innovative Architectures," Aug. 1, 1994, 14 pages.
Exhibit H—Rambus Inc.—Company Confidential, Project: Direct Rdram, Rev. 0.2, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 253 pages.
Exhibit H, Tab 1—U.S. Patent No. 5,966,343 to Thurston ("Thurston"), Request for Inter Partes Reexamination mailed Jun. 23, 2009, of U.S. Patent No. 7,330,952 issued Feb. 12, 2008, 20 pages.
Exhibit H, Tab 2—U.S. Appl. No. 60/034,470, filed Jan. 2, 1997, to which Thurston claims priority, Request for Inter Partes Reexamination mailed Jun. 23, 2009 of U.S. Patent No. 7,330,952, issued Feb. 12, 2008, 37 pages.
Exhibit H, Tab 3—U.S. Appl. No. 60/021,567, incorporated by reference by Thurston, Request for Inter Partes Reexamination mailed Jun. 23, 2009 of U.S. Patent No. 7,330,952 issued Feb. 12, 2008, 75 pages.
Exhibit H, Tab 4—U.S. Appl. No. 60/021,565, incorporated by reference by Thurston, Request for Inter Partes Reexamination mailed Jun. 23, 2009 of U.S. Patent No. 7,330,952 issued Feb. 12, 2008, 72 pages.
Exhibit H, Tab 5—U.S. Appl. No. 60/021,524, incorporated by reference by Thurston, Request for Inter Partes Reexamination mailed Jun. 23, 2009 of U.S. Patent No. 7,330,952 issued Feb. 12, 2008, 74 pages.
Exhibit I—U.S. Patent No. 5,430,676 to Ware et al. ("Ware"), Request for Inter Partes Reexamination mailed Jun. 23, 2009, of U.S. Patent No. 7,330,952, issued Feb. 12, 2008, 27 pages.
Exhibit I, Tab 1—U.S. Patent No. 5,966,343 to Thurston ("Thurston") issued Oct. 12, 1999, 20 re Request for Inter Partes Rexamination for U.S. Patent No. 7,287,119, 20 pages.
Exhibit I, Tab 2—U.S. Appl. No. 60/034,470, filed Jan. 2, 1997. Thurston claims priority to the '470 application re Request for Inter Partes Reexamination for U.S. Patent No. 7,287,119, 37 pages.
Exhibit I, Tab 2—Thurston, P., "Variable Latency Memory Circuit," U.S. Appl. No. 60/034,470, filed Jan. 2, 1997, re Request for Inter Partes Reexamination filed Jul. 1, 2009, for U.S. Patent 7,287,119, Control No. 95/001,189, 37 pages.
Exhibit I, Tab 3—Nakamura et al., "DRAM Architecture with Aligned Data Storage and Bond Pads," U.S. Appl. No. 60/021,565, filed Jul. 11, 1996, re Request for Inter Partes Reexamination filed Jul. 1, 2009, for U.S. Patent 7,287,119, Control No. 95/001,189, 72 pages.

Exhibit I, Tab 3—U.S. Appl. No. 60/021,565, filed Jul. 11, 1996, incorporated by reference by Thurston re Request for Inter Partes Reexamination for U.S. Patent No. 7,287,119 72 pages.
Exhibit I, Tab 4—Nakamura et al., "Four Bit Pre-Fetch SDRAM Column Select Architecture," U.S. Appl. No. 60/021,567, filed Jul. 11, 1996, re Request for Inter Partes Reexamination filed Jul. 1, 2009, for U.S. Patent 7,287,119, Control No. 95/001,189, 75 pages.
Exhibit I, Tab 4—U.S. Appl. No. 60/021,567, filed Jul. 11, 1996, incorporated by reference by Thurston, 75 pages.
Exhibit I, Tab 5—McAdams et al., "Data Sequencing and Registering in a Four Bit Pre-Fetch SDRAM," U.S. Appl. No. 60/021,524 filed Jul. 11, 1996, re Request for Inter.Partes Reexamination filed Jul. 1, 2009, for U.S. Patent 7,287,119, Control No. 95/001,189, 74 pages.
Exhibit I, Tab 5—U.S. Appl. No. 60/021,524, filed Jul. 11, 1996, incorporated by reference by Thurston re Request for Inter Partes Reexamination for U.S. Patent No. 7,287,119 74 pages.
Exhibit J—"RMC.dl.v.vv—Verilog"—Directory Containing the Verilog Source Files for the Rambus Memory Controller Which Manages a One-Channel-Direct Memory Subsystem, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 130 pages.
Exhibit J—JEDEC Standard No. 21-C, Release 4, Nov. 1993 ("the JEDEC Standard"), Request for Inter Partes Reexamination mailed Jun. 23, 2009 of U.S. Patent No. 7,330,952, issued Feb. 12, 2008, 186 pages.
Exhibit J—JEDEC Standard No. 21-C, Release 4, Nov. 1993 ("the JEDEC Standard"), per Patent Owner's Brief on Appeal dated Sep. 19, 2011, re Control No. 95/001,201. 130 pages.
Exhibit J—U.S. Patent No. 5,430,676 to Ware et al. ("Ware"), issued Jul. 4, 1995 re Request for Inter Partes Reexamination for U.S. Patent No. 7,287,119, 27 pages.
Exhibit J, (Continued)—JEDEC Standard No. 21-C, Release 4, Nov. 1993 ("The JEDEC Standard"), Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss.41.67 dated Sep. 16, 2011. 56 pages.
Exhibit K—Claim chart for claims 1-28 based on of the '953 patent based on Ryan, with additional reference to Gillingham, Gustayson, Inagaki, and Kushiyama, Barth, Richard, Inter Partes Reexamination Control No. 95/001,201, filed Jun. 23, 2009, re Third Party Requester's Cross-Appeal Brief in Inter Partes Reexamination Pursuant to 37 C.F.R. ss 41.67 dated Sep. 16, 2011. 44 pages.
Exhibit K—Claim Chart for claims 1-28 of the '953 patent based on Ryan, with additional reference to Gillingham, Gustaysom, Inagaki, and Kushiyama, Request for Inter Partes Reexamination, mailed Jun. 23, 2009, of U.S. Patent No. 7,330,953, issued Feb. 12, 2008, 44 pages.
Exhibit K—JEDEC Standard No. 21-C, Release 4, Nov. 1993 ("the JEDEC Standard"), re Request for Inter Partes Reexamination for U.S. Patent No. 7,287,119 186 pages.
Exhibit K—Steven Woo E-mail, "Radical 3.0," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit K—U.S. Patent No. 5,568,445 filed Mar. 2, 1995, to Park et al. ("Park") issued on Oct. 22, 1996, re Request for Inter Partes Reexamination for U.S. Patent No. 7,330,952, 21 pages.
Exhibit K—U.S. Patent No. 7,287,109 to Barth et al. ("Barth '109") re Request for Inter Partes Reexamination filed Jul. 1, 2009, for U.S. Patent 7,360,050, Control No. 95/001,205, 47 pages.
Exhibit L—"8-Mbit (512K×16, 1024K×8) SmartVoltage Boot Block Flash Memory Family product preview" ("Intel Datasheet") dated Sep. 1995 re Request for Inter Partes Reexamination for U.S. Patent 7,330,952, 79 pages.
Exhibit L—Claim Chart for Claims 1-23 of the '119 patent based on Ryan with additional reference to Gillingham, Gustayson, Inagaki, and Kushiyama, in Request for Inter Partes Reexamination for U.S. Patent No. 7,287,119 dated Sep. 29, 2009, 30 pages.
Exhibit L—Claim chart for claims 1-28 of the '953 patent based on Gilllingham, with additional reference to Ohshima and Ryan, Request for Inter Partes Reexamination, mailed Jun. 23, 2009, of U.S. Patent No. 7,330,953, issued Feb. 12, 2008, 59 pages.

Exhibit L—Claim Chart for claims 1-31 based on the '050 patent based on Ryan, with additional reference to Gillingham, Gustayson, Inagaki, Kushiyama, re Request for Inter Partes Reexamination filed Jul. 1, 2009, for U.S. Patent 7,360,050, Control No. 95/001,205, 31 pages.
Exhibit L—Rambus Inc., "Direct RDRAM 64/72-Mbit (4M×16/18)—Advance Information," last modified Jul. 14, 1997, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 50 pages.
Exhibit M—Claim Chart for Claims 1-20 and 23 of the '119 patent based on Gillingham with additional reference to Ohshima, in Request for Inter Partes Reexamination dated Sep. 29, 2009, 42 pages.
Exhibit M—Claim Chart for claims 1-26, 28, and 30 of the '050 patent based on Gillingham, with additional reference to Ohshima and Ryan, re Request for Inter Partes Reexamination filed Jul. 1, 2009, for U.S. Patent 7,360,050, Control No. 95/001,205, 32 pages.
Exhibit M—Claim chart for claims 1-28 based on the '952 patent based on Ryan, with additional reference to Gillingham, Gustayson, Inagaki, Kushiyama, Park, and the Intel Datasheet, re ReNquest for Inter Partes Reexamination Sep. 29, 2009, 29 pages.
Exhibit M—Claim chart for claims 1-28 of the '953 patent based on Thurston, with additional reference to Gustayson, Inagaki, and Ryan, Request for Inter Partes Reexamination, mailed Jun. 23, 2009, of U.S. Patent No. 7,330,953, issued Feb. 12, 2008, 46 pages.
Exhibit M—Rambus Inc., Notice of Sending of New "Advanced" Version, 64/72M Direct RDRAM data sheet, Ftc Docket No. 9302, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 6 pages.
Exhibit N—Claim chart for claims 1-28 of the '952 patent based on Gillingham, with additional reference to Ohshima, Park, and the Intel Datasheet, re Request for Inter Partes Reexamination Sep. 29, 2009, 38 pages.
Exhibit N—Claim chart for claims 1-28 of the '953 patent based on Ware, with additional reference to Gustayson and Ohshima, Request for Inter Partes Reexamination, mailed Jun. 23, 2009, of U.S. Patent No. 7,330,953, issued Feb. 12, 2008, 37 pages.
Exhibit N—Claim Chart for claims 1-31 of the '050 patent based on Thurston, with additional reference to Gustayson, Inagaki, the JEDEC Standard, Ryan, and Ware, re Request for Inter Panes Reexamination filed Jul. 1, 2009, for U.S. Patent 7,360,050, Control No. 95/001,205, 29 pages.
Exhibit N—Claim Chart for Claims 7 and 10-12 of the '119 patent based on Barth '109 re Request for Inter Partes Reexamination dated Sep. 29, 2009, 7 pages.
Exhibit O—Claim Chart for Claims 1-23 of the '119 patent based on Thurston with additional reference to Inagaki, Gustayson, and Kushiyama, in Request for Inter Partes Reexamination dated Sep. 29, 2009, 28 pages.
Exhibit O—Claim chart for claims 1-28 of the '952 patent based on Thurston, with additional reference to Gustavson, Inagaki, Ryan, Park, and the Intel Datasheet, re Request for Inter Partes Reexamination Sep. 29, 2009, 28 pages.
Exhibit O—Claim chart for claims 1-28 of the '953 patent based on the JEDEC Standard, with additional reference to Ware, Gustavson, and Inagaki, Request for Inter Partes Reexamination, mailed Jun. 23, 2009, of U.S. Patent No. 7,330,953, issued Feb. 12, 2008, 40 pages.
Exhibit O—Claim Chart for claims 1-31 of the '050 patent based on Ware, with additional reference to Gustavson and Ohshima, re Request for Inter Partes Reexamination filed Jul. 1, 2009, for U.S. Patent 7,360,050, Control No. 95/001,205, 27 pages.
Exhibit P—Claim Chart for Claims 1-23 of the '119 patent based on Ware with additional reference to Gustavson and Ohshima, in Request for Inter Partes Reexamination dated Sep. 29, 2009, 25 pages.
Exhibit P—Claim chart for claims 1-28 of the '952 patent based on Ware, with additional reference to Gustavson, Ohshima, Park, and the Intel Datasheet re Request for Inter Partes Reexamination Sep. 29, 2009, 28 pages.
Exhibit P—Claim Chart for claims 1-31 of the '050 patent based on the Jedec Standard, with additional reference to Ware, Gustavson, and Inagaki, re Request for Inter Partes Reexamination filed Jul. 1, 2009, for U.S. Patent 7,360,050, Control No. 95/001,205, 29 pages.
Exhibit P—File History of the '953 patent, Request for Inter Partes Reexamination, mailed Jun. 23, 2009, of U.S. Patent No. 7,330,953, issued Feb. 12, 2008, 275 pages.
Exhibit P—John Dillon E-mail sent Aug. 5, 1997, "Update Aug. 5," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.
Exhibit Q—Claim Chart for Claims 1-23 of the '119 patent based on the Jedec Standard with additional reference to Ware, Gustavson, and Inagaki, re Request for Inter Partes Reexamination dated Sep. 29, 2009, 26 pages.
Exhibit Q—Claim chart for claims 1-28 of the '952 patent based on the Jedec Standard, with additional reference to Ware, Gustavson, Inagaki, Park, and the Intel Datasheet, re Request for Inter Partes Reexamination Sep. 29, 2009, 26 pages.
Exhibit Q—Claim chart for claims 22, 23, and 27 of the '050 patent based on Barth '109 re Request for Inter Partes Reexamination filed Jul. 1, 2009, for U.S. Patent 7,360,050, Control No. 95/001,205, 6 pages.
Exhibit Q—John Dillon E-mail sent Aug. 6, 1997, "Update Aug. 6," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit Q, The complaint filed by Patent Owner in "Certain Semiconductor Chips Having Synchronous Dynamic Random Access Memory Controllers and Products Containing Same Including Graphics Cards and Motherboards," filed in Apr. 24, 2009 Request for Inter Partes Reexamination Under 35 Usc §§31-318 re 6,470,405, 216 pages.
Exhibit R—File History of the '119 patent re Request for Inter Partes Reexamination dated Sep. 29, 2009, 156 pages.
Exhibit R—John Dillon E-mail sent Aug. 7, 1997, "—Meeting Aug. 7," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 2 pages.
Exhibit R, The first amended complaint filed by Patent Owner in Rambus, Inc. v. NVIDIA Corporation, 3:08-cv-03343-Si (N.D. Cal.) filed Apr. 24, 2009 in Request for Inter Partes Reexamination under 35 USC §§311-318 re 6,470,405, 18 pages.
Exhibit R-A—Certain Semiconductor Chips Having Synchronous Dynamic Random Access Memory Controllers and Products Containing Same, Order Construing the Terms of the Asserted Claims of the Patents at Issue, Jun. 22, 2009, per Respondent Brief of Third Party Requester in Inter Partes Reexamination of U.S. Patent No. 7,330,952 with Control No. 95/001,196 dated Sep. 8, 2011. 54 pages.
Exhibit R-B—Certain Semiconductor Chips Having Synchronous Dynamic Random Access Memory Controllers and Products Containing Same, Initial Deteimination on Violation of Section 337 and Recommendation Determination on Remedy and Bond, Jan. 22, 2010 and Notice of Commission Final Determination of Violation of Section 337; Termination of Investigation; Issuance of Limited Exclusion Order and Cease and Desist Orders, Jul. 26, 2010, per Respondent Brief of Third Party Requester in Inter Partes Reexamination of U.S. Patent No. 7,330,952 with Control No. 95/001,196 dated Sep. 8, 2011. 213 pages.
Exhibit R-C—Listing of various patent reexamination proceedings of the Patent Owner's patent, undated, per Respondent Brief of Third Party Requester in Inter Partes Reexamination of U.S. Patent No. 7,330,952 with Control No. 95/001,196 dated Sep. 8, 2011. 3 pages.
Exhibit S—The complaint filed by Patent Owner in "Certain Semiconductor Chips Having Synchronous Dynamic Random Access Memory Controllers and Products Containing Same, Including Graphics Cards and Motherboards," re Request for Inter Partes Reexamination dated Jul. 1, 2009, Control No. 95/001,189 for U.S. Patent 7,287,119, 216 pages.
Exhibit S—The complaint filed by Patent Owner in "Certain Semiconductor Chips Having Synchronous Dynamic Random Access Memory Controllers and Products Containing Same, Including Graphics Cards and Motherboards," re Request for Inter Partes Reexamination Sep. 29, 2009, 216 pages.

Exhibit S—Handwritten Notes dated Aug. 8—Oct. 16, 1997, R3418717-R3418735, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 20 pages.

Exhibit S, Rambus Inc.'s Opening Brief on Disputed Claim Terms dated Mar. 2, 2009, in the Matter of: "Certain Semiconductor Chips Having Synchronous Dynamic Random Access Memory Controllers and Products Containing Same", United States International Trade Commission Investigation No. 337- 661, Request for Inter Partes Reexamination under 35 USC §311-318 re 7,287,109, 65 pages.

Exhibit S, Rambus Inc.'s Opening Brief on Disputed Claim Terms, filed Mar. 2, 2009, in the matter of: "Certain Semiconductor Chips Having Synchronous Dynamic Random Access Memory Controllers and Products Containing Same," United States International Trade Commission Investigation No. 337661, Request for Inter Partes Reexamination under 35 USC §§311-318 re 6,470,405, 65 pages.

Exhibit T—The first amended complaint filed by Patent Owner in *Rambus, Inc.* v. *NVIDIA Corporation*, 3:08-cv-03343-Si (N.D. Cal.) re Request for Inter Partes Reexamination dated 7/1/09 with Control No. 95/001,189 for U.S. Patent 7,287,119, 18 pages.

Exhibit T—The first amended complaint filed by Patent Owner in *Rambus Inc.* v. *NVIDIA Corporation*, 3:08-cv-03343-Si (N.D. Cal.) re Request for Inter Partes Reexamination Sep. 29, 2009, 18 pages.

Exhibit T—Handwritten Notes dated Jul. 10-Sep. 30, 1997, R19224893-R19224977, re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 86 pages.

Exhibit U—Dave Roberts E-mail sent Sep. 2, 1997, "MTD 64MD Project Review: Sep. 1997," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 6 pages.

Exhibit U—Rambus Inc.'s Opening Brief on Disputed Claim Terms, In the Matter of "Certain Semiconductor Chips Having Synchronous Dynamic Random Access Memory Controllers and Products Containing Same," United States International Trade Commission, Investigation No. 337-661 re Request for Inter Partes Reexamination dated Jul. 1, 2009 with Control No. 95/001,189 for U.S. Patent.7,287,119, 65 pages.

Exhibit U—Rambus Inc.'s Opening Brief on Disputed Claim Terms, In the Matter of: "Certain Semiconductor Chips Having Synchronous Dynamic Random Access Memory Controllers and Products Containing Same," United States International Trade Commission, Investigation No. 337-661, re Request for Inter Partes Reexamination Sep. 29, 2009 for U.S. Patent No. 7,330,952, 65 pages.

Exhibit V—John Privitera E-mail sent Sep. 3, 1997, "Verification Project Review," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.

Exhibit W—Dave Roberts E-mail sent Oct. 6, 1997, "MTD 64MD Project Review: Oct. 1997," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 7 pages.

Exhibit X—Handwritten Notes dated Aug. 5-Oct. 6, 1997, R19232609-R19232629, Collected Nov. 2008, re Ex Parte Reexamination of U.S. Patent Nos. 7,330,953 and 7,360,050 Barth et al.dated Aug. 19, 2009, both filed Dec. 23, 2008, with Control Nos. 90/009,369 and 90/009,370, 22 pages.

Exhibit Y—John Dillon E-mail sent Aug. 7, 1997, "Package AR Update Aug. 7," re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.

Exhibit Z—Handwritten Notes dated Aug. 7-Oct. 10, R19227628-R19227632, Collected Nov. 2008 re Ex Parte Reexamination of U.S. Patent Nos. 7,330,953 and 7,360,050 Barth et al.dated Aug. 19, 2009, both filed Dec. 23, 2008, with Control Nos. 90/009,369 and 90/009,370, 6 pages.

Feb. 20, 2009 Order Granting Ex Parte Reexamination re 7,287,119 in Office Communication, 9 pages.

Fujiwara, A. et al., "A 200MHz 16Mbit Synchronous DRAM with Block Access Mode," 1994 Symposium on Vlsi Circuits Digest of Technical Papers, p. 79-80, 1994. 2 pages.

Gillingham, Peter and Vogley, Bill, "SLDRAM: High Performance Open-Standard Memory," IEEE Micro, Nov./Dec. 1997, p. 29-39, vol. No. 6, Institute of Electrical and Electronics Engineers, Inc., Los Alamitos, California.

Gillingham, Peter and Vogley, Bill, "SLDRAM: High-Performance, Open-Standard Memory", *IEEE Micro*, v.17, n. 6, pp. 29-30, Nov. 1997.

Gillingham, Peter, "SLDRAM Architectural and Functional Overview", SLDRAM Consortium, Aug. 29, 1997, pp. 1-14. 14 pages.

Haining, T.R., et al., "Management Policies for Non-Volatile Write Caches," Int'l Conf. on Performane, Computing, and Communications, Feb. 10-12, 1999, pp. 321-328.

Information Disclosure Statement dated Apr. 5, 2011 re U.S. Appl. No. 12/875,483. 20 Pages.

Initial Expert Report of Vivek Subramanian, filed Jun. 12, 2009, In the Matter of "Certain Semiconductor Chips Having Synchronous Dynamic Random Access Memory Controllers and Products Containing Same," U.S. International Trade Commission, Investigation No. 337-TA-661, 64 pages.

Inter Partes Reexamination—IDS PTO 1449 Form for Inter Partes Reexamination of 7,360,050, Control No. 95/001,205, filed Jul. 1, 2009, 1 page.

JEDEC Standard No. 21-C Release 4, "Configurations for Solid State Memories," Electronic Industries Association, Nov. 1993, 183 pages.

Kristiansen, E.H., Alnes, Knut, Bakka, Bjorn O, and Jenssen, Mant, "Scalable Coherent Interface", Eurobus Conference Proceedings, May 1989. 9 pages.

Kumanoya, M., et al., "Trends in High-Speed DRAM Architectures," IEICE Trans. Electron., vol. E79-C, No. 4, Apr. 1996, pp. 472-481.

Kushiyama, Natsuki et al., "A 500-Megabyte/s Data-Rate 4.5M DRAM" IEEE Journal of Solid State Circuits, IEEE Service Center, Piscataway, NJ, US, vol. 28, No. 4, Apr. 1, 1993, pp. 490-498. 9 pages.

Micron Semiconductor, Inc. "MT48LC2M8SI (S) 2 MEG x8 SDRAM, Synchronous Dram, 2 MEG x 8 SDRAM, Pulsed RAS, Dual Bank, BURST Mode, 3.3V, SELF Refresh", Advance, Apr. 1994, Section 2, pp. 44-83 85 pages.

Micron Technology, Inc., "MT48LC2MxxS 2 Meg.times.8 SDRAM," Rev. Apr. 1996. This reference was cited by the Examinaer in U.S. Appl. No. 11/681,684 on the PTO-892 for included in the Notice of Allowance.

Micron Technology, Inc., "Synchronous DRAM," Rev. Apr. 1996. This reference was cited by the Examiner in U.S. Appl. No. 11/681,384 on the PTO-892 form included in the Notice of Allowance.

Mitsubishi Electric, M5M4V16807ATP-10, -12, -15, Target Spec. (Rev. 0.3),May 7, 1993, pp. 452-488. 37 pages.

MoSys, Inc., MD904 to MD920, ½ to 2 ½ MByte Multibank DRAM (MDRAM9®) 128K×32 to 656K×32 Preliminary Information, Feb. 21, 1997 16 pages.

Non-Final Office Action for Control No. 90/009,370 (Barth II 7,360,050 Patent), Apr. 15, 2009, Removal of Premature Non-Final Office Action., 3 pages.

Non-Final Office Action for Control No. 90/010,365 (Barth II 7,287,119 Patent), Apr. 15, 2009, Removal of Premature Non-Final Office Action., 3 pages.

Non-Final Office Action in Ex Parte Reexamination for 7,360,050 dated Apr. 10, 2009, 8 pages.

Non-Final Office Action mailed Apr. 10, 2009 in Ex Parte Reexamination for U.S. Patent No. 7,330,952, 8 pages.

Non-Final Office Action in Ex Parte Reexamination in 7,287,119, dated Apr. 28, 2009, 10 pages.

Notices of Assignment and Filing Date of Reexamination, mailed May 21, 2009, re Request for Inter Partes Reexamination of U.S. Patent 7,209,997, dated May 15, 2009, 2 pages.

Barth et al., "Integrated Circuit Memory Device Having Delayed Write Timing Based on Read Response time", U.S. Appl. No. 12/349,485, filed Jan. 6, 2009 (pending application), 33 pages.

NVIDIA, "Markman Hearing Presentation, Barth II Patents," ITC Investigation No. 337-TA-661, Mar. 24, 2009, 48 pages.

NVIDIA's First Supplement to its Objections and Responses to Rambus's First Set of Interrogatories (Nos. 1-37), re Certain Semiconductor Chips Having Synchronous Dynamic Random Access Memory Controllers and Products Containing Same; Investigation No. 337-TA-661, Jan. 29, 2009, 34 pages.

NVIDIA's Request for Inter Partes Reexamination Pursuant to 37 C.F.R. 1.510 of U.S. Patent No. 7,209,997, filed May 15, 2009, 648 pages.

NVIDIA's slide presentation re "Markman Tutorial," International Trade Commission Investigation No. 337-TA-661, Mar. 24, 2009, 67 pages.

Office Action mailed Aug. 3, 2009 re Order Granting/Denying Request for Inter Partes Reexamination is Granted with Control No. 95/001,189, for U.S. Patent 7,287,119, 4 pages.

Office Action with mail date Jul. 23, 2009, re Interview Summary for Control No. 90/009,369, filed Dec. 23, 2008, 57 pages.

Office Action with mail date of Dec. 2, 2009 for U.S. Appl. No. 95/001,196 and 90/009,371, re Inter Partes Reexamination Communication to Third Party Requester for 7,330,952, 59 pages.

Office Communication Granting Request for Ex Parte Reexamination of U.S. Patent No. 7,330,953, mailed Mar. 6, 2009, 9 pages.

Ohno, Chikai; "Self-Timed RAM: STRAM", Fujitsu Sci. Tech J., 24,4, pp. 293-300, Dec. 1988, 8 pages.

Oshima, Shigeo et al., "High Speed DRAMs with Innovative Architectures," IEICE Trans. Electron, vol. E77-C, No. 8, pp. 1303-1315 Aug. 1994. (Exhibit F), 14 pages.

Patent Owner's First Supplemental Reply to Office Action mailed on Aug. 25, 2009, in Ex Parte Reexamination of U.S. Patent 7,330,952, Control No. 90/009,371, filed Dec. 22, 2008, 36 pages.

Patent Owner's First Supplemental Reply to Office Action mailed on Aug. 25, 2009, in Ex Parte Reexamination of U.S. Patent 7,287,119, Control No. 90/010,365, filed Dec. 18, 2008, 35 pages.

Patent Owner's Response to Office Action in Ex Parte Reexamination dated Jul. 30, 2009, from Reexamination of U.S. Patent 7,287,119 to Barth et al., Control No. 90/010,365, filed Dec. 18, 2008, 49 pages.

Patent Owner's Response to Office Action in Ex Parte Reexamination dated Jul. 30, 2009, of U.S. Patent 7,330,952 to Barth et al., Control No. 90/009,371, filed Dec. 22, 2008, 50 pages.

Patent Owner's Response to Office Action in Ex Parte Reexamination of U.S. Patent No. 7,330,952 to Barth et al., dated Jul. 30, 2009, Control No. 90/009,371, filed Dec. 22, 2008, 50 pages.

Prince, B., "Semiconductor Memories: A Handbook of Design, Manufacture, and Application," Second Edition, © 1983-1991 John Wiley & Sons Ltd., 1983 Opposition of Micron from the EPO, Mar. 2, 2009 Opposition of Hynix Mar. 19, 2009, 12 pages.

Prince, Betty "High Performance memories: New Architecture DRAMs and SRAMs—evolution and unction," John Wiley & Sons, New York, 1999, 350 pages.

Prince, Betty, "Semiconductor Memories", Second Edition, John Wiley & Sons, 1991, pp. 251, 310, 314, 200-201, 467.

U.S. Appl. No. 60/061,770, part of US Patent No. 7,360,050 (Oct. 2008). 76 Pages.

Pryzbylski, S.A., "New DRAM Technologies, A Comprehensive Analysis of the New Architectures," pp. iii-iv, 19-21, 138-58, 77-203 (MicroDesign Resource 1994). 60 pages.

Rambus Inc, "8/9-Mbit (1M×8/9) & 16/18Mbit (2M×8/9) RDRAM—Preliminary Information," Rambus Inc. Data Sheet, Mar. 1, 1996, 30 pages.

Rambus Inc. Data Sheet, "16/18Mbit (2M8/9) and 64/72 Mbit (8M×8/9) Concurrent RDRAM," Preliminary Information, Mar. 1996, 31 pages.

Rambus Inc. Data Sheet, "16/18Mbit (2M×8/9) & 64/72Mbit (8M×8/9) Concurrent RDRAM," Rambus Inc., Advance Information, Sep. 1997, 36 pages.

Rambus Inc., "16/18Mbit (2M×8/9) and 64/72Mbit (8M×8/9) Concurrent DRAM Data Sheet—Advanced Information," Jul. 1996, pp. 1-61.

Rambus Inc., "Architectural Overview," Rambus Inc., 1992, pp. 1-23.

Rambus Inc., "16/18Mbit (2M×8/9) and 64/72Mbit (8M×8/9) Concurrent RDRAM Data Sheet—Preliminary Information," Mar. 1996, pp. 1-30.

Rambus Inc.'S Responsive Brief on Disputed Claim Terms, United States International Trade Commission, Investigation No. 337-TA-661, "In the Matter of: Certain Semiconductor Chips Having Synchronous Dynamic Random Access Memory Controllers and Products Containing Same" dated Mar. 16, 2009, 223 pages.

Rambus's Technical Tutorial, slide presentation re Investigation No. 337-TA-661, Mar. 24, 2009, 49 pages.

Request for Ex Parte Reexamination of U.S. Patent No. 7,287,119, filed on Dec. 18, 2008, 34 pages.

Request for Ex Parte Reexamination of U.S. Patent No. 7,330,952, filed on Dec. 19, 2008, 41 pages.

Request for Ex Parte Reexamination of U.S. Patent No. 7,330,953, filed on Dec. 19, 2008, 34 pages.

Request for Ex Parte Reexamination of U.S. Patent No. 7,360,050, filed on Dec. 19, 2008, 37 pages.

Request for Inter Partes Reexamination for U.S. Patent No. 7,287,119 dated May 18, 2009, 107 pages.

Request for Inter Partes Reexamination for U.S. Patent No. 7,360,050, Control No. 95/001,205, filed Jul. 1, 2009, 101 pages.

Request for Inter Partes Reexamination Transmittal Form and IDS for Patent No. 7,287,119 dated May 18, 2009, 3 pages.

Request for Inter Partes Reexamination Transmittal Form with Information Disclosure Statement for U.S. Patent No. 7,330,952, dated Jun. 4, 2009, 3 pages.

Request for Inter Partes Reexamination Under 35 U.S.C. For U.S. Patent No. 7,330,952, dated Jun. 4, 2009, 98 pages.

Request for Inter Partes Reexamination Under 35 U.S.C. mailed Jun. 23, 2009, for U.S. Patent No. 7,330,953 issued Feb. 12, 2008, 100 pages.

Respondents' Opening Claim Construction Brief, United States International Trade Commission, Investigation No. 337-TA-661, "In the Matter of Certain Semiconductor Chips Having Synchronous Dynamic Random Access Memory Controllers and Products Containing Same," Mar. 2, 2009, 100 pages.

Respondents' Identification of Prior Art Pursuant to Ground Rule 5, filed Jun. 12, 2009, in the Matter of "Certain Semiconductor Chips Having Synchronous Dynamic Random Access Memory Controllers and Products Containing Same," U.S. International Trade Commission, Investigation No. 337-TA-661, 26 pages.

Respondents' Responsive Claim Construction Brief, United States International Trade Commission, Investigation No. 337-TA-661, "In the Matter of: Certain Semiconductor Chips Having Sychronous Dynamic Random Access Memory Controllers and Products Containing Same" dated Mar. 12, 2009, 84 pages.

Service Letter (Rambus) for Reexam of U.S. Patent No. 7,330,952 dated Jun. 4, 2009. 1 page.

Service Letter for US Patent No. 7,287,119 dated May 18, 2009. 1 page.

Shiratake, S., et al., "A Pseudo Multi-Bank Dram with Categorized Access Sequence," Symposium on VLSI Circuits, Jun. 17-19, 1999, pp. 127-130, 4 pages.

SLDRAM Inc., SLD4M18DR400 4 MEG X 18 SLDRAM: 400 Mb/s/pin SLDRAM 4 M x 18.SLDRAM Pipelined, Eight Bank, 2.5 V Operation, Jul. 9, 1998, pp. 1-69, SLDRAM, Inc. San Jose, California. 69 pages.

Texas Instruments, Inc., "TMS626402, 2097 152-Word by 2-Bank Synchronous Dynamic.Random-Access Memory, " Feb. 1994, pp. 5-3-5-23. 12 pages.

Third Party Requester's Respondent Brief, dated Sep. 8, 2011, in re Inter Partes Reexamination of U.S. Patent No. 7,330,952 with Control No. 95/001,196, includes Evidence Appendix, Related Proceedings Appendix, and Certificate Regarding Noumber of Words. 20 pages.

U.S. Office Action with mail date Jul. 23, 2009, re Interview Summary for U.S. Appl. No. 09/009,370, filed Dec. 23, 2008, 57 pages.

U.S. Office Action with mail date of Nov. 14, 2009, re U.S. Appl. No. 95/001,189, filed May 18, 2009, re Inter Parte Reexamination for U.S. Patent No. 7,287,119, 36 pages.

U.S. Office Action with mail date of Nov. 14, 2009, re U.S. Appl. No. 90/010,365, filed Dec. 18, 2008, re Ex Parte Reexamination of U.S. patent 7,287,119, 36 pages.

U.S. Office Action with mailed Aug. 1, 2009, re Interview Summary for Control No. 90/010,365, filed Dec. 8, 2008, 57 pages.

U.S. Office Communication with mail date Aug. 12, 2009, re Order Granting Request for Inter Partes Reexam for U.S. Patent No. 7,330,953, Control No. 95/001,201, filed Jun. 23, 2009, 15 pages.

U.S. Office Communication with mail date Jul. 23, 2009, re Interview Summary for Control No. 90/009,371, filed Dec. 22, 2008, 57 pages.

Barth, Richard re U.S. Appl. No. 12/349,485, filed Jan. 6, 2009 re Response to Office Action of Sep. 8, 2009 dated Feb. 8, 2010, 10 pages.

Barth, Richard re U.S. Appl. No. 90/010,365, filed Dec. 18, 2008 re Office Action re Ex Parte Reexamination of U.S. Patent 7,287,119 mailed Nov. 14, 2009, 36 pages.

Barth, Richard re Control No. 90/001,205, filed Dec. 23, 2008 re Patet Owner's Response to First Office Action of Feb. 3, 2010 re Inter Partes Reexamination of U.S. Patent 7,360,050, dated Apr. 2, 2010, 24 pages.

Barth, Richard re Control No. 90/009;369 and 95/001,201, filed Dec. 23, 2008 and Jun. 23, 2009 re Patent Owner's Response to First Office Action of Feb. 3, 2010 in re Reexamination of U.S. Patent No. 7,330,953, dated Apr. 2, 2010, 37 pages.

Barth, Richard re Control No. 90/009,369, filed Dec. 23, 2008 re Final Office Action in Ex Parte Reexamination with mail date of Aug. 20, 2010, 13 pages.

Barth, Richard re Control No. 90/009,369, filed Dec. 13, 2008 re Non-Final Office Action re Ex Parte Reexamination of U.S. No. 7,330,952 mailed 8 pages.

Barth, Richard re Ccntrol No. 90/009,369, filed Dec. 23, 2008 re Office Coninninication re Order Granting Request for Ex Parte Reexamination of U.S. Patent No. 7330,953 mailed Mar. 6, 2009, 9 pages.

Barth, Richard re Control No. 90/009,369, filed Dec. 23, 2008 re Patent Owner's Response to First Office Action of Feb. 3. 2010 re Inter Partes Reexamination of U.S. Patent 7,330,953 dated Apr. 2, 2010, 38 pages.

Barth, Richard re Control No. 90/009,369, filed Dec. 23, 2008 re Patent: Owner's Reply to Final Office Action in Ex Parte Reexamination of U.S. Patent No. 7,330,953, dated Sep. 20, 2010, 42 pages.

Barth, Richard re Control No. 90/009,369, filed Dec. 23, 2008 re U.S. Non-Final Office Action in Ex Parte Reexamination of U.S. Patent 7,330,953 with mail date of Feb. 3, 2010, 48 pages.

Barth, Richard re Control No. 90/009,369, filed on Dec. 23, 2008 re Office Action re Interview Summary re: Ex Parte Reexamination for U.S. Patent No. 7,330,953 with mail date Jul. 23, 2009, 57 pages.

Barth, Richard re Control No. 90/009,370 and 95/001,205, filed Dec. 23, 20088 and Jan. 1, 2009 re Patent Owner's Response to First Office Action of Feb. 3, 2010 in re Reexamination of U.S. Patent No. 7,360,050, dated Apr. 2, 2010, 32 pages.

Barth, Richard re Control No. 90/009,370, filed Dec. 23, 2008 re Final Office Action in Ex Parte Reexamination with mail date of Aug. 20, 2010, 14 pages.

Barth, Richard re Control No. 90/009,370, filed Dec. 23, 2008 re Patent Owner's Reply to Final Office Action in Ex Parte in Ex Reexamination of U.S. Patent No. 7,360,050, dated Sep. 20, 2010, 41 pages.

Barth, Richard re Control No. 90/009,370, filed Dec. 23, 2008 re U.S. Office Action re Interview Summary for re Ex Parte Reexamination for U.S. Patent No. 7,360,050, with mail date Jul. 23, 2009, 57 pages.

Barth, Richard re Control No. 90/009,371, filed Dec. 22, 2008 re Patent Owner's Reply to Final Office Action in Ex Parte Reexamination of U.S. Patent No. 7,330,952, dated Sep. 9, 2010, 43 pages.

Barth, Richard re Control No. 90/009,371, filed Dec. 22, 20099 re Office Action re Ex Parte Reexamination of U.S. Patent 7,330,952 mailed Apr. 29, 2009, 10 pages.

Barth, Richard re Control No. 90/009,370 re Non-Final Office Action re Ex Parte Reexamination of U.S. Patent 7,330,952 mailed Apr. 10, 2009, 9 pages.

Barth, Richard re Control No. 90/009,379, filed Jul. 1, 2009 re Patent Owner's Response to First Office Action of Feb. 3, 2010 re Inter Partes Reexamination of U.S. Patent 7,360,050, dated Apr. 2, 2010, 33 pages.

Barth, Richard re Control No. 90/010,365, filed Dec. 18, 2008 re Final Office Action in Ex Parte Reexamination with mail dated of Aug. 9, 2010, 15 pages.

Barth, Richard re Control No. 90/010,365, filed Dec. 18, 2008 re Non-Final Office Action re Ex Parte Reexamination of U.S. Patent 7,287,119 mailed Apr. 29, 2009, 10 pages.

Barth, Richard re Control No. 90/010,365, filed Dec. 18, 2008 re Non-Final Office Action re Removal of Premature Office Communication re U.S. Patent No. 7,287,119 mailed Apr. 15, 2009, 3 pages.

Barth, Richard re Control No. 90/010,365, filed Dec. 18, 2008 re Notification of Prior or Concurrent Proceedings in Ex Parte Reexamination for U.S. Patent 7,287,119 dated Apr. 30, 2009, 5 pages.

Barth, Richard re Control No. 90,010,365, filed Dec. 18, 2008 re Patent Owner's Response to First Office Action of Nov. 14, 2009 in Reexam of U.S. Patent 7,287,119 submitted Feb. 16, 2010, 31 pages.

Barth, Richard re Control No. 90/010,365, filed Dec. 18, 2008 re Patent Owner's First Supplemental Reply to Office Action in ex Parte Reexamination of U.S. Patent 7,287,119 mailed on Aug. 25, 2008 35 pages.

Barth, Richard re Control No. 90/010,365, filed Dec. 18, 2008 re Patent Owner's Reply to Final Office Action in Ex Parte Reexamination of U.S. Patent No. 7,287,119, dated Sep. 9, 2010, 42 pages.

Barth, Richard re Control No. 90/010,365, filed Dec. 18, 2008 re U.S. Office Action re Interview Summary for in Ex Parte Reexamination for U.S. Patent No. 7,287,119 with mail date Aug. 1, 2009, 57 pages.

Barth, Richard re Control No. 95/001,189, filed May 18, 2009 re Office Action re Order Granting/Denying Request for Inter Partes Reexamination is Granted for U.S. Patent 7,287,119, mailed Aug. 3, 2009, 4 pages.

Barth, Richard re Control No. 95/001,189, filed Dec. 18, 2008 re Patent Owner's Response to First Office Action of Nov. 14, 2009 re in Reexam of U.S. Patent 7,287,119 submitted Feb. 16, 2010, 31 pages.

Barth, Richard re Control No. 95/001,189 filed May 18, 2009 re Office Action re in Inter Panes Reexamination with mail date of Aug. 17, 2010, 3 pages.

Barth, Richard re Control No. 95/001,189, filed May 18, 2009 re Patent Owner's Response to First Office Action of Aug. 9, 2010 in re reexam of U.S. Patent No. 7,287,319, dated Sep. 9, 2010, 33 pages.

Barth, Richard re Control No. 95/001,196, filed Jun. 4, 2009 re Office Action Communication to Third Party Requester in Inter Partes Reexamination of U.S, Patent No. 7,330,952 with mail date of Aug. 26, 2010, 3 pages.

Barth, Richard re Control No. 95/001,196, filed Jun. 4, 2009 re Patent Owner's Response to First Office Action of Aug. 9, 2010 in re reexamination of U.S. Patent No. 7,330,952, dated Sep. 9, 2010, 33 pages.

Barth, Richard re Control No. 95/001,201, filed Dec. 23, 2008 re Patent Owner's Response to First Office Action of Feb. 3, 2010 re inter Partes Reexamination of U.S. Patent 7,330,953 dated Apr. 2, 2010, 38 pages.

Barth, Richard re Control No. 95/001,201, flied Jun. 23, 2009 re Office Action in Inter Partes Reexamination with mail date of Aug. 29, 2010, 22 pages.

Barth, Richard re Control No. 95/001,201, filed Jun. 23, 2009 re Patent Owner's Response to First Office Action of Aug. 20,2010 in re Inter Partes Reexamination of U.S. Patent No, 7,330.953 dated Sep. 20, 2010, 37 pages.

Barth, Richard re Control No. 95/001,201, filed Jun. 23, 2009 re U.S. Non-Final Office Action re in Inter Partes Reexamination of U.S. Patent 7,330,953 with mail date of Feb. 3, 2010, 48 pages.

Barth, Richard re Control No. 95/001,205, filed Jul. 1, 2009 re Office Action in Inter Partes Reexamination with mail date of Aug. 20, 2010, 29 pages.

Barth, Richard re Control No. 95/001,205, filed Jul. 1, 2009 re Patent Owner's Response to First Office Action of Aug. 20, 2010, in re Inter Partes Reexamination of U.S. Patent Ne. 7,360,050, dated Sep. 20, 2010, 34 pages.

Barth, Richard re Control No. 95/001,205, filed Jul. 1, 2009 re U.S. Non-Final Office Action re Third party Requester in Inter Partes Reexamination of U.S. Patent 7,360,050 with mail date of Feb. 3, 2010, 55 pages.

Barth, Richard re Control Nos. 90/009,370 and 95/001,205, filed Dec. 23, 2008 re U.S. Non-Final Office Action re Third party Requester in Ex Parte Reexamination of U.S. Patent 7,360,050 with mail date of Feb. 3, 2010, 55 pages.

Barth, Richard re Control Nos. 90/009,371 and 95/001,196, filed Dec. 22, 2008 re Patent Owner's Response to First Office Action of Dec. 2, 2009 re in Reexamination of U.S. Patent No. 7,330,952, dated Mar. 1, 2010, 31 pages.
Barth, Richard re Control Nos. 90/010,363 and 95/001,189, filed Dec. 18, 2008 re Office Action re Action Closing Prosecution in Ex Parte Reexamination for U.S. Patent No. 7,287,119 with Mail date of Jun. 23, 2010, 33 pages.
Barth, Richard re Control Nos. 95/001,196 and 90/009,371, filed Jun. 4, 2009 re Non-Final Office Action to Third Party Requester in Enter Partes Reexamination with mail date of Jul. 10, 2010, 36 pages.
Barth, Richard re U.S. Appl. No. 12/349,485, filed Jan. 6, 2009 re Notice of Allowance and Fee(s) Due with mail date of May 11, 2010, 33 pages.
Barth, Richard, re Control No. 11/681,375, filed Mar. 2, 2007 re Request for Ex Parte Reexamination of U.S. Patent No. 7,360,060 filed on Dec. 19, 2008, 37 pages.
Barth, Richard, re Control No. 11/681,384, filed Mar. 2, 2007 re Request for fix Parte Reexamination for U.S. Appl. No. 11/681,384, filed Dec. 18, 2008, 34 pages.
Barth, Riebard, re Control No. 11/692,159, filed Mar. 27, 2007 re Request for Ex Parte Reexamination of U.S. Patent No. 7,330,952 filed Dec. 19, 2008, 41 pages.
Barth, Richard, re Control No. 11/692,162, filed Mar. 27, 2007 re Request for Ex Parte Reexamination of U.S. Patent No. 7,330,953 filed on Dec. 19, 2008, 34 pages.
Barth. Richard, re Control No. 90/009,370, filed Dec. 23, 2008 re Non-Final Office Action in Ex Parte Reexamination for U.S. Patent No. 7,360,050 mailed Apr. 10, 2009, 8 pages.
Barth, Richard, re Control No. 90/009,370, filed Dec. 23, 2008 re Non-Final- Office Action for U.S. Patent No. 7,360,050 mailed Apr. 15, 2009, 3 pages.
Barth, Richard, re Control No. 90/009,371, filed Dec. 22, 2008 re Patent Owner's First Suppiemertal Reply to Office Action re in ex-Parte Reexamination of U.S. Patent 7,330,952, mailed on Aug. 25, 2009, 36 pages.
Barth, Richard, U.S. Appl. No. 13/230,741 filed Sep. 12, 2011, Response dated Jan. 30, 2012 to Office Action of Nov. 9, 2011 includes Terminal Disclaimer, 9 pages.
Barth, Richard, U.S. Appl. No. 13/230,741, filed Sep. 12, 2011, re Office Action mailed Nov. 9, 2011, 8 pages
Barth, Richard, U.S. Appl. No. 95/001,189, filed May 18, 2009 re U.S. Office Action re Inter Parte Reexamination for U.S. Patent No. 7,287,119 mailed Nov. 19, 2009, 36 pages.
Barth, Richard, U.S. Appl. Nos. 95/001,196 and 90/009,371, filed Dec. 22, 2008 re Office Action re Inter Partes Reexamination Communication to Third Party Requester for Patent No. 7,330,952 mailed Feb. 2, 2009, 59 pages.
Comments by Third Party Requester dated Oct. 15, 2010, re Inter Panes Reexamination of U.S. Patent No. 7,330,953 for Control No. 95/001,201 includes Appendix A, 23 pages.
Comments by Third Party Requester dated Oct. 15, 2010 Inter Partes Reexamination of U.S. Patent No. 7,160,050 for Control No. 95/001,205, includes Appendix A, 24 pages.
Comments by Third-Party Requester dated Apr. 30, 2010 re Control No. 90/009,369 for Ex Parte Reexamination of U.S. Patent No. 7,330,953 includes EXhibit A, 29 pages.
Comments by Third Party Requester dated Apr. 30, 2010 re Control No. 95/001,201 re Inter Partes Reexamination for U.S. Patent No, 7,330,953, includes Exhibit A, 27 pages.
Comments by Third Party Requester dated Mar. 17, 2010 re Control No. 95/001,189 in Inter Partes Reexamination for U.S. Patent No. 7287,119 includes Exhibit A, 29 pages.
Comments by Third Party Requester dated Mar. 17, 2010 re Control No. 90/010,365 in Inter Partes Reexamination for U.S. Patent No. 7,287,119 includes Exhibit A, 29 pages.
Comments by Third Party Requester dated Mar. 31, 2010 re Control No. 95/001,196 re Inter Partes Reexamination for U.S. Patent No. 7,330,952 includes Exhibit A, 29 pages.
Comments by Third Party Requester dated Mar. 31, 2010 re Control No. 90/009,371 re Inter Partes Reexamination for U.S. Patent No. 7,330,952 includes Exhibit A, 29 pages.

Comments by Third Party Requester dated May 3, 2010 re Control Nos. 95/001,205 and 90/009,379 re Inter Partes Reexamination of U.S. Patent No. 7,360,050, includes Exhibit A, 27 pages.
Comments by Third Party Requester Pursuant to 37 C.F.R. 1.947, dated Oct. 8, 2010, In re Inter Partes Reexamination of U.S. Patent No. 7,287,119 with Control No. 95/001,189, 28 pages.
Diamond, Stephen L. "SyncLink: High-Speed DRAM for the Future", Micro Standards, IEEE Micro, IEEE computer Society, vol. 16, No. 6, Dec. 1996, p. 74-75, 4 pages.
Exhibit 10—Comments by Third Party Requester Pursuant to 37 .C.F.R. ss 1.95'1 ("NVIDIA's Second Continents") dated Feb. 18, 2011, per Respondent Brief of Third Party Requester in Inter Partes Reexamination of U.S. Patent No. 7,330,952 with Control No. 95/001,196 dated Sep. 8, 2011, 14 pages.
Exhibit 10—List of Exhibits, undated, re Declanttion of Robert J. Murphy dated Sep. 15, 2010, in re Inter Partes Reexamination of U.S. Patent No. 7,330,953 for Barth et al, with Control No. 95/001,201 and in re Inter Partes Reexamination of U.S. Patent No. 7,360,050, for Barth et al., with Control No. 95/001,205. 7 pages.
Exhibit 19: JEDEC 'Standard No. 21-C Release 4, electronic Industries Association (Nov. 1993), Exhibits to the Initial Expert report of Vivek Subramantan tiled Jun. 12, 2009, In the matter of "certain Semiconductor chips Having synchronous dynamic Random Access memory controllers and Products Containing Same," U.S. International Trade Commission, Investigation No. 337-TA-661 Filed Nov. 6, 2008, 170 pages.
Exhibit 2B—Claim Charts for Actual Reduction to Practice of Delayed Write inventions for Claims Under Reexamination, re Ex Parte Reexamination of U.S. Patent Nos. 7,330,953 and 7,360,050 Barth et al, dated Aug. 19, 2009; both filed Dec. 23, 2008, with Control Nos. 90/009,369 and 90/009,370, 36 pages.
Exhibit 4—Declaration of Craig E. Hampel Under 37 C.F.R. ss 1.131, dated Sep. 17, 2010, in re Inter Panes Reexamination of U.S. Parent No. 7,330,953 for Barth et al, with Control No. 95/001,201, and in re Inter Partes Reexamination of U.S. Patent No. 7,360,050, for Barth et al., with Control No. 95/001,205, 41 pages
Exhibit 4—Declaration of Craig E., Hampel Under 37 C.F.R. ss 1.31 dated Apr. 2, 2010, in re Inter Partes Reexamination of U.S. Patent No. 7,330,953 with Control No. 95/001,201 and Ex Parte Reexamination with Control No. 90/009,369, in re Inter Panes Reexamination of U.S. Patent No. 7,360,050 with control No. 95/001,205 and Ex Parte Reexamination with Control No. 90/009,370, 42 pages.
Exhibit 4: Declaration of Craig. E. Hampel Under 37 C.F.R.' ss 1.131 dated Sep. 8, 2010, in Inter Partes Reexamination of Control No. 95/001,189 and 95/001,196 re reexam of U.S. Patent 7,330,952, 41 pages.
Exhibit 5—U.S. Patent No. 5430,676 to Ware ("Ware"), Issued Jul. 4, 1995, re U.S. Patent No. 7,330,953, re Barth, Richard, Control No. 95/001,201, filed Jun. 23, 2009, re Third Party Requester's Respondent Brief dated Oct. 7, 2011, 27 pages.
Exhibit 5A—Conception prior to Jul. 10, 1997, undated, re Declaration of Craig E. Hampel dated Sep. 17, 2010, in re Inter Partes Reexamination of U.S. Patent No. 7,330,953 for Barth et al., with Control No. 95/001,201 and in re Inter Partes Reexamination of U.S. Patent No. 7,360,050 for Barth et al., with Control No. 95/001,205, 84 pages.
Exhibit 5A: Conception Prior to Jul. 10, 1997, undated, re Patent Owner's Response to First Office Action of Aug. 9, 2010 With Control No. 95/001,196 remain of U.S. Patent 7,330,952, 74 pages.
Exhibit 5B—Conception Prior to Jan. 2, 1997, undated, re Patent Owner's Response to First Office Action of Aug. 9, 2010 with Control No. 95/001,196 re: reexam of U.S. Patent 7,330,952, 92 pages.
Exhibit 6—Claim Charts for Actual Reduction to Practice, udated, re Declaration of Craig E. Hampel dated Sep. 17, 2010, In re Inter Partes Reexamination of U.S. Patent No. 7,330,953 for Barth et al., with Control No. 95/001,201, and In re Inter Partes Reexamination of U.S. Patent No. 7,360,050 for Barth et al., with Control No. 95/001,205, 134 pages.
Exhibit 6. Claim Charts for Actual Reduction to Practive, undated, re Patent Owner's Response to First Office Action of Aug. 9, 2010 with Control No. 95/001,196 re reexam of U.S. Patent 7,330,952, 123 pages.

Exhibit 7—Diligence Calendar Showing Barth II Activity, undated, re Declaration of Craig E. Hampel dated Sep. 17, 2010, In re Inter Partes Reexamination of U.S. Patent No. 7,330,953 for Barth et al., with Control No. 95/001,201 and In re Inter Partes Reexamination of U.S. Patent No. 7,360,050 for Barth et al., with Control No. 95/001,205, 22 pages.

Exhibit 8—Support for '050 Patent Claims in '770 Provisional Application, undated, re Declaration of Craig E. Hampel dated Sep. 17, 2010, In re Inter Partes Reexamination of U.S. Patent No. 7,330,953 for Barth et al., with Control No. 95/001,201, and In re Inter Partes Reexamination of U.S. Patent No. 7,360,050 for Barth et al., with Control No. 95/001,205, 16 pages.

Exhibit 8—Support for '119 Patent Claims front '770 Provisional Application, undated, re Patent Owner's Response to First Office Action of Aug. 9, 2010 with Control No. 95/001,196 re reexam of U.S. Patent 7,30,952, 16 pages.

Exhibit 8—Support for '953 Patent Claims in '770 Provisional Application, undated, re Declaration of Craig E. Hampel dated Sep. 17, 2010, In re Inter Partes Reexamination of U.S. Patent No. 7,330,953 for Barth et al., with Control No. 95/001,201, and In re Inter Partes Reexamination of U.S. Patent No. 7,360,050 for Barth et al., with Control No. 95/001,205, 21 pages.

Exhibit 8: Support for '119 Patent Claims from '770 Provisional Application, undated, re Patent Owner's Response to First Office Action of Aug. 9, 2010 with Control No. 95/001,189 re Reexamination of U.S. Patent No. 7,287,119, 16 pages.

Exhibit 9—Declaration of Robert J. Murphy Under 37 C.F.R. ss 1.132 dated Sep. 8, 2010 in Inter Partes Reexamination of Control Nos. 95/001,189 and 95/001,196, re Patent Owner's Response to First Office Action of Aug. 9, 2010 With Control No. 95/001,196 re reexam of U.S. Patent 7,330,952, 24 pages.

Exhibit 9—Declaration of Robert J. Murphy Under 37 C.F.R. ss 1.132, dated Sep. 15, 2010, in re Inter Partes Reexamination of U.S. Patent No. 7,330,953 for Barth et al., with. Control No. 95/001,201 and in re Enter Partes Reexamination of U.S. Patent No. 7,360,050 for Barth et el., with Control No. 95/001,205, 24 pages.

Exhibit 9—Declaration of Robert J. Murphy Under 37 C.F.R. ss 1.132, dated Mar. 26, 2010, In re Inter Partes Reexamination with Control No. 90/009,369, In re Inter Partes Reexamination of U.S. Patent No. 7,360,050 with Control No. 95/001,205 and Ex Parte Reexamination with Control No. 90/009,370, 22 pages.

Exhibit 9A—JEDEC Standard No. 79-2E, "DDR2 SDRAM Specification," JESD79-2E (Revision of JESD79-2D), Apr. 2008, re Declaration of Robert J. Murphy dated Sep. 15, 2010, In re Inter Partes Reexamination of U.S. Patent No. 7,330,953 for Barth et al., with Control No. 95/001,201 and In re Inter Partes Reexamination of U.S. Patent No. 7,360,050 for Barth et al., with Control No. 95/001,205, 126 pages.

Exhibit 9B—JEDEC Standard No. 79-3B, "DDR3 SDRAM Specification," JESD79-3B, (Revision of JESD79-3A, Sep. 2007), Apr. 2008 re Declaration of Robert J. Murphy dated Sep. 15, 2010, in re Inter Partes Reexamination of U.S. Patent No. 7330,953 for Barth et al., with Control No. 95/001,201 and in re Inter Partes Reexamination of U.S. Patent No. 7,360,050 for Barth et al., with.Control No. 95/001,205, 200 pages.

Exhibit 9C—Deposition of Robert J. Murphy, undated, re Declaration or Robert J. Murphy dated Sep. 15, 2010, In re Inter Partes Reexamination of U.S. Patent No. 7,300,9536 for Barth et al., with Control No. 95/001,201 and In re Inter Partes Reexamination of U.S. Patent No. 7,360,50 for Barth et al., with Control No. 95/001,205, 6 pages.

Exhibit A—RDRAM Technology Summary, submitted in Comments by Third Party Requester dated May 3, 2010 re Control Nos. 95/001,203 and 90/009,379 re Inter Panes Reexamination of U.S. Patent No. 7,360,050, 2 pages.

Exhibit A, RDRAM Technology Summary, submitted in Comments by Third Party Requester' dated Apr. 30, 2010 re Control Nos. 95/001,201 and 90/009,309 re Inter Partes Reexamination of U.S. Patent No. 7,330,953 2 pages.

Exhibit AB—Victor Lee E-mail dated Sep. 9, 1997, "Today's logic/veri/arch meeting minutes:" re Response dated Sep. 20, 2010 in re Inter Partes Reexamination of U.S. Patent No. 7,360,050 to Barth et al., with Control No. 95/001,205, 4 pages.

Exhibit AD—Office Action issued Jul. 3, 2008 for patent 6,182,184 in reexamination Ser. No. 95/000,183 re Inter Partes Reexamination for U.S. Patent 6,546,446, dated Nov. 11, 2008, 96 pages.

Exhibit AF—Office Action issued Aug. 25, 2008 for patent 6,697,295 in reexamination Ser. No. 95/001,013 re Inter Partes Reexamination for U.S. Patents 6,546,446 dated Nov. 11, 2008, 83 pages.

Exhibit AG—Office Action issued Aug. 25, 2008 for patent 6,038,195 in ex parte reexamination Ser. No. 90/010,082 re Inter Partes Reexamination for U.S. Patent 6,546,446 dated Nov. 11, 2008 72 pages.

Exhibit AJ—Hynix-II, Order Granting In Part and Denying in Part Rambus's Motion to Strike; Denying Motion of Summary Judgement No. 1 of Invalidity; and Striking Motion For Summary Judgement No. 2 of Invalidity cited in Request for Inter Partes Reexamination of U.S. Patent No. 6,260,097 issued Control No. 95/001,134 filed Jan. 9, 2009, 35 pages.

Exhibit BE—Table 2 (ALL Redacted) R253177 and R2531781, RE Ex Parte Reexamination of U.S Patent Nos. 7,330,953 and 7,360,050 Barth et al., dated Aug. 19, 2009, both filed Dec. 23, 2008, with Control Nos. 90/009,369 and 90/009,370, 3 pages.

Exhibit BF—Table 2 (All Redacted), R2534586, Re Ex Parte Reexamination of U.S. Patent Nos. 7,330,953 and 7,360,050 Barth et al., dated Aug. 19, 2009, both filed Dec. 23, 2008, with Control Nos. 90/009,369 and 90/009,370, 2 pages.

Exhibit BG—Memorandum to Rich Bart, from Paul Haughey, dated Sep. 16, 1997, R4441628-R4441630 (ALL Redacted), re Ex Parte Reexamination of U.S. Patent Nos. 7,330,953 and7,360,050 Barth et al., dated Aug. 19, 2009, both filed Dec. 23, 2008, with Control Nos. 90/009,369 and 90/009,370, 4 pages.

Exhibit BH—Table 1: Summary Table, R2531790-R2531791 (ALL Redacted), re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 3 pages.

Exhibit BJ—Rambus Confidential, "High Performance Memory Subsystems," Modified Oct. 1, 1997, R2532099-R2532112 (All Redacted), re Ex Parte Reexamination of U.S. Patent Nos. 7,330,953 and 7,360,050 Barth et al. dated Aug. 19, 2009, both filed Dec. 23, 2008, with Control Nos. 90/009,369 and 90/009,370, 15 pages.

Exhibit BK—Direct Claims Outline, Rambus Proprietary. (All Redacted,) R0464748, re Ex Parte Reexamination of U.S. Patent Nos. 7,130,953 and 7,360,050 Barth et al. dated Aug. 19, 2009, both filed Dec. 23, 2008, with Control Nos. 90/009,369 and 90/009,370, 4 pages.

Exhibit BL—Table 2, (All Redacted), R0465777, re Ex Parte Reexamination of U.S. Patent Nos. 7,330,953 and 7,360,050 Barth et al. dated Aug. 19, 2009, both filed Dec. 21, 2008, with Control Nos. 90/009,369 and 90/009,370, 2 pages.

Exhibit BR—Excerpts from Radical Source code file "rb2master.C," dated May 27, 1997, in Response to East Office Action dated Sep. 20, 2010, re Inter Partes Reexamination of U.S. Patent No. 7,330,953 to Bartn et al,. with Control No. 95/001,201 15 pages.

Exhibit BT—Excerpts from Radical output file "tile.out. save," dated Ma 27, 1997, in Response in First Office Action dated Sep. 20, 2010, re Inter Partes Reexamination of U.S. Patent No. 7,330,953 to Barth et al., with Control No. 95/001,201, 7 pages.

Exhibit BU—Greg Davis E-mail (date blacked out), "1T2 Strawman," in Response to First Office Action dated Sep. 20, 2010, re Inter Partes Reexamination of U.S. Patent No. 7.330.953 to Barth et al., with Control No. 95/001,201, 8 pages.

Exhibit BV—Rick Barth E-mail (date blacked out), "Flexible Protocol," in Response to First Office Action dated Sep. 20, 2010, re Inter Partes Reexamination of U.S. Patent No. 7,330,951 to Barth et al, with Control No. 95/001,201, 4 pages.

Exhibit C, Tab 2—U.S. Appl. No. 60/026,594, filed Sep. 20, 1996, incorporated by Gillingham re Request for Inter Partes Reexamination for US. Patent No. 7,330,952, 12 pages.

Exhibit C, Tab 3—U.S. Appl. No. 60/055,349, filed Aug. 11, 1997, incorporated by Gillingham re Request for Inter Partes Reexamination for U.S. Patent No. 7,330,952, 87 pages.

Exhibit C, Tab 4—U.S. Appl. No. 60/057,992, filed Aug. 27, 1997 (incorporated by reference in Gillingham) in Request for Inter Partes Examination Under 35 U.S.C. §§311-318 Re U.S Patent No. 7,364,050, Control No. 95/001,205, filed Jul. 1, 2009, 345 pages.

Exhibit C, Tab 4—U.S. Appl. No. 60/057,092, filed Aug. 27, 1997, incorporated by Gillingham re Request for Inter Partes Reexamination for U.S. Patent No. 7,330,952, 345 pages.
Exhibit CA—Greg Davis E-mail (date blacked out), "Strawman Protocol," re Patent Owner's Response dated Sep. 20, 2010. In re Partes Reexm of U.S. Patent No. 7,330,951 to Barth et al., with Control No. 95/001,201, 8 pages.
Exhibit CB—Greg Davis E-mail sent Jun. 11, 1991, "re: Write offset and min read domain," re Patent Owner's Response dated Sep. 20, 2010, in re Inter Panes Reexam of U.S. Patent No. 7,330,953 to Barth et al., with Control No. 95/001,201, 3 pages.
Exhibit CC—Rambus Direct Series Technical Description, version 0.3 1996, re Patent Owner's Response dated Sep. 20, 2010, in re Inter Partes Reexam of U.S. Patent No. 7,310,953 to Barth et al., with Control No. 95/001,201, 218 pages.
Exhibit CD—Fred Ware E-mail (date blacked out) "Write Buffer Analysis, "re Patent Owner's Response dated Sep. 20, 2010, in re inter Partes Reexam of U.S. Patent No. 7,310,933 to Barth et. al, with Control No. 95/001,201, 4 pages.
Exhibit CE—Greg Davis E-mail (date blacked out) "Re: Write Buffer Analysis," re Patent Owner's Response dated Sep. 20, 2010 In re Inter Partes Reexam of U.S. Patent No. 7,310,953 to Barth et al., with Control No. 95/001,201 3 pages.
Exhibit CF—Fred Ware E-mail (date blacked out) "Direct Protocol—Strawinan" re Patent Owner's Response dated Sep. 20, 2010, in re Inter Partes Reexam of U.S. Patent No. 7,330,953 to Barth et al., with Control No. 95/001,201, 8 pages.
Exhibit CG—Greg, Davis E-mail (date blacked out) "re Rainbus-Deux Strawman," re Patent Owner's Response dated Sep. 20, 2010 in re Inter Partes Reexam of U.S. Patent No. 7,330,953 to Barth et al., with Control No. 95/001,201, 5 pages.
Exhibit CH—David Roberts E-mail (date blacked out) . . . Partner Visits, re Patent Owner's Response dated Sep. 20, 2010, In re Inter Partes Reexam of U.S Patent No. 7,330,953 to Barth et, al., with Control No. 95/001,201, 3 pages.
Exhibit CI—Laura Fleming E-mail (dale blacked out) "Intel Update," re Patent Owner's Response dated Sep. 20, 2010, in re Inter Partes Reexam of U.S. Patent No. 7,330,953 to Barth et al., with Control No. 95/001,201, 2 pages.
Exhibit CJ—Don Stark E-mail dated Jan. 3, 1997, "Plotting," re Patent Owner's Response dated Sep. 20, 2010 in re Inter Panes Reexarn of U.S. Patent No. 7,330,953, to Barth et al., with Control No. 95/001,201, 2 pages.
Exhibit CK—Greg; Davis E-mail dated Jan. 8, 1997, "IT3 Strawman," re Patent Owner's Response dated Sep. 20, 2010, in re Inter Partes Reexam of U.S. Patent No. 7,330,953 to Barth et al., with Control No. 95/001,201, 10 pages.
Exhibit CI—Greg Davis E-mail dated Jan. 10, 1997, . . . Intel. com:pgp(txt), re Patent Owner's Response dated Sep. 20, 2010: In re Partes Reexam of U.S. Patent No. 7,330,953 to Barth et al., with Control No. 95/001,201, 4 pages.
Exhibit CM—Handwritten Notes dated Dec. 19, 1996, re Patent Owner's Response dated Sep. 20, 2010, in re Inter Partes Reexam of U.S. Patent No. 7,330,953 to Barth et al., with Control No. 95/001,201, 24 pages.
Exhibit CN—Rick Barth E-mail dated Jan. 26, 1.997, "Protocol Refinement," re Patent Owner's Response dated Sep. 20. 2010, In re Inter Partes Reexam of U.S. Patent No. 7,330,953 to Barth et al., with Control No. 95/001,201, 7 pages.
Exhibit CO—Julie Cates E-mail dated Feb. 4, 1997. "Recap . . . Meeting Feb 24, 1997," re Patent Owner's Response dated Sep. 20,2010, In re Partes Reexam of U.S. Patent No. 7,330,953 to Barth et al., with Control No. 95/001 201 3 pages.
Exhibit CP—Greg: Davis E-mail dated Feb. 20, 1997, "Direct Protocol Summary" re Patent Owner's Response dated Sep. 20, 2010, in re Inter Partes Reexam of U.S. Patent No. 7,330,953 to Barth et al., with Control No. 95/001,201, 8 pages.
Exhibit CP—Greg Davis Entail dated Feb. 20, 1997, "Direct Protocol Summary," Patent Owner's Response to First Office Action of Aug. 9, 2010 with Control No. 95/001,196 re reexam of US. Patent 7,330,952, 8 pages.
Exhibit CQ—Greg Davis E-mail dated Feb. 21, 1997, "Updated Direct-Summary.txt,"re Patent Owner's Response dated Sep. 20, 2010, in re Inter Partes Reexam of U.S. Patent No. 7,330,953 to Barth et al. with Control No. 95/001,201, 15 pages.
Exhibit CR—Greg Davis E-mail dated Mar. 12, 1997, "Direct-Summary.txt Revision 2,1" re Patent Owner's Response dated Sep. 20, 2010, in re Inter Parts Reexarn of U.S. Patent No, 7,330,953, to Barth et al., with Control No, 95/001,201, 12 pages.
Exhibit CS—Craig Hampel E-mail dated Mar. 21, 1997, "re: Direct-Summary.txt Revision 2..1," re Patent Owner's Response dated Sep. 20, 2010, In re Inter Partes Reexam of U.S. Patent No. 7,330,953 to Barth et al., with Control No, 95/001,201, 2 pages.
Exhibit CT—Rick. Barth E-mail dated Mar. 13, 1997, "Writes," RMAIL Emacs Buffer, re Patern Owner's Response dated Sep. 20, 2010, in re Inter Prates Reexarn of U.S. Patent No. 7,330,953 to Barth at al., with Control No. 95/001,201, 2 pages.
Exhibit CU—Greg Davis E-mail dated Mar. 3, 1997, "(Stark:re: Direct-Summary.txt Revision 2.1)," RMAIL Emacs Buffer, re Patent Owner's Response dated Sep. 20, 2010. In re Inter Partes Reexam of 'U.S. Patent No. 7,330,953 to Barth at al., with Control No. 95/001,201, 2 pages.
Exhibit CV—Rick Barth E-mail dated Mar. 15, 1997, "Various Topics," RMAIL Emacs Buffer, re Patent Owner's Response dated Sep. 20,2010, in re Inter Partes Reexam of U.S. Patent No. 7,330,953 to Barth et al., with Control No. 95/001,201, 2 pages.
Exhibit CW—Craig Hampel E-mail dated Mar. 17, 1997, "My Observations About Transmit/Retire Based Writes," Rmail Emacs Butler, re Patent Owner's Response dated Sep. 20, 2010, In re Inter Partes Reexam of U.S. Patent No. 7,330,953 to Barth et al., with Control No. 95/001,201, 2,pages.
Exhibit CX—Rick Barth Email dated Mar. 18, 1991, re: Write vs. Transport/Retire, RMAIL Emacs Buffer, re Patent Owner's Response dated Sep. 20, 2010, in re Partes Reexarn of U.S. Patent No. 7,330,953 to Barth et al., with Control No. 95/001,201, 3 pages.
Exhibit CY—Craig Hampel Email dated Mar. 18, 1997, Write vs. Transport/Retire, RMAIL Emacs Buffer, re Patent Owner's Response dated Sep. 20, 2010, in re Inter Partes Reexain of U.S. Patent No, 7,330.953, to Barth at al, with Control No. 95/001,201 2 pages.
Exhibit CZ—Craig Hampel Email dated Mar. 18, 1997, Write vs. Transport/Retire, RMAIL Emacs Buffer, re Patent Owner's Response dated Sep. 20, 2010. In re Inter Partes Reexam of U.S. Patern No. 7 330.953, to Barth et al., with Control No. 95/001,201 2 pages.
Exhibit D—Greg Davis E-mail (send date blacked out), "IT3 Strawman," re Ex Parte Reexamination of U.S. Patent Nos, 7,330,953 and 7,360,050 Barth at al., dated Aug. 19, 2009, both filed Dec. 23, 2008, with Control Nos. 90/009,369 and 90/009,370 10 pages.
Exhibit DB—Greg Davis E-mail dated Mar. 24, 1997, Intel.com, re Patent Owner's Response dated Sep. 20. 2010, in re Inter Paten Reexam. of U.S. Patent No. 7,330,953 to Barth et al., with Control No. 95/001,201, 2 pages.
Exhibit DC—Craig Hempel E-mail dated Mar. 25, 1997, "intel.com. pgp(txt)," re Patent Owner's Response dated Sep. 20, 2010, in re Inter Partes Reexam of U.S. Patent No, 7,330,953 to Barth at al., with Control No. 95/001,201, 3 pages.
Exhibit DD—Craig flampel E-mail dated Mar. 27, 1997; "Feedback on Transport and Retire Protocol" RMAIL Emacs Buffer, re Patent Owner's Response dated Sep. 20, 2010, In re Inter Partes Reexam of U.S. Patent No. 7,330,953 to Barth et at, with Control No. 95/001,201, 2 pages.
Exhibit DE—Greg Davis E-mail dated Mar. 29, 1997, "Direct-Stimmaxt, Revision 2,2," re Patent Owner's Response dated Sep. 20, 2010, in re Inter Partes Reexam of U.S. Patent No. 7,330,953 to Barth et al., with Control No, 95/001,201, 12 pages.
Exhibit DF—David Roberts E-mal dated Mar. 31, 1997, "Group Status Mar. 31, 1997," re Patent Owner's Response dated Sep. 20, 2010, In re Partes Reexam of U.S. Patent No. 7,330,953 to Barth et al., with Control No. 95/001,201 6 pages.
Exhibit DG—Julie Cates E-mail dated Apr. I, 1997, "Reasonable Meetintz with . . . ," re Patent Owner's Response dated Sep. 20, 2010, In re Inter Partes Reexam of U.S. Patent No. 7,330,953 to Barth et al., with Control No. 95/001,201, 2 pages.
Exhibit DH—Greg Davis E-mail dated Apr. 3, 1997, "Additional Retire in Secondary Control Packet," re Patent Owner's Response dated Sep. 20, 2010, in re Inter Panes Reexam of U.S. Patent No. 7,330,953 to Barth et al., with Control No. 95/001,201, 6 pages.

Exhibit DI—Rick Barth E-mail dated Apr. 15, 1997, "IR vs. TR," re Patent Owner's Response dated Sep. 20, 2010 in re Inter Partes Reexain of U.S. Patent No. 7,330,953 to Barth et al., with Control No. 95/001.201, 8 pages.

Exhibit DJ—Rick Barth E-mail dated Apr. 15, 1997, "IR vs. TR Analysis Plan," reTPaient Owner's Response dated Sep. 20, 2010, in re Inter Partes Reexam of U.S. Patent No. 7,330,953 to Barth et al., with Control No, 95/001,201, 3 pages.

Exhibit DK—Rick Barth E-mail dated Apr. 20, 1997, "IR vs. TR Decision," re Patent Owner's Response dated Sep. 20, 2010, in re Inter Partes Reexam of U.S. Patent No. 7,330,953 to Barth et al., with Control No. 95/001,201, 2 pages.

Exhibit DL—Rick Barth E-mail dated Apr. 30, 1997. "Direct Issues Database," re Patent Owner's Response dated Sep. 20, 2010, in re Inter Partes Reexam of U.S. Patent No. 7,330,953 to Barth et al., with Control No. 95/001,201, 5 pages.

Exhibit DM—Greg Davis E-mail dated Apr. 30, 1997, "Direct-Stininiaty.txt, Revision 2,4," re Patent Owner's Response dated Sep. 20, 2010, In re Inter Partes Reexam of U.S. Patent No. 7,330,953 to Barth et an, with Control No. 95/001,201, 12 pages.

Exhibit DN—Greg Davis E-mail dated Apr. 30, 1997, "Direct-Suramary.txt, Revision 2.5," re Patent Owner's Response dated Sep. 20, 2010, in re Inter Partes Reexam of U.S. Patent No. 7,330,953 to Barht et al., With Control No. 95/001,291, 13 pages.

Exhibit DO—Craig Hampel E-mail dated May 2, 1997, "Intel/Protocol Meeting Today," to Patent Owner's Response dated Sep. 20, 2010, in re Inter Panes Reexain of U.S. Patent No. 7,33-0,953 to Barth et al., with Control No. 95/001,201, 2 pages.

Exhibit DP—r2.arch/Tsern E-mail dated May 6, 1997. "Intel Protocol Meeting Notes, May 2, 1997," re Patent Owner's Response to Barth et al., with Control No. 95/001,201, 3 pages.

Exhibit DQ—David Roberts E-mail dated May 12, 1997, "Group Stattis May 12, 1997," re Patent Owner's Response dated Sep. 20, 2010, in re Inter Partes Reexatn of U.S. Patent No. 7,330,953 to Barth et al., with Control No. 95/001,201, 6 pages.

Exhibit DR—Circuit Releases dated May 2, 1997 to Jul. 3, 1997, Ranibus Confidential, re Patent Owner's Response dated Sep. 20, 2010., In re Inter Partes Reexam of U.S. Patent No, 7,330,953 to Barth et al., with Control No, 95/001,201, 12 pages.

Exhibit DS—Laura Fleming E-mail dated May 15, 1997, "Vterin cord call," to Patent Owner's Response dated Sep. 20, 2010, in re Inter Panes Reexam of U.S. Patent No. 7,330,953 to Barth et al., with Control No 95/001,201, 2 pages.

Exhibit DT—Greg Davis E-mail dated May 19, 1997, "Direct-Surnmary:txt, Revision 2,6," re Patent Owner's Response dated Sep. 20, 2010, in re Inter Partes Reexam of U.S. Patent No. 7,330,953 Barth et al., with Control No, 95/001,201, 13 pages.

Exhibit DU—Rich Barth E-mail dated May 20, 1997, "Issues Update," re Patent Owner's Response dated Sep. 20, 2010. In re Inter Partes Reexarn of U.S. Patent No. 7,330,953 to Barth et al., with Control No. 95/001,201, 6 pages.

Exhibit DV—Laura Fleming E-mail dated May 23, 1997, "Vterm Update," re Patent Owner's Response dated Sep. 20, 2010 in re Inter Partes Reexam of U.S. Patent No, 7,330,953, to Barth et al., with Control No. 95/001,201, 2 pages.

Exhibit DW—Laura Fleming. E-mail dated May 23, 1997, "Vterm Update," re Patent Owner's Response dated Sep. 20, 2010, in re Inter Partes Reexam of U.S. Patent No. 7,330,953 to Barth et al., with Control No. 93/001,201, 2 pages.

Exhibit DX—Craig Hampel E-mail dated May 28, 1997, "Binning and the Registry for rev 2.8," re Patent Owner's Response dated Sep. 20, 2010, in re Inter Partes Reexam of U.S. Patent No. 7,330,953 to Barth et al., with Control No. 95/001,201, 4 pages.

Exhibit DY—Greg Davis E-mail dated Jun. 5, 1997, "Direct-Summary.txt, Revision 2.9," direct.protocol.summary, re Patent Owner's Response dated Sep. 20, 2010, In re Inter Partes Reexam of U.S. Patent No. 7,130,953 to Barth et al., with Control No. 95/001,201 2 pages.

Exhibit DZ—Steven Woo E-mail dated'Jun. 9, 1997, " Implicit Retire Mechanism—Some implications for the Memory controller" to Patent Owner's Response dated Sep. 20, 2010, in re Inter Partes Reexam of U.S. Patent No. 7,330,953, to Barth et al., with Control No. 95/001,201, 3 pages.

Exhibit EA—Craig Hampel E-mail dated Jun. 9, 1997, "Re: Implicit Retire Mechanism—some implications for the memory controller," re Patent Owner's Response dated Sep. 20, 2019, in re Inter Partes Reexam of U.S. Patent No. 7,330,953 to Barth et al., with Control No. 95/001,201, 2 pages.

Exhibit EC—Greg Davis E-mail dated Jun. 17, 1997, "Shift in Refpt location, 1 cycle later," re Patent Owner's Response dated Sep. 20, 2010, in re Inter Partes Reexarn of U.S. Patent No. 7,310,953 to Barth et al., with Control No. 95/001,201, 2 pages.

Exhibit ED—David Roberts E-mail dated Jun. 23, 1997, "Group Status (Updated) Jun. 23, 1997," re Patent Owner's Response dated Sep. 20, 2010, in re Inter Partes Reexam of U.S. Patent No. 7,330,953 to Barth et al., with Control No. 95/001,201, 1 pages.

Exhibit EE—Greg Davis E-mail dated Jun. 30, 1997, "direct-summary.txt, Revision 2.11," re Patent Owner's Response dated Sep. 20, 2010, in re Inter Parte Reexarn of U.S. Patent No. 7,330,953 to Barth et al., with Control No. 95/001,201, 8 pages.

Exhibit EF—David Roberts E-mail dated Jul. 8, 1997, "MTD 64MD Project Review: Jul. 1997 (resend)," re Patent Owner's Response dated Sep. 20, 2010, in re Inter Partes Reexam, of U.S. Patent No. 7,330,953 to Barth et at With Control No. 95/001,201, 5 pages.

Exhibit Eg—Rick Barth E-mail dated Jul. 9, 1997, "July Technology Group Project Review," re Patent Owner's Response dated Sep. 20,2010, In re Inter Partes Reexam of U.S. Patent No. 7,330,953 to Barth et al. with Control No. 95/001,201, 3 pages.

Exhibit EH—Craig Hampel E-mail dated Jul. 16, 1997, "Latency calculation from . . . ," re Patent Owner's Response dated Sep. 20, 2010, in re Inter Partes Reexam of U.S. Patent No. 7,330,953 to Barth et al. with Control No. 95/001,201, 2 pages.

Exhibit EI—John Dillon E-mail dated Aug. 5, 1997, "Update 86," re Patent Owner'S Response dated Sep. 20, 2010, in re Inter Partes Reexarn of U.S. Patent No. 7,330,953 to Barth et al., with Control No, 95/001,201, 3 pages.

Exhibit EJ—David Roberts E-mail dated Aug. 6. 1997, "MTD 64MD Project Review: Aug. 1997," re Patent Owner's Response dated Sep. 20, 2010, in re Inter Partes Reexam of U.S. Patent No. 7,330,953 to Barth et al., with Control No. 95/001,201, 5 pages.

Exhibit EK—Srinivas Nimmagadda E-mail dated Jan. 2, 1997, "Direct Connector Electrical Analysis Status/Result" re Patent Owner's Response dated Sep. 20, 2010. In re Inter Partes Reexam of U.S. Patent No. 7,330,953 to Barth et al., with Control No. 95/001,201, 4 pages.

Exhibit EL—Jim Hudson E-mail dated Jan. 17, 1997, "Meeting today at 1:30," re Patent Owner's . Response dated Sep. 20, 2010, in re Inter Partes Reexam of U.S. Patent No. 7,330,953 to Barth et al., with Control No. 93/001.201, 2 pages.

Exhibit EM—Ely Tsern E-mail dated Jan. 17, 1997, "RAC-D Interface (updated)," re Patent Owner's Response dated Sep. 20. 2010. In re Inter Partes Reexam of U.S. Patent No, 7,330,953 to Barth et al., with Control No. 95/001,201, 3 pages.

Exhibit EN—Don Perino E-mail dated Feb. 19, 1997;". . . package questions and answers," re Patent Owner's Response dated Sep. 20, 2010, in re Inter Partes Reexam of U.S. Patent No. 7,330,953 to Barth et al., with Control No. 95/001,201, 3 pages.

Exhibit EO—David Nguyen Ekkmail dated Feb. 19, 1997; "Re: pinout stuff redux," re Patent Owner's Response dated Sep. 20, 2010, In re Inter Partes Reexam of U.S. Patent of U.S. Patent No. 7,330,933 to Barth et al., with Control No. 93/001,201, 3 pages.

Exhibit EP—Craig Hampel E-mail dated Feb. 19, 1997, re: pinout stuff redux, re Patent Owner's Response dated Sep. 20. 2010, In re Inter Partes Reexarn of U.S. Patent No. 7,330,953 to Barth et al., with Control No. 95/001,201, 2 pages.

Exhibit EQ—Ely Tsern E-mail dated Feb. 20, 1997, "Direct interface pwr," re Patent Owner's Response dated Sep. 20, 2010, In re Partes Reexam of U.S. Patent No. 7,330,953 to Barth et al., with Control No. 95/001,201, 2 pages.

Exhibit ER—Laura Fleming E-mail dated Feb. 24, 1997, "Intel PCD meeting 2/24," Patent Owner's Response dated Sep. 20, 2010, in re Inter Partes Reexam of U.S. Patent No. 7,330,953 to Barth et al., with Control No. 95/001,201, 3 pages.

Exhibit ES—Alfredo Moncayo E-mail dated Mar. 7, 1997, "Re: Current control accuracy," re Patent Owner's Response dated Sep. 20, 2010, in re Inter Partes Reexam of U.S. Patent No. 7,130,953 to Barth et al., with Control No. 95/001,201, 3 pages.

Exhibit ET—Geoff Tate E-mail dated Mar. 28, 1997, "re: Our 1st milestone:" re Patent Owner's Response dated Sep. 20, .2010, in re Inter Partes Reexam of U.S. Patent No. 7,330,953 to Barth et al., with Control No. 95/001,201, 2 pages.

Exhibit EU—Laura Fleming E-mail dated Apr. 1, 1997, "Power foil," re Patent Owner's Response dated Sep. 20, 2010, in re Inter Partes Reexam of U.S. Patent No. 7,330,953 to Barth et al., with Control No. 95/001,210, 3 pages.

Exhibit EV—Allen Roberts E-mail dated Apr. 10, 1997, "Feedback from . . . ," (Redacted), re Patent Owner's Response dated Sep. 20, 2010, In re Inter Partes Reexam of U.S. Patent No. 7,330,953 to Barth et al., with Control No. 95/001,201, 2 pages.

Exhibit EW—David Nguyen E-mail dated Apr. 29, 1997, "The latest: mirocard pinout," re Patent Owner's Response dated Sep. 20,2010, in re Inter Partes Reexam of U.S. Patent No. 7,330,953 to Barth et al., with Control No. 95/001,201, 6 pages.

Exhibit EX—Alfredo Moncayo E-mail dated May 1, 1997, "Today's agenda " re Patent Owner's Response dated Sep. 20, 2010, in re Inter Partes Reexam of U.S. Patent No. 7,330,953 to Barth et al., with Control No, 95/001,201, 2 pages.

Exhibit EY—Kevin Dodnelly E-mail dated May 23, 1997, "re: clock source specs," re Patent Owner's Response dated Sep. 20, 2010, In re Inter Partes Reexam of U.S. Patent No. 7,330,953 to Barth at al., with Control No. 95/001,201,3 pages.

Exhibit EZ—David Roberts E-mail dated May 28, 1997, "re: Speed bin vs. Core I/F spec," re Patent Owner's Response dated Sep. 20, 2010, in re Inter Partes Reexam of U.S. Patent No. 7,330,953 to Barth et al., with Control No. 95/001,201, 2 pages.

Exhibit FA—Victor Lee E-mail dated May 28, 1997, "read access time budget," re Patent Owner's Response dated Sep. 20, 2010, In re Inter Partes Reexam of U.S. Patent No. 7,330,953 to Barth at al., with Control No. 93/001,201, 2 pages.

Exhibit FB—Nader Cianlini E-mail dated Jun. 4, 1997, "Microcard Packaging Spec," re Patent Owners Response dated Sep. 20, 2010, in re Inter Panes Reexam of U.S. Patent No. 7,330,953 to Barth at al., with Control No. 95/001,201, 2 pages.

Exhibit FC—Nader Ciatnini E-mail dated Jun. 12 1997, "Packaging Vendors," re Patent Owner's Response dated Sep. 20, 2010, In re Inter Partes Reexam of U.S. Patent No. 7,330,953, to Barth et al., with Control No. 95/001,201, 2 pages.

Exhibit FD—Don Perine E-mail dated Jun. 16, 1997. "Thermal status," re Patent Owner's Response dated Sep. 20, 2010, in re Inter Partes Reexam of U.S. Patent No. 7,330,953 to Barth et al., with Control No. 95/001,2201, 3 pages.

Exhibit FE—Brad May E-mail dated Jun. 16, 1997, "re TDO.VCO range," re Patent Owner's Response dated Sep. 20, 2010, in re Inter Partes Reexam of U.S. Patent No. 7,311,953 to Barth at al., with Control No. 95/001,201, 2 pages.

Exhibit FE—John Dillon E-mail dated Jun. 25, 1997, "Physical Design meeting today at 1:30," re Patent Owner's Response dated Sep. 20, 2010, in re Inter Partes Reexam of U.S. Patent No. 7,330,953 to Barth et al., with Control No. 95/001,201, 2 pages.

Exhibit FG—Alfredo Moncayo E-mail dated Jun. 25, 1997, "Re: reminder," re Patent Owner's Response dated Sep. 20, 2010, 'In re Inter Partes Reexam of U.S. Patent No. 7,330,953, to Barth et al., with Control No. 95/001,201, 2 pages.

Exhibit FH—Kevin Donnelly E-mail dated Jul. 6, 1997, "Clock architecture," re Patent Owner's Response dated Sep. 20, 2010, in re Inter Partes Reexam of U.S. Patent No. 7,330,953 to Barth et al., with Control No. 95/001,201, 3 pages.

Exhibit FI—Craig Hampel E-mail dated Jul. 3. 1997, "Drowsy mode access pipeline," re Patent Owner's Response dated Sep. 20, 2010, in re Inter Partes Reexam of U.S. Patent No. 7,330,953 to Barth et al., with Control No. 95/001,201, 3 pages.

Exhibit EJ—Jim Clasbarro E-mail dated Jul. 7, 1997, "Re:. DIO40. SInSOutExchange," re Patent Owner's Response dated Sep. 20, 2010, In re Inter Partes Reexam of U.S. Patent No. 7,330,953 to Barth et al., with Control No. 95/001,201, 2 pages.

Exhibit FK—John Dillon E-mail dated Jul. 10 1997, "Rambus/Intel phone meeting," re Patent Owner's Response dated Sep. 20, 2010, in re Inter Partes Reexam of U.S. Patent No. 7,130,953 to Barth et al., with Control No, 95/001,201, 3 page.

Exhibit FL—Alfredo Moncayo E-mail dated Jul. 11, 1997, "Technology Project Status (Jul. 1997)," re Patent Owner's Response dated Sep. 20, 2010; in re Inter Partes Reexam of U.S. Patent No. 7,330,953 to Barth et al., with Control No. 95/001,201, 7 pages.

Exhibit FM—John Dillon E-mail dated Jul. 14, 1997, "[tsern@rambus.com: Re: power estimate at 600 MHz]," re Patent Owner's Response dated Sep. 20, 2010, in re Inter Partes Reexam of U.S. Patent No. 7,330,953 to Barth et al., with Control No. 95/001,201, 2 pages.

Exhibit FN—Ely Tsern E-mail dated Jul. 14, 1997, "Re: [tsern@rambus.com: Re: power estimate at 600 MHz]," re Patent Owner's Response dated Sep. 20, 2010, in re Inter Partes Reexam of U.S. Patent No. 7,330,953 to Barth et al., with Control No. 95/001,201, 2 pages.

Exhibit FO—Alfredo Isvioneayo E-mail dated Jul. 16, 1997, "Re: current control calibrate/current control calibrate and Sample," re Patent Owner's Response dated Sep. 20, 2010, in re Inter Partes Reexam of (U.S. Patent No. 7,330,953 to Barth et al., with Control No. 95/001,201, 3 pages.

Exhibit FP—Kevin Donnelly E-mail dated Jul. 17, 1997, "Rac summar . . . " Response dated Sep. 20, 2010: in re Inter Partes Reexam of U.S. Patent No. 7,330,953 to Barth et al., with Control No. 95/001,201, 3 pages.

Exhibit EQ—Fred Ware E-mail dated Jul. 17, 1997, "Re: RAC meeting summary," re Patent Owner's Response dated Sep. 20, 2010, in re Inter Partes Reexam of U.S. Patent No. 7,330,953 to Barth et al., with Control No. 95/001,201, 4 pages.

Exhibit FR—Kevin Donnelly E-mail dated Jul. 21, 1997, "Preliminary Direct Clods Spec 0.3," re Patent Owners Response dated Sep. 20, 2010, in re Inter Partes Reexam. of U.S. Patent No. 7,330,953 to Barth et al., with Control No. 95/001,201, 2 pages.

Exhibit FS—Ely Tsera E-mail dated Jul. 23, 1997, "Updated Module Power Comparison," re Patent Owner's Response dated Sep. 20, 2010, in re Inter Partes Reexam of U.S. Patent No. 7,330,953 to Barth et al. with Control No. 95/001,201, 2 pages.

Exhibit FT—Greg Davis E-mail dated Jul. 23, 1997, "Re: D1005 Registers," re Patent Owner's Response dated Sep. 20, 2010, in re Inter Partes Reexam of U.S. Patent No. 7,330,953 to Barth et al., with Control No. 95/001,201, 3 pages.

Exhibit FU—David Nguyen E-mail dated Jul. 23, 1997, "Status of RIMM W/ SHP devices," to Patent Owner's Response dated Sep. 20, 2010, In re Inter Partes Reexam of U.S. Patent No. 7,330,953 to Barth et al., with Control No. 95/001,201, 2 pages.

Exhibit FV—Joint Dillon E-mail dated Jul. 23, 1997, "Rambus / Intel Update," re Patent Owner's Response dated Sep. 20,2010, in re Inter Partes Reexam of U.S. Patent No. 7,330,953 to Barth et al., with Control No. 95/001,201, 4 pages.

Exhibit FW—Ely Tsern E-mail dated Jul. 24, 1997, "Re: Updated Module Power Comparison," re Patent Owner's Response dated Sep. 20, 2010, in re Inter Partes Reexam of U.S. Patent No. 7,310,953 to Barth et al., with Control No. 95/001,201, 3 pages.

Exhibit FX—John Dillon E-mail dated Aug. 1, 1997, "Update Aug. 1," re Patent Owner's Response dated Sep. 20, 2010, in re Inter Partes Reexam of U.S. Patent No. 7,130,953 to Barth et al., with Control No. 951001 201, 3 pages.

Exhibit FY—John Dillon E-mail dated Aug. 4, 1997, "Update Aug. 4," re Patent Owner's Response dated Sep. 20, 2010, in re Inter Partes Reexam of U.S. Patent No. 7,310,95:3 to Barth et al., with Control No. 95/001,201, 2 pages.

Exhibit FZ—Handwritten Notes from Dec. 6, 1996 titled, "64 Mb Rambus 2 RDRAM," Re Patent Owner's Response dated Sep. 20, 2010, in re Inter Partes Reexam of U.S. Patent No. 7,330,953 to Barth et al., with Control No. 95/001,201, 87 pages.

Exhibit G—"High Speed DRAMs with Innovative Architectures" by Shigeo Ohahima et al. ("Ohshima"), Aug. 1994 re Request for Inter Partes Reexamination elated Jul. 1, 2009 with Control No. 95/001,205 for 'U.S. Patent 7,360,050, 14 pages.

Exhibit G—U.S. Patent No. 7,287,109 filed on Oct. 15, 2004 to Barth et al. (Barth 109) re Request for Inter Partes Reexmination for U.S. Patent No. 7,287,119, 47 pages.
Exhibit GA—Handwritten Notes dated Dec. 19, 1996, "Intel," re Patent Owner's Response dated Sep. 20, 2010, In re Inter Partes Reexam of U.S. Patent No. 7,330,953 to Barth et al., with Control No. 95/001,201, 73 pages.
Exhibit GC—Steven Woo E-mail dated May 5, 1997, "Radical 3.0," re Patent Owner's Response dated Sep. 20, 2010, In re Inter Partes Reexam of U.S. Patent No. 7,330,953 to Barth et al., with Control No. 95/001,201, 2 pages.
Exhibit GD—Samir Patel E-mail dated Jun. 6, 1997, "Re: Models Version," re Patent Owner's. Response dated Sep. 20, 2010, in re Inter Partes Reexam of U.S. Patent No. 7,330,953 to Barth et al., with Control No. 95/001,201, 3 pages.
Exhibit GE—Laura Fleming E-mail dated Jun. 12, 1997, "MikeL's CSP deck." re Patent Owner's Response dated Sep. 20, 2010, In re Inter Partes Reexam of U.S. Patent No. 7,330,953 to Barth at al., with Control No. 95/001,201, 13 pages.
Exhibit GF—Steven Woo E-mail dated Jun. 24, 1997, "Radical," re Patent Owner's Response dated Sep. 20, 2010, in re Inter Panes Reexam of U.S. Patent No. 7,130,953 to Barth et al., with Control No. 95/001,201, 2 pages.
Exhibit GG—Lai, Larry, "Rambus Direct Timing Analysis," Jun. 26, 1997, Rambus Confidential, re Patent Owner's Response dated Sep. 20, 2010, in re Inter Partes Reexam of U.S. Patent No. 7,330,951 to Barth et al., with Control No. 95/001,201, 7 pages.
Exhibit GH—Steven Woo E-mail dated Jul. 21, 1997, "Message to . . . ," re Patent Owner's Response dated Sep. 20, 2010, In re Inter Partes Reexam of U.S. Patent No. 7,330,953 to Barth et al with Control No. 95/001,201, 3 pages.
Exhibit GI—Laura Fleming E-mail dated Jul. 22, 1997, "Meeting with . . . ," re Patent Owner's Response dated Sep. 20, 2010, in re Inter Partes Reexam of U.S. Patent No. 7,330,953 to Barth at al., with Control No. 95/001,201, 2 pages.
Exhibit GJ—Victor Lee E-mail dated Jul. 25, 1997; "Logic release meeting today?" re Patent Owner's Response dated Sep. 20, 2010, in re Inter Partes Reexam of U.S. Patent No. 7,130,953 to Barth et al., with Control No. 95/001,201, 2 pages.
Exhibit GK—Fred Ware E-mail dated Jun. 5, 1997, "Models Version," re Patent Owners Response dated Sep. 20, 2010, in re Inter Partes Reexam of U.S. Patent No. 7,330,953 to Barth at al., with Control No. 95/001,201, 2 pages.
Exhibit GL—Rick: Barth E-mail dated Jul. 15, 1997, "Direct IP," All Redacted, re Patent Owner's Response dated Sep. 20, 2010, in re Inter Partes Reexam of U.S. Patent No. 7,330,953 to Barth et al., with Control No. 95/001,201, 3 pages.
Exhibit GM—Handwritten Notes dated Mar. 6, 1997 through Oct. 6, 1997, document No. R 19228709-R1924742, re Patent Owner's Response dated Sep. 20, 2010, in re Inter Partes Reexam of U.S. Patent 7,310,953 to Barth et al., with Control No. 95/001,201, 35 pages.
Exhibit GN—"Direct RDRAM," Jul. 1, 1997, Rambus Inc. Company Confidential, re Patent Owner's Response dated Sep. 20, 2010, In re Inter Partes of U.S. Patent No. 7,330,953 to Barth et al., with Control No. 95/001,201, 253 pages.
Exhibit GO—"Direct RDRAM," May 29,1997, Rambus Inc.—Company Confidential, re Patent Owner's Response dated Sep. 20, 2010, In re Inter Partes Reexam of U.S. Patent No. 7,330,953 to Barth et al., with Control No. 95/001,201, 2 pages.
Exhibit GP—Rambus Confidential, "ABD," document No. R2819776-R2819779, Rev.1, Completely Redacted, re Patent Owner's Response dated Sep. 20, 2010, in re Inter Partes Reexam of U.S. Patent No. 7330,953 to Barth et al., With Control No. 95/001,201, 5 pages.
Exhibit GQ—Rambus Confidential, "ABD" Document No. R2535009-R2535012, Rev. I, Completely Redaeted, re Patent Owner's Response dated Sep. 20, 2010, In re Inter Partes Reexam of U.S. Patent No. 7,330,953 to Barth et al., with Control No. 95/001,201, 5 pages.
Exhibit GR—Tables 1 through 8, Document No. R2531768-R2531776, Completely Redacted, re Patent Owner's Response dated Sep. 20, 2010, In re Inter Partes Reexam of U.S. Patent No. 7,330,953, to Barth et al., with Control No. 95/001,201, 10 pages.
Exhibit GT—Steven Woo E-mail dated Apr. 3, 1997; "Write Buffers," RMAIL Emacs Buffer, re Patent Owner's Response dated Sep. 20, 2010, In re Inter Partes of U.S. Patent No. 7,330,953 to Barth et al., with Control No, 95/001,201, 7 pages.
Exhibit GU—Handwritten Notes dated Apr. 7, 1997 Document No. R0464671-R0464675, re Patent Owner's Response dated Sep. 20, 2010, In re Inter Partes Reexam of U.S. Patent No. 7,330,953 to Barth et al., with Control No. 95/001,201, 6 pages.
Exhibit GV: Pinout 121196-68 dated Dec. 19, 1996; Patent Owner's Response for First Office Action of Aug. 9, 2010 with Control No. 95/001,196 re reexam of U.S. Patent 7,330,952, 5 pages.
Exhibit GW—Pinout 101596, update of Pinout of Rambus2 RDRAM, dated Oct. 15, 1996; Patent Owner's Response to First Office Action of Aug. 9, 2010 with Control No. 95/001,196 re reexam of U.S. Patent 7,330,952 24 pages.
Exhibit M—Letter from Julie Cates Regarding a Paper copy of the new "advance" version, 64/72M Direct RDRAM data sheet (date blacked out), Confidential FTC Docket No. 9302, Document No. RF0585271-RF0585275, re Patent Owner's Partes Reexam of U.S. Patent No. 7,330,953 to Barth et al., with Control NO. 95/001,201, 6 pages.
Exhibit R—File History of the '050 patent re Request for Inter Partes Reexamination dated Jul. 1, 2009 for U.S. Patent 7,360,050 with. Control No. 95/001,205, filed on Jul. 1, 2009, 235 pages.
Exhibit R—File History of the '952 patent re Request for Inter Partes Reexamination Sep. 29, 2009 re Request for Inter Partes Reexamination for U.S. Patent No. 7,330,952, 185 pages.
Farmwald, Mike re Control No. 90/010,542 re Notice of Assignment and Filing Date of Reexam re Request for Inter Partes Reexamination of U.S. Patent 7,209,997 mailed May 21, 2009, 2 pages.
Gustavson, David B. et al., "Packetized Communicated for High Performance Random Access Memory System," U.S. Appl. No. 60/026,419, filed Sep. 20, 1996, 12 pages.
Gustavson, David B. et al., "Packets for High Performance Random Access Memory System," U.S. Appl. No. 60/026,896, filed Sep. 29, 1996, 23 pages.
Hidetaka, Fujisawa, English of Japanese Publication No. JP58192154A published Nov. 9, 1983, 1 page.
Infomation Disclosure Statement, dated Sep. 3, 2010, re U.S. Appl. No. 12/875,483, 35 pages.
JEDEC Meeting, "Minutes of Interim Meeting JC-42.3 Committee on RAM Memories," Jan. 31, 1996, 12 pages.
Kinya, Mitsuitio English Abstract for JP1-236494A published Sep. 21, 1989, 1 page.
Koichi, Sano, English Abstract of Japanese Publication No. JP61107453A published May 26, 1986, 1 page.
Nakamura, Masayuki et al, "DRAM Architecture with Aligned Data Storage and Bond Pads," U.S. Appl. No. 60/021,565, filed Jul. 11, 1996, 71 pages.
Nakamura, Masayuki et al., "Four Bit Pre-Fetch SDRAM Column Select Architecture," U.S. Appl. No. 60/021,567, filed Jul. 11, 1996, 74 pages.
Prince, B., "High Performance Memories: New Architecture DRAMs and SRAMs—evolution and function," John Wiley & Sons, New York, 1996, 297 pages.
Takashi, Saito, English Abstract for JP63-217452A published Sep. 9, 1988, 1 page.
Third Party Requester's Petition for REconsideration of Decision Dissolving Merger of Reexamination Proceedings and for Reinstitution of the Prosecution Record, dated Jul. 21, 2010, In re Inter Partes Reexamination of U.S. Patent No. 7,330,953 Issued Feb. 12, 2008, with Control Nos. 95/001,201 and 90/009,369, 13 pages.
Third Party Requester's Petition for Reconsideration of Decision Dissolving Merger of Reexamination Proceedings and for Reinstitution of the Prosecution Record, dated Jul. 21, 2010, In re Inter Partes Reexamination of U.S. Patent No. 7,330,953 Issued Apr. 15, 2008, with Control Nos. 95/001,205 and 90/009,370, 13 pages.
Third Party Requester's Petition for Reconsideration of Decision Dissolving Merger of Reexamination Proceedings for Reinstitution of the Prosecution Record, dated Jul. 21, 2010, In re Inter Partes Reexamination of U.S. Patent No. 7,287,119 Issued Oct. 23, 2007 with Control Nos. 95/001,189 and 90/010,365, 13 pages.
Third Party Requester's Petition for Reconsideration of Decision Dissolving Merger of Reexamination Proceedings and for Reinstitution of the Prosecution Record, dated Jul. 21, 2010, In re Inter Partes Reexamination of U.S. Patent No. 7,330,952 Issued Feb. 12, 2008 with Control Nos. 95/001,196 and 90/010,371, 13 pages.
Thurston, Paulette, "Variable Latency Memory Circuit," U.S. Appl. No. 60/034,470, filed Jan. 2, 1997, 36 pages.
Tokuji, Furuto, English Abstract and Translation for JP63-091766A published Apr. 22, 1988, 11 pages.
Preliminary Amendment with mail date of Jan. 9, 2008 re U.S. Appl. No. 11/736,666. 8 Pages.
Barth, Richard, U.S. Appl. No. 13/230,741, Notice of Allowance and Fee(s) Due, mailed Mar. 9, 2012. 7 pages.
Exhibit 30: Transmittal of Communication to Third Party Requester Inter Partes Reexamination, dated May 15, 2009 for Reexamination Control No. 95/001,166 re U.S. Patent No. 7,287,109, 41 pages.
Barth, Richard, Control No. 95/001,196, filed Jun. 4, 2009, re Patent Owner's Response to Office Action of Aug. 9, 2010, in re Reexamination of U.S. Patent 7,330,952 dated Sep. 9, 2010. 33 pages.

\* cited by examiner

*Primary Examiner* — Pierre-Michel Bataille
(74) *Attorney, Agent, or Firm* — Morgan, Lewis & Bockius LLP

(57) ABSTRACT

An apparatus for controlling a dynamic random access memory (DRAM), the apparatus comprising an interface to transmit, over a first plurality of wires, to the DRAM a first code to indicate that first data is to be written to the DRAM and a column address to indicate a column location of a memory core in the DRAM where the first data is to be written. The interface is further to transmit a second code to indicate whether mask information for the first data will be sent to the DRAM. If the second code indicates that mask information will be sent, a portion of the column address and a portion of the mask information are sent after the second code is sent. The interface is further to transmit to the DRAM, over a second plurality of wires separate from the first plurality of wires, the first data.

19 Claims, 44 Drawing Sheets

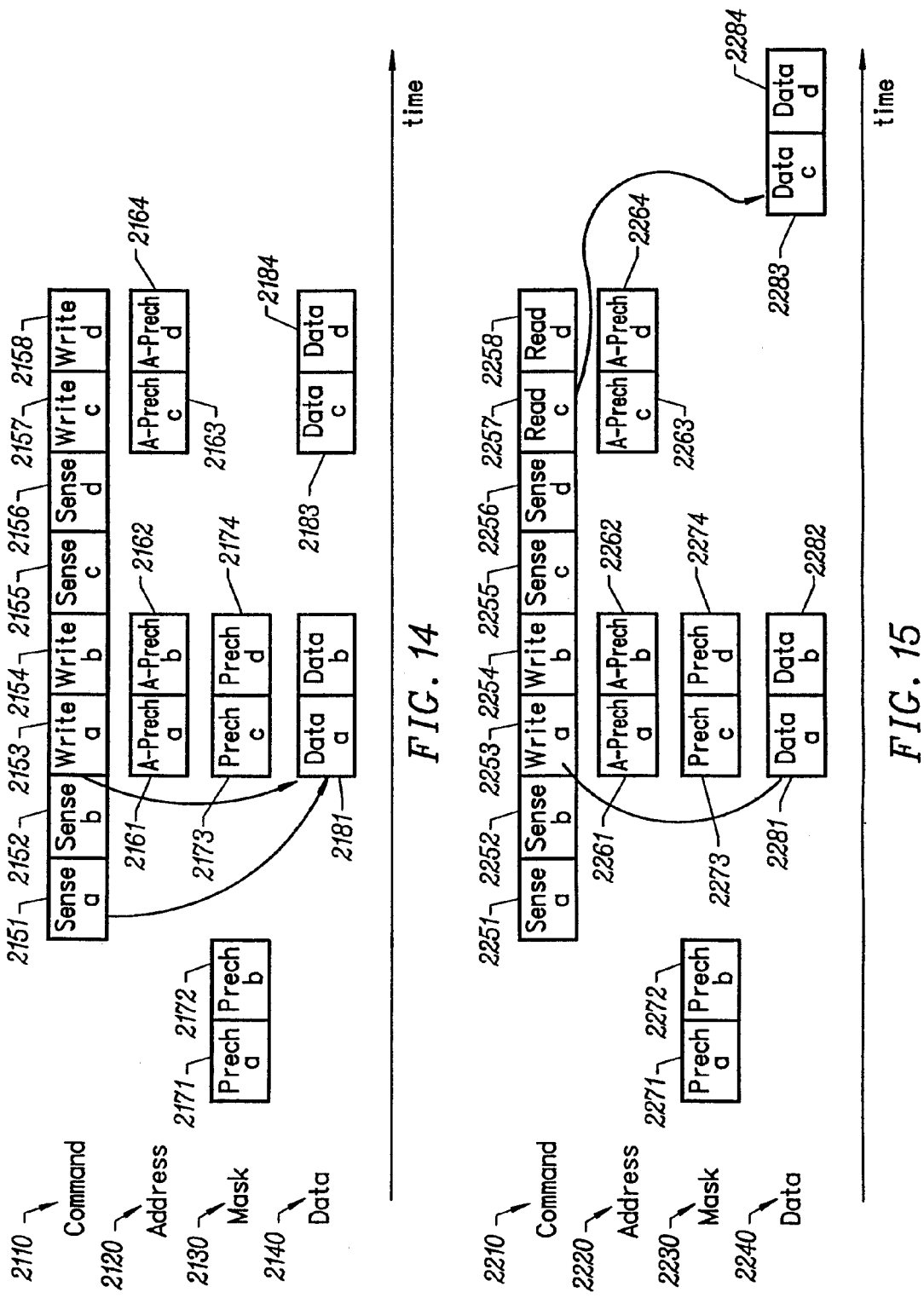

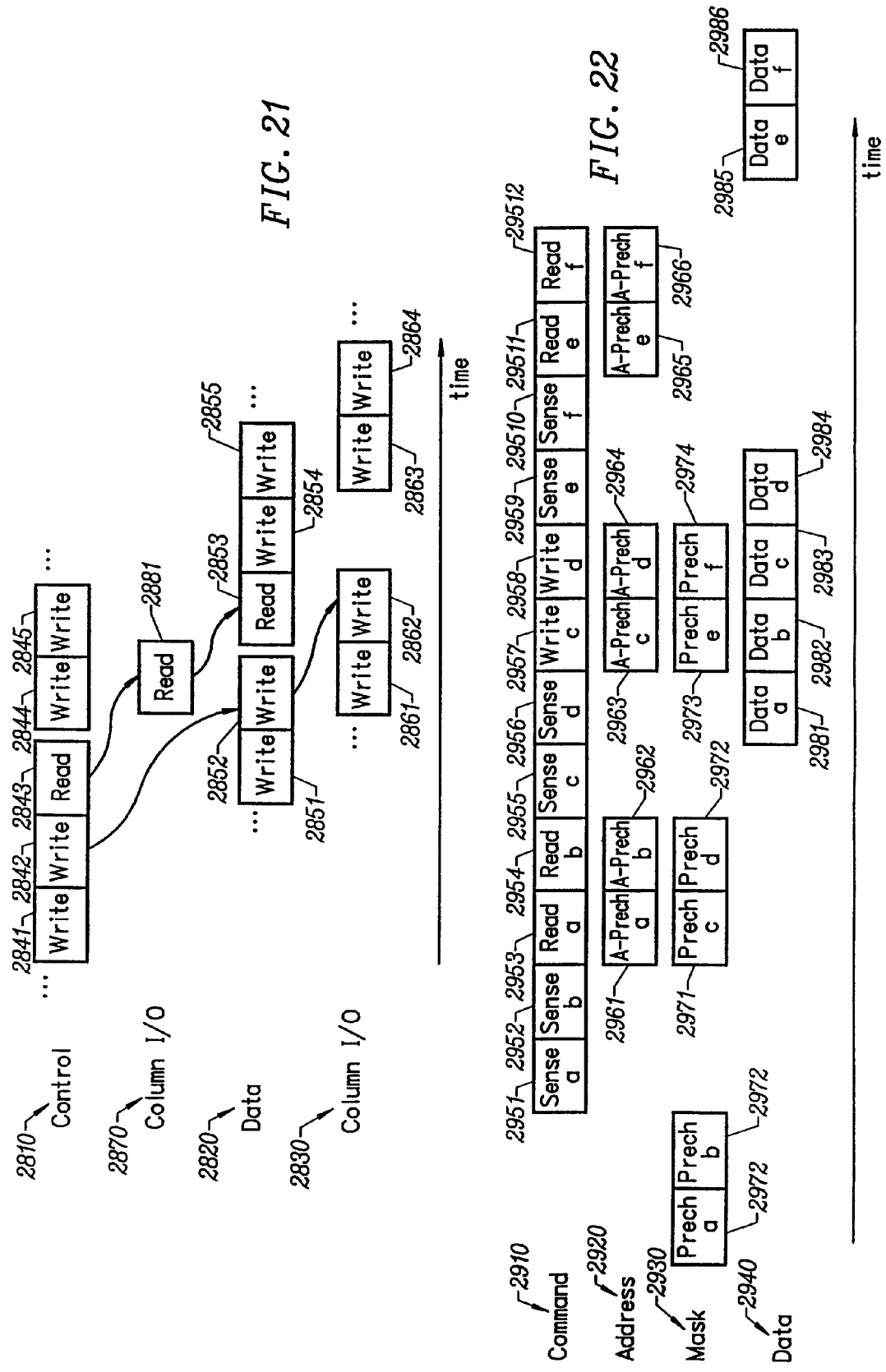

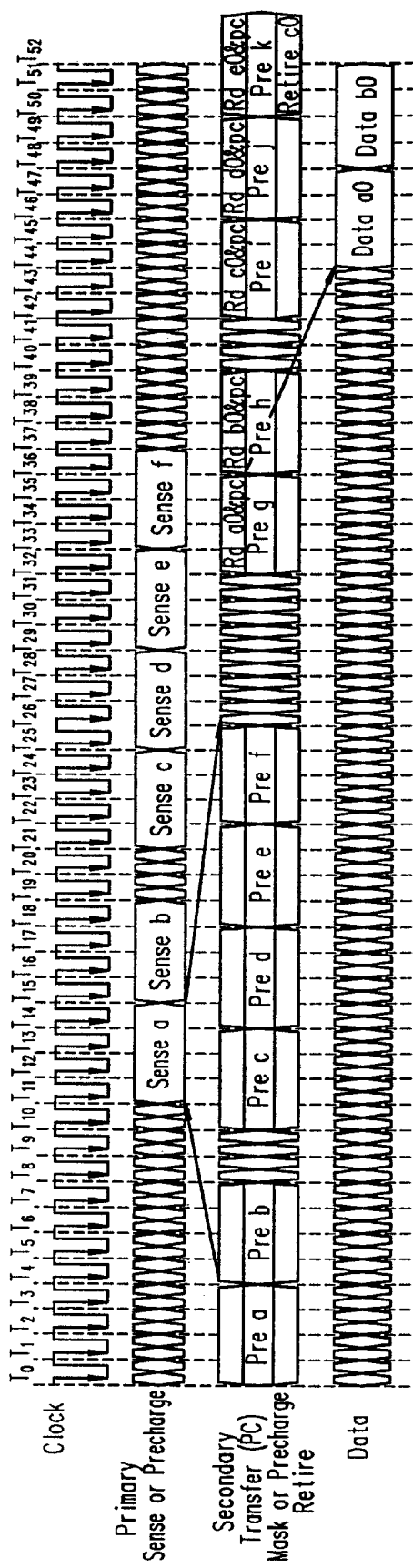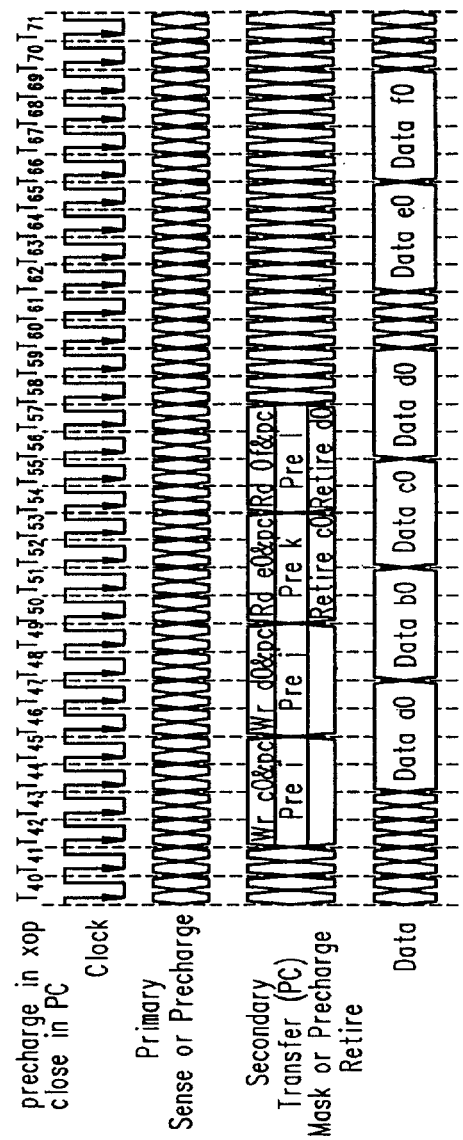
FIG. 40

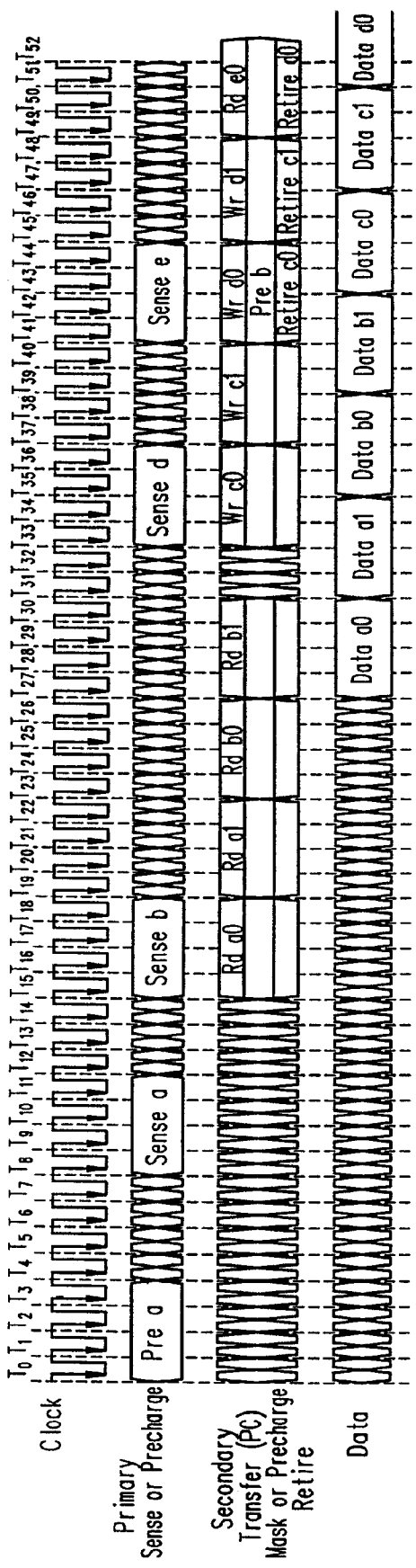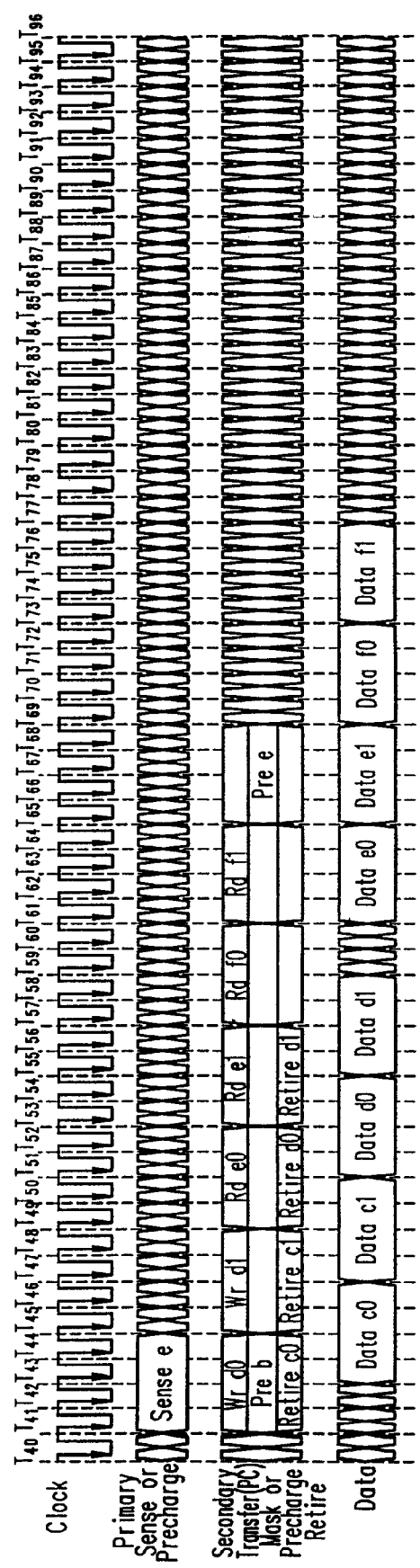
FIG. 44

METHOD AND APPARATUS FOR INDICATING MASK INFORMATION

RELATED APPLICATIONS

This application is a continuation of U.S. application Ser. No. 13/230,741, filed Sep. 12, 2011, now U.S. Pat. No. 8,205,056, which is a continuation of U.S. application Ser. No. 12/875,483, filed Sep. 3, 2010, now U.S. Pat. No. 8,019,958, which is a continuation of U.S. application Ser. No. 12/349,485, filed Jan. 6, 2009, now U.S. Pat. No. 7,793,039, which is a continuation of U.S. patent application Ser. No. 11/953,803, filed Dec. 10, 2007, now U.S. Pat. No. 7,496,709, which is a continuation of U.S. patent application Ser. No. 11/692,159, filed Mar. 27, 2007, now U.S. Pat. No. 7,330,952, which is a continuation of U.S. patent application Ser. No. 11/059,216, filed Feb. 15, 2005, now U.S. Pat. No. 7,197,611, which is a continuation of U.S. patent application Ser. No. 10/128,167, filed Apr. 22, 2002, now U.S. Pat. No. 6,868,474, which is a divisional of U.S. patent application Ser. No. 09/169,206, filed Oct. 9, 1998, now U.S. Pat. No. 6,401,167, which claims priority to U.S. Provisional Patent Application No. 60/061,770, filed Oct. 10, 1997, all of which are herein incorporated by referenced in their entirety.

FIELD OF THE INVENTION

The present invention relates generally to electronic systems for data storage and retrieval. More particularly, the invention is directed toward improved methods and structures for memory devices.

BACKGROUND OF THE INVENTION

In any engineered design there are compromises between cost and performance. The present invention introduces novel methods and structures for reducing the cost of memory devices while minimally compromising their performance. The description of the invention requires a significant amount of background including: application requirements, memory device physical construction, and memory device logical operation.

Memory device application requirements can be most easily understood with respect to memory device operation. FIG. 1 shows the general organization of a memory device. Memory device 101 consists of a core 102 and an interface 103. The core is responsible for storage of the information. The interface is responsible for translating the external signaling used by the interconnect 105 to the internal signaling carried on bus 104. The primitive operations of the core include at least a read operation. Generally, there are other operations required to manage the state of the core 102. For example, a conventional dynamic random access memory (DRAM) has at least write, precharge, and sense operations in addition to the read operation.

For purposes of illustrating the invention a conventional DRAM core will be described. FIG. 2 is a block diagram of a conventional DRAM core 102. Since the structure and operation of a conventional DRAM core is well known in the art only a brief overview is presented here.

A conventional DRAM core 202 mainly comprises storage banks 211 and 221, row decoder and control circuitry 210, and column data path circuit comprising column amplifiers 260 and column decoder and control circuitry 230. Each of the storage banks comprises storage arrays 213 and 223 and sense amplifiers 212 and 222.

There may be many banks, rather than just the two illustrated. Physically the row and column decoders may be replicated in order to form the logical decoder shown in FIG. 2. The column i/o lines 245 may be either bidirectional, as shown, or unidirectional, in which case separate column i/o lines are provided for read and write operations.

The operation of a conventional DRAM core is divided between row and column operations. Row operations control the storage array word lines 241 and the sense amplifiers via line 242. These operations control the movement of data from the selected row of the selected storage array to the selected sense amplifier via the bit lines 251 and 252. Column operations control the movement of data from the selected sense amplifiers to and from the external data connections 204d and 204e.

Device selection is generally accomplished by one of the following choices:
  matching an externally presented device address against an internally stored device address;
  requiring separate operation control lines, such as RAS and CAS, for each set of memory devices that are to be operated in parallel; and
  providing at least one chip select control on the memory device.

FIG. 3 illustrates the timing required to perform the row operations of precharge and sense. In their abstract form these operations can be defined as
  precharge (device, bank)—prepare the selected bank of the selected device for sensing; and
  sense (device, bank, row)—sense the selected row of the selected bank of the selected device.

The operations and device selection arguments are presented to the core via the PRECH and SENSE timing signals while the remaining arguments are presented as signals which have setup and hold relationships to the timing signals. Specifically, as shown in FIGS. 2-4, PRECH and PRECHBANK form signals on line 204a in which PRECHBANK presents the "bank" argument of the precharge operation, while SENSE, SENSEBANK and SENSEROW form signals on line 204b in which SENSEBANK and SENSEROW present the "bank" and "row" arguments, respectively, for the sense operation. Each of the key primary row timing parameters, $t_{RP}$, $t_{RAS,min}$, and $t_{RCD}$ can have significant variations between devices using the same design and across different designs using the same architecture.

FIG. 5 and FIG. 6 illustrate the timing requirements of the read and write operations, respectively. These operations can be defined abstractly as:
  data=read (device, bank, column)—transfer the data in the subset of the sense amplifiers specified by "column" in the selected "bank" of the selected "device" to the READDATA lines; and
  write (device, bank, column, mask, data)—store the data presented on the WRITEDATA lines into the subset of the sense amplifiers specified by "column" in the selected "bank" of the selected "device"; optionally store only a portion of the information as specified by "mask".

More recent conventional DRAM cores allow a certain amount of concurrent operation between the functional blocks of the core. For example, it is possible to independently operate the precharge and sense operations or to operate the column path simultaneously with row operations. To take advantage of this concurrency each of the following groups may operate somewhat independently:
  PRECH and PRECHBANK on lines 204a;
  SENSE, SENSEBANK, and SENSEROW on lines 204b;

COLCYC 204f on line, COLLAT and COLADDR on lines 204g, WRITE and WMASK one lines 204c, READ-DATA on line 204d, and WRITEDATA on line 204.

There are some restrictions on this independence. For example, as shown in FIG. 3, operations on the same bank observe the timing restrictions of $t_{RP}$ and $t_{RAS,min}$. If accesses are to different banks, then the restrictions of FIG. 4 for $t_{SS}$ and $t_{PP}$ may have to be observed.

The present invention, while not limited by such values, has been optimized to typical values as shown in Table 1.

TABLE 1

Typical Core Timing Values

| Symbol | Value (ns) |
|---|---|
| $t_{RP}$ | 20 |
| $t_{RAS, Min}$ | 50 |
| $t_{RCD}$ | 20 |
| $t_{PP}$ | 20 |
| $t_{SS}$ | 20 |
| $t_{PC}$ | 10 |
| $t_{DAC}$ | 7 |

FIG. 7 shows the permissible sequence of operations for a single bank of a conventional DRAM core. It shows the precharge 720, sense 721, read 722, and write 723, operations as nodes in a graph. Each directed arc between operations indicates an operation which may follow. For example, arc 701 indicates that a precharge operation may follow a read operation.

The series of memory operations needed to satisfy any application request can be covered by the nominal and transitional operation sequences described in Table 2 and Table 3. These sequences are characterized by the initial and final bank states as shown in FIG. 8.

The sequence of memory operations is relatively limited. In particular, there is a universal sequence:
  precharge,
  sense,
  transfer (read or write), and
  close.

In this sequence, close is an alternative timing of precharge but is otherwise functionally identical. This universal sequence allows any sequence of operations needed by an application to be performed in one pass through it without repeating any step in that sequence. A control mechanism that implements the universal sequence can be said to be conflict free. A conflict free control mechanism permits a new application reference to be started for every minimum data transfer. That is, the control mechanism itself will never introduce a resource restriction that stalls the memory requestor. There may be other reasons to stall the memory requestor, for example references to different rows of the same bank may introduce bank contention, but lack of control resources will not be a reason for stalling the memory requestor

TABLE 2

Nominal Transactions

| Initial Bank State | Final Bank State | Transaction Type | Operations Performed |
|---|---|---|---|
| closed | closed | empty | sense, series of column operations, precharge |
| open | open | miss | precharge, sense, series of column operations |
|  |  | hit | series of column operations |

TABLE 3

Transitional Transactions

| Initial Bank State | Final Bank State | Transaction Type | Operations Performed |
|---|---|---|---|
| closed | open | empty | sense, <series of column operations>(optional) |
| open | closed | miss | <precharge, sense, series of column operations>(optional), precharge |
|  |  | hit | <series of column operations> (optional), precharge |

Memory applications may be categorized as follows:
  main memory—references generated by a processor, typically with several levels of caches;
  graphics—references generated by rendering and display refresh engines; and
  unified—combining the reference streams of main memory and graphics.

Applications may also be categorized by their reference stream characteristics. According to the application partition mentioned above reference streams can be characterized in the following fashion:
  First, main memory traffic can be cached or uncached processor references. Such traffic is latency sensitive since typically a processor will stall when it gets a cache miss or for any other reason needs data fetched from main memory. Addressing granularity requirements are set by the transfer size of the processor cache which connects to main memory. A typical value for the cache transfer size is 32 bytes. Since multiple memory interfaces may run in parallel it is desirable that the memory system perform well for transfer sizes smaller than this. Main memory traffic is generally not masked; that is, the vast bulk of its references are cache replacements which need not be written at any finer granularity than the cache transfer size.
  Another type of reference stream is for graphics memory. Graphics memory traffic tends to be bandwidth sensitive rather than latency sensitive. This is true because the two basic graphics engines, rendering and display refresh, can both be highly pipelined. Latency is still important since longer latency requires larger buffers in the controller and causes other second order problems. The ability to address small quanta of information is important since typical graphics data structures are manipulated according to the size of the triangle being rendered, which can be quite small. If small quanta cannot be accessed then bandwidth will be wasted transferring information which is not actually used. Traditional graphics rendering algorithms benefit substantially from the ability to mask write data; that is, to merge data sent to the memory with data already in the memory. Typically this is done at the byte level, although finer level, e.g. bit level, masking can sometimes be advantageous.

As stated above, unified applications combine the characteristics of main memory and graphics memory traffic. As electronic systems achieve higher and higher levels of integration the ability to handle these combined reference streams becomes more and more important.

Although the present invention can be understood in light of the previous application classification, it will be appreciated by those skilled in the art that the invention is not limited to the mentioned applications and combinations but has far wider application. In addition to the specific performance and functionality characteristics mentioned above it is generally important to maximize the effective bandwidth of the memory system and minimize the service time. Maximizing effective bandwidth requires achieving a proper balance between control and data transport bandwidth. The control bandwidth is generally dominated by the addressing information delivered to the memory device. The service time is the amount of time required to satisfy a request once it is presented to the memory system. Latency is the service time of a request when the memory system is otherwise devoid of traffic. Resource conflicts, either for the interconnect between the requestor and the memory devices, or for resources internal to the memory devices such as the banks, generally determine the difference between latency and service time. It is desirable to minimize average service time, especially for processor traffic.

The previous section introduced the performance aspects of the cost-performance tradeoff that is the subject of the present invention. In this section the cost aspects are discussed. These aspects generally result from the physical construction of a memory device, including the packaging of the device.

FIG. 9 shows the die of a memory device 1601 inside of a package 1620. For typical present day device packages, the bond pads, such as 1610, have center to center spacing significantly less than the pins of the device, such as 1640. This requires that there be some fan-in from the external pins to the internal bonding pads. As the number of pads increases the length of the package wiring, such as 1630, grows. Observe that elements 1630 and 1640 are alternately used to designate package wiring.

There are many negative aspects to the increase in the length of the package wiring 1640, including the facts that: the overall size of the package increases, which costs more to produce and requires more area and volume when the package is installed in the next level of the packaging hierarchy, such as on a printed circuit board. Also, the stub created by the longer package wiring can affect the speed of the interconnect. In addition, mismatch in package wiring lengths due to the fan-in angle can affect the speed of the interconnect due to mismatched parasitics.

The total number of signal pins has effects throughout the packaging hierarchy. For example, the memory device package requires more material, the next level of interconnect, such as a printed circuit board, requires more area, if connectors are used they will be more expensive, and the package and die area of the master device will grow.

In addition to all these cost concerns based on area and volume of the physical construction another cost concern is power. Each signal pin, especially high speed signal pins, requires additional power to run the transmitters and receivers in both the memory devices as well as the master device. Added power translates to added cost since the power is supplied and then dissipated with heat sinks.

The memory device illustrated in FIG. 10 uses techniques typical of present day memory devices. In this device 1701, a single shared command bus 1710 in conjunction with the single address bus 1720 and mask bus 1730 is used to specify all of the primitive operations comprising precharge, sense, read, and write in addition to any other overhead operations such as power management.

FIG. 11 illustrates the operation of the memory device of FIG. 10. The illustrated reference sequence, when classified according to Table 2 and the universal sequence previously described comprises:

write empty—sense 1851, write 1853 with mask 1871, data 1881, close (precharge) 1861;

write miss—precharge 1852, sense 1854, write 1856 with mask 1872, data 1882;

read hit—read 1857, tristate control 1873, data 1883; and transitional write miss—precharge 1855, sense 1858, write 1859, mask 1874, data 1884, close(precharge) 1862.

In FIG. 11 each box represents the amount of time required to transfer one bit of information across a pin of the device.

In addition to illustrating a specific type of prior art memory device, FIG. 11 can be used to illustrate a number of techniques for specifying data transfers. One prior art technique uses an internal register to specify the number of data packets transferred for each read or write operation. When this register is set to its minimum value and the reference is anything besides a hit then the device has insufficient control bandwidth to specify all the required operations while simultaneously keeping the data pins highly utilized. This is shown in FIG. 11 by the gaps between data transfers. For example there is a gap between data a, 1881 and data b, 1882. Even if sufficient control bandwidth were provided some prior art devices would also require modifications to their memory cores in order to support high data pin utilization.

The technique of specifying the burst size in a register makes it difficult to mix transfer sizes unless the burst size is always programmed to be the minimum, which then increases control overhead. The increase in control overhead may be so substantial as to render the minimum burst size impractical in many system designs.

Regardless of the transfer burst size, the technique of a single unified control bus, using various combinations of the command pins 1810, address pins 1820, and mask pins 1830 places limitations on the ability to schedule the primitive operations. A controller which has references in progress that are simultaneously ready to use the control resources must sequentialize them, leading to otherwise unnecessary delay.

Read operations do not require masking information. This leaves the mask pins 1830 available for other functions. Alternately, the mask pins during read operations may specify which bytes should actually be driven across the pins as illustrated by box 1873.

Another technique is an alternative method of specifying that a precharge should occur by linking it to a read or write operation. When this is done the address components of the precharge operation need not be respecified; instead, a single bit can be used to specify that the precharge should occur. One prior art method of coding this bit is to share an address bit not otherwise needed during a read or write operation. This is illustrated by the "A-Prech" boxes, 1861 and 1862.

FIG. 12 shows a sequence of four read references each comprising all the steps of the universal sequence. Although the nominal transactions of Table 2 do not require the multiple precharge steps of the universal sequence it is useful to examine how well a device handles the universal sequence in order to understand its ability to support mixed empty and miss nominal transactions, as well as the transitional transactions of Table 3. As can be seen, the data pins are poorly utilized. This indicates that control contention will limit the ability of the device to transfer data for various mixes of application references. The utilization of the data pins could be improved by making the burst length longer. However, the applications, such as graphics applications, require small length transfers rather than large ones.

Another technique makes the delay from write control information to data transfer different from the delay of read control information to data transfer. When writes and reads are mixed, this leads to difficulties in fully utilizing the data pins.

Thus, current memory devices have inadequate control bandwidth for many application reference sequences. Current memory devices are unable to handle minimum size transfers. Further, current memory devices utilize the available control bandwidth in ways that do not support efficient applications. Current memory devices do not schedule the use of the data pins in an efficient manner. In addition, current memory devices inefficiently assign a bonding pad for every pin of the device.

BRIEF DESCRIPTION OF THE DRAWINGS

FIG. 14 illustrates a unified control universal write sequence with mask precharge in accordance with an embodiment of the invention.

FIG. 15 illustrates a unified control universal read write sequence with mask precharge in accordance with an embodiment of the invention.

FIG. 21 illustrates mixed read and write timing in accordance with an embodiment of the invention.

FIG. 22 illustrates a unified control universal read and write sequence with mask precharge and delayed write in accordance with the invention.

FIG. 40 illustrates reads or unmasked writes in accordance with an embodiment of the invention.

FIG. 44 illustrates reads and unmasked writes in accordance with an embodiment of the invention.

Like reference numerals refer to corresponding parts throughout the drawings.

DESCRIPTION OF EMBODIMENTS

Figure 12:
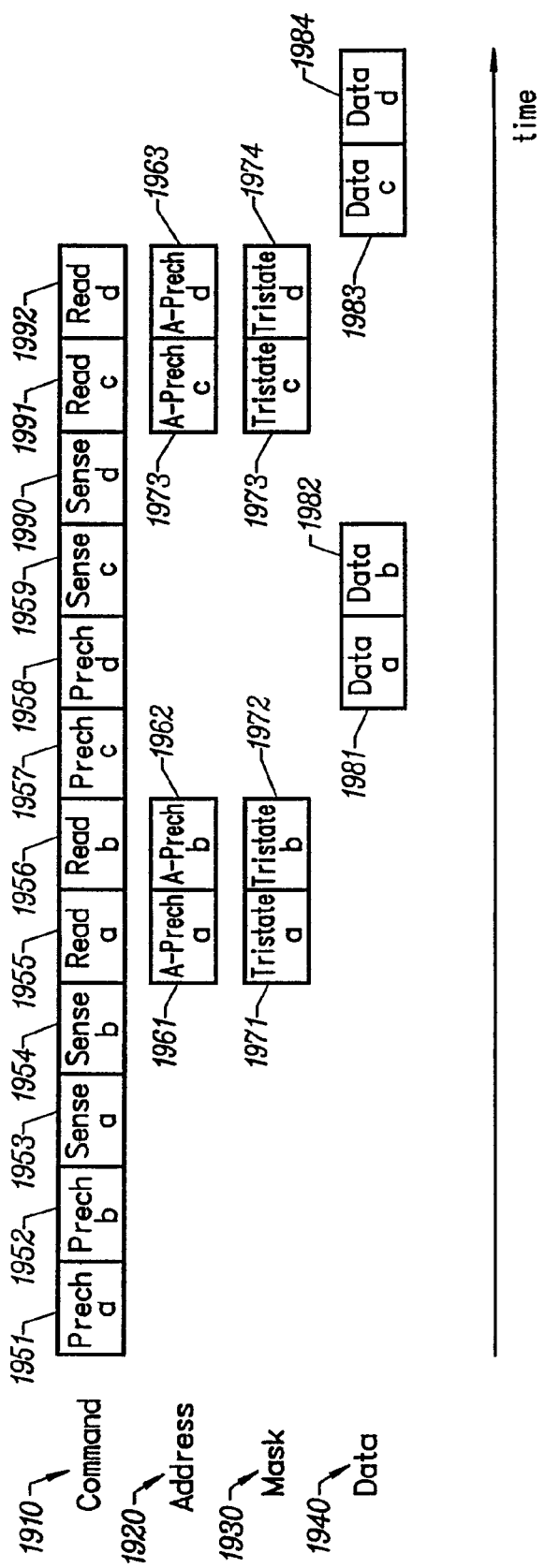
FIG. 12 illustrates a unified control universal read sequence in accordance with an embodiment of the invention.
Figure 13:
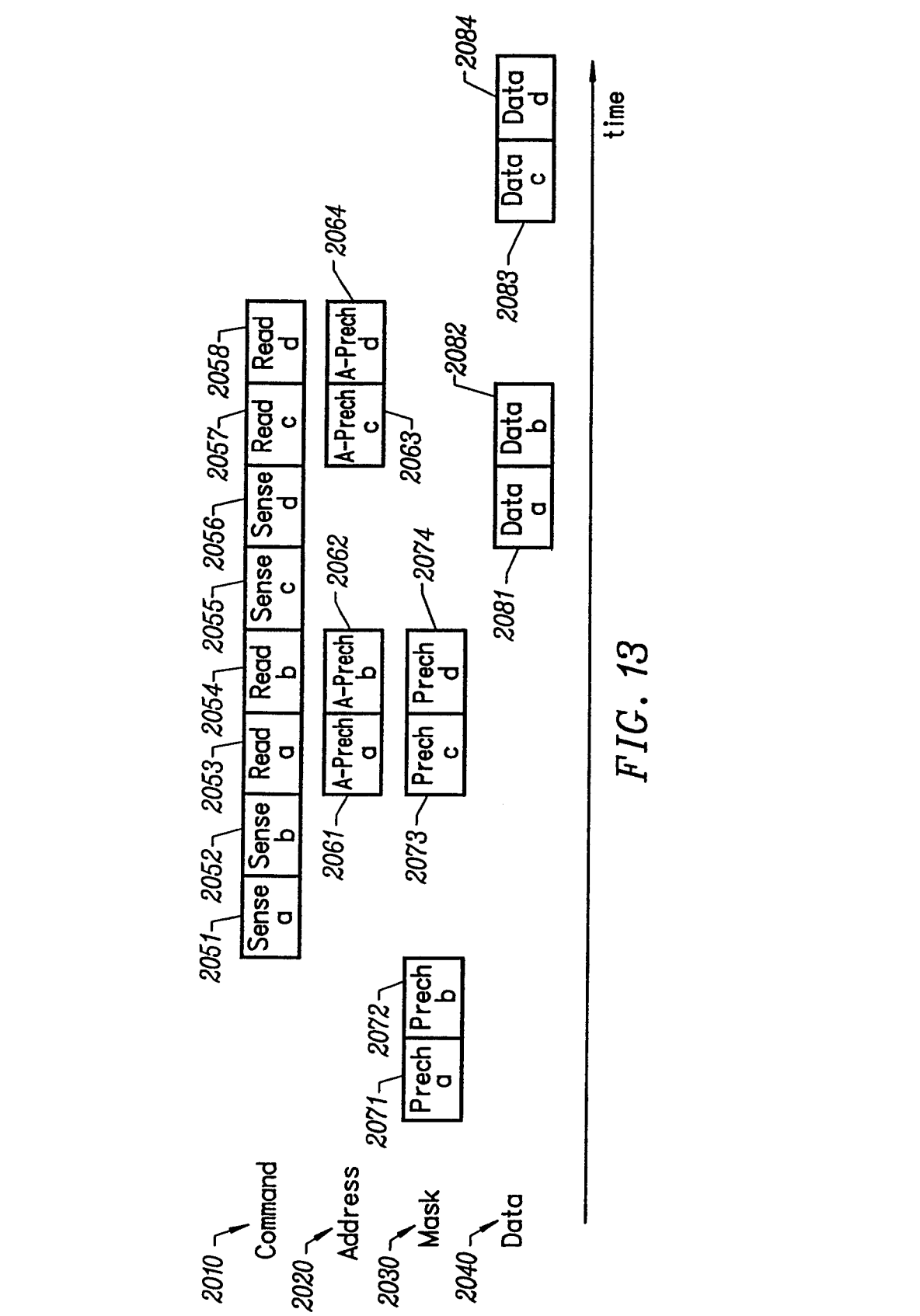
FIG. 13 illustrates a unified control universal read sequence with mask precharge in accordance with an embodiment of the invention.

FIG. 13 shows a timing diagram according to an embodiment of the present invention in which the Mask pins 2030 carry a precharge specification rather than either the write mask information or the tristate control information, as shown in connection with FIG. 12. This use of the Mask pins need not be exclusive. There are multiple ways in which to indicate how the information presented on the Mask pins is to be used. For example:

- in one embodiment according to the present invention, a register within the device specifies whether the mask pins are to be used for masking, tristate control, or precharge control;
- in another embodiment according to the present invention, the encoding of the command pins is extended to specify, on a per operation basis, how the mask pins are to be used; and
- in another embodiment according to the present invention, a register bit indicates whether tristate control is enabled or not and, in the case it is not enabled, an encoding of the command pins indicates if a write is masked or not; in this embodiment all reads and unmasked writes may use the Mask pins to specify a precharge operation while masked writes do not have this capability since the Mask pins are used for mask information There are many alternatives for how to code the precharge information on the mask pins. In one embodiment in which there are two mask pins and the memory device has two banks, one pin indicates whether an operation should occur and the other pin indicates which bank to precharge. In an alternative embodiment, in which the minimum data transfer requires more than one cycle, more banks are addressed by using the same pins for more than one cycle to extend the size of the bank address field.

Using the mask pins to specify a precharge operation and the associated bank address requires another way of specifying the device argument. In one embodiment the device is specified in some other operation. For example, the precharge specified by the mask pins shares device selection with a chip select pin that also conditions the main command pins. In another embodiment, additional control bandwidth is added to the device. For example, an additional chip select pin is added for sole use by the recoded mask pin precharge. In yet another example of using additional control bandwidth in which the minimum data transfer requires more than one cycle, the device address is coded on the additional bits, the device address being compared to an internal device address register.

In FIG. 13 it can be seen that the data pins are better utilized. For example, the offset between data block 1982 and 1983 in FIG. 12 is reduced from 4 units of time to the 2 units of time between data blocks 2082 and 2083 of FIG. 13. This is accomplished because the precharge specification has been moved from the primary command pins, 2010, to the mask pins 2030 so there is more time available on the command pins to specify the sense and read or write operations.

Delaying Write Data

FIG. 14 shows the timing of the universal write sequence in an embodiment according to the present invention, when the Mask pins are used for the precharge step. The offset from data block 2182 to data block 2183 is two units of time just as in the read sequence shown in FIG. 13. However, the offset from the use of the command pins to the use of the data pins is shown as zero for the write case but three for the read case. As can be seen in FIG. 15, when these sequences are combined to produce a sequence that has both reads and writes, there is a substantial gap between the write data and the read data as can be seen by the delay between data 2282 and data 2283. Delaying the write data so that the offset from control information to data is the same, independent of whether the transfer is a read or a write, reduces or eliminates the delay.

Figure 1:
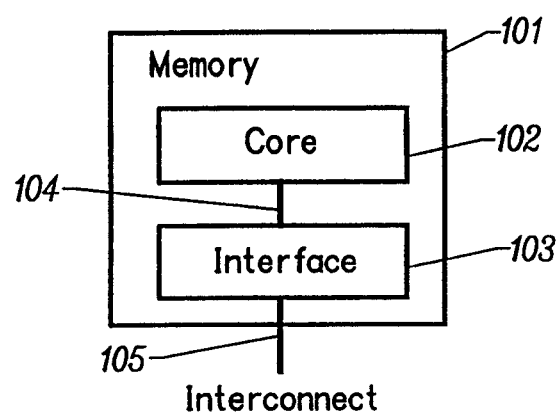
FIG. 1 illustrates a known memory structure architecture.
Figure 2:
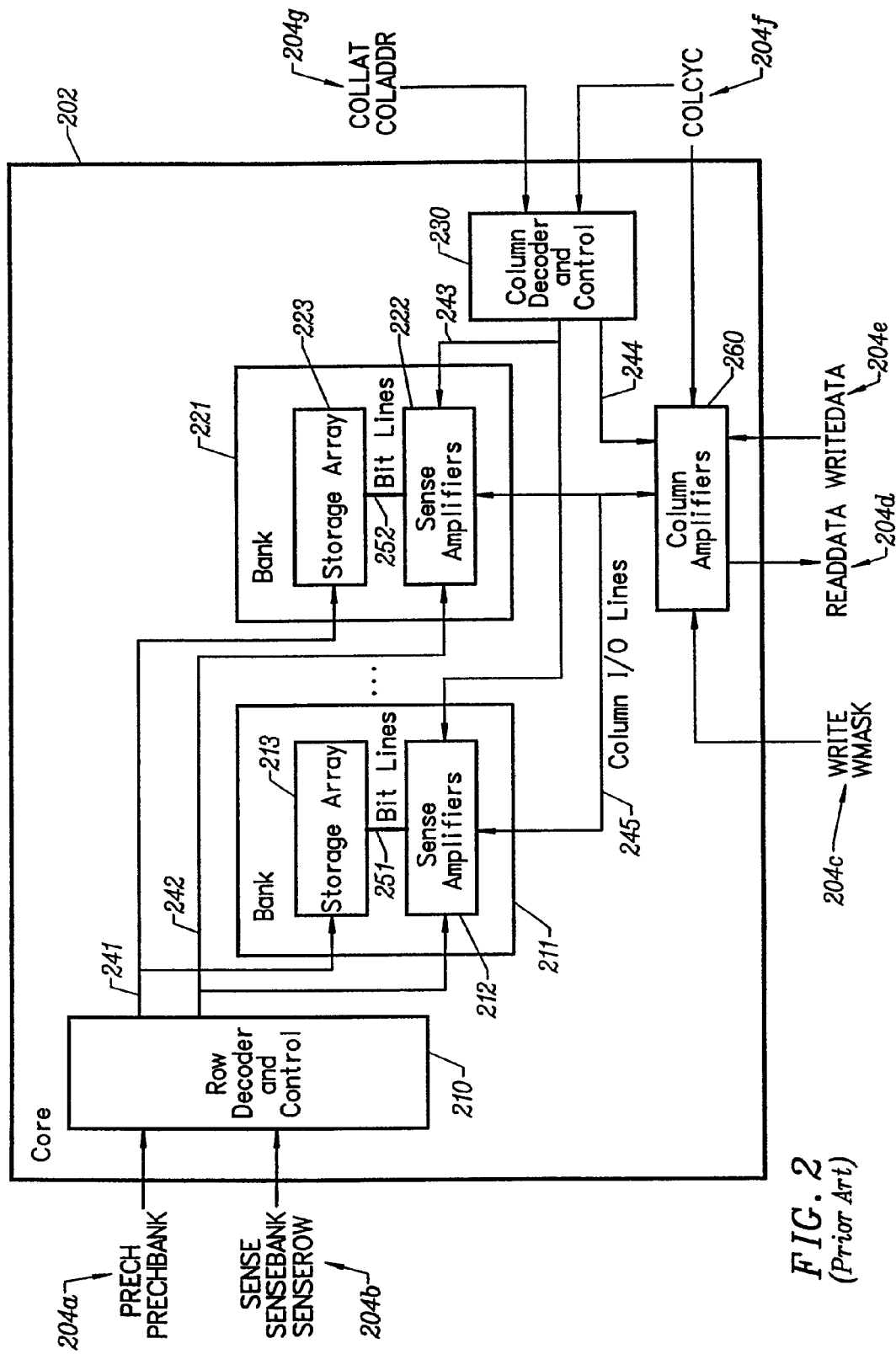
FIG. 2 illustrates a known DRAM core structure.
Figure 3:
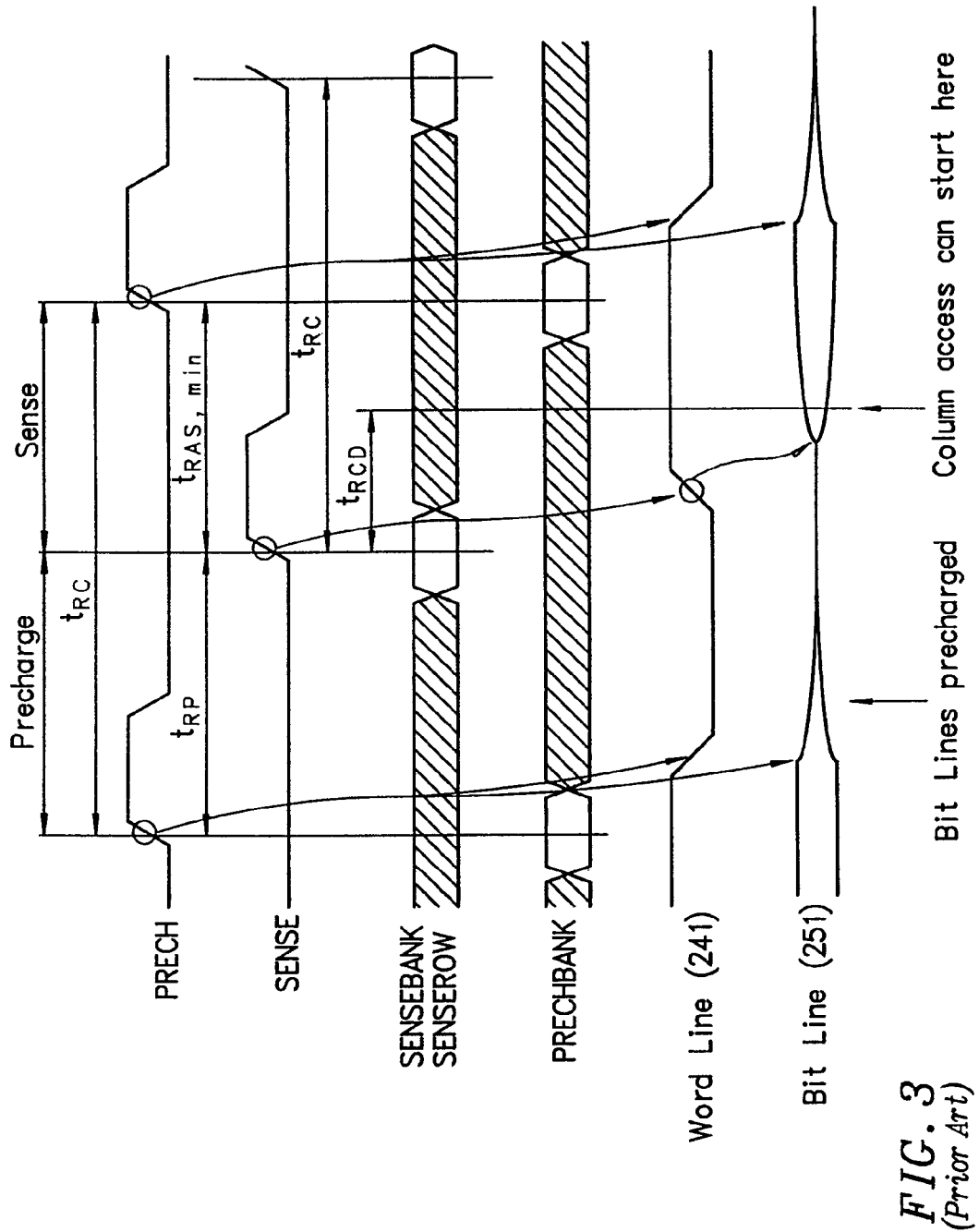
FIG. 3 illustrates Row Access Timing to a single bank in accordance with the prior art.
Figure 4:
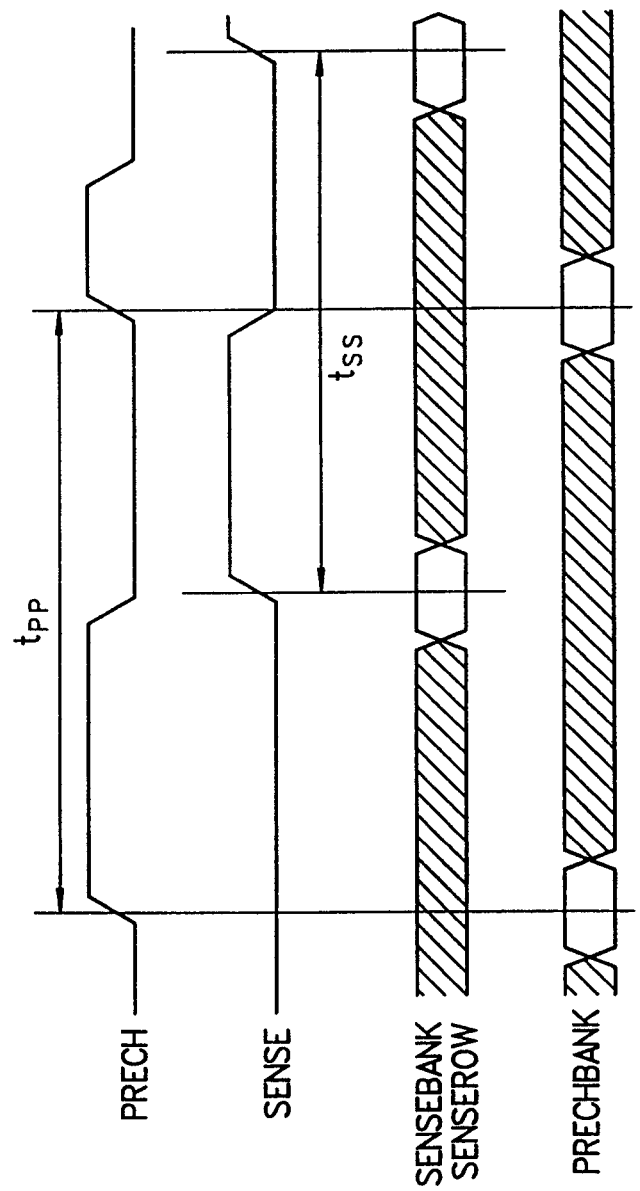
FIG. 4 illustrates Row Access Timing to different banks in accordance with the prior art.
Figure 5:
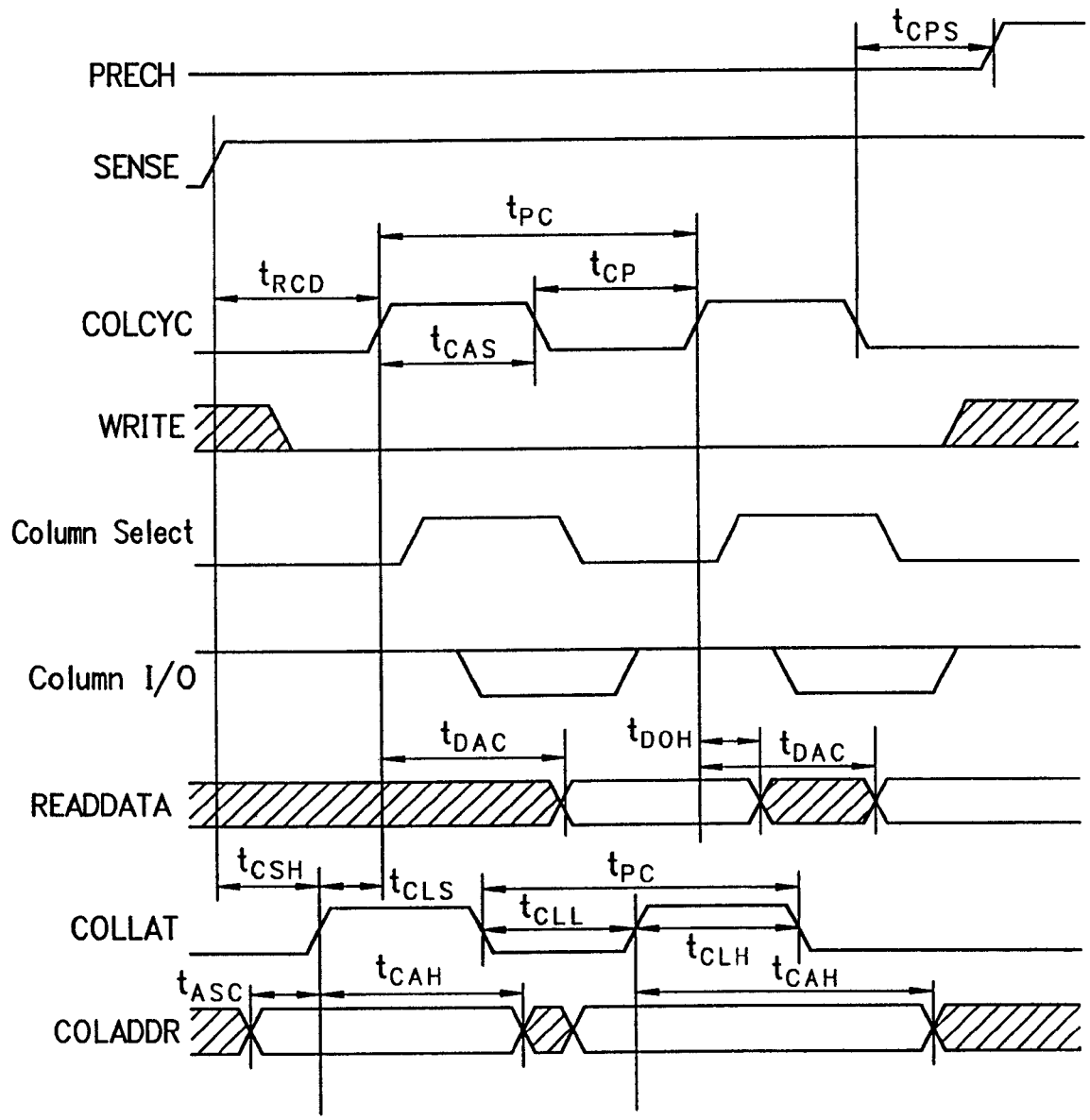
FIG. 5 illustrates Column Read Timing in accordance with the prior art.
Figure 6:
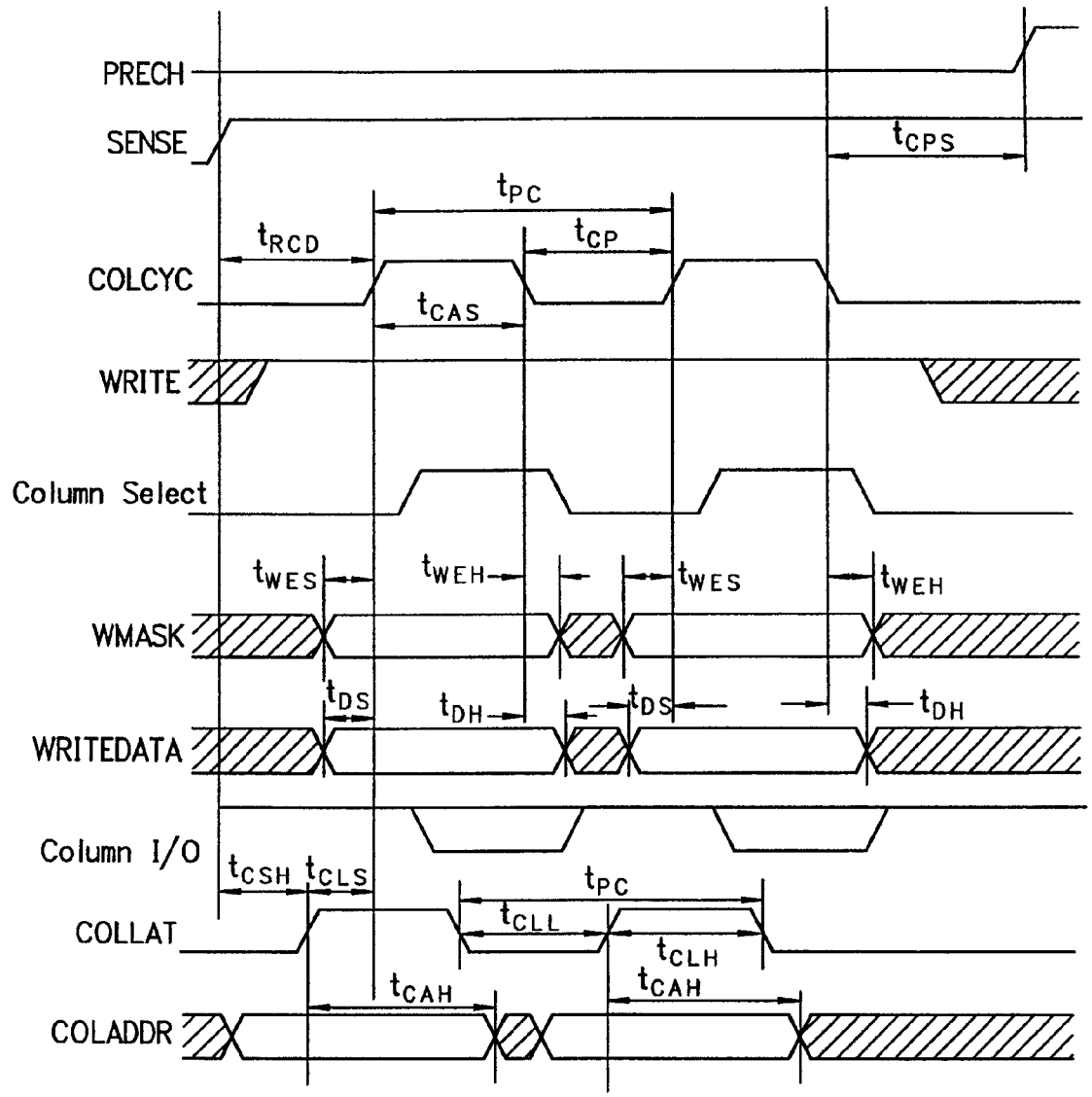
FIG. 6 illustrates Column Write Timing in accordance with the prior art.
Figure 7:
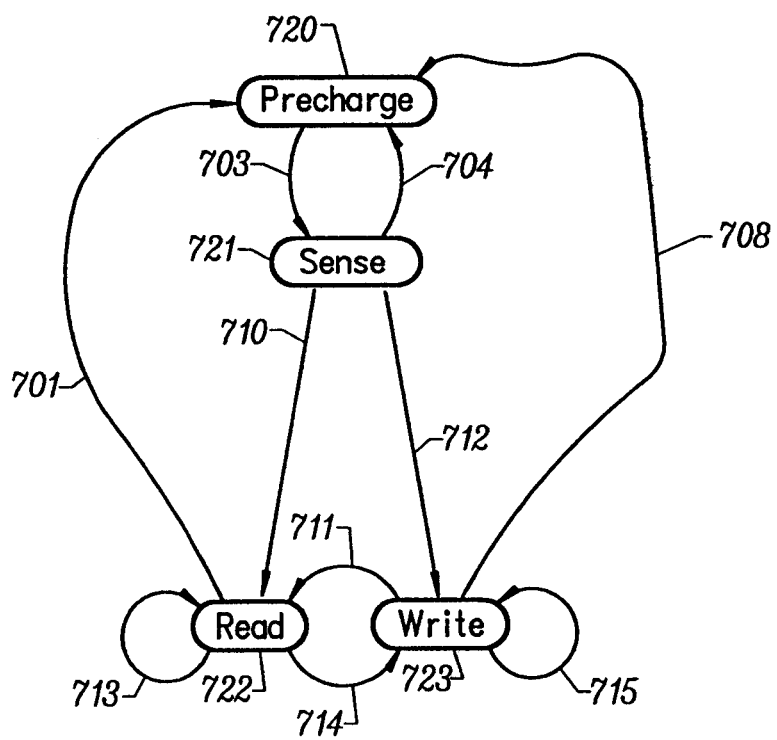
FIG. 7 illustrates operation sequences for a conventional core DRAM.
Figure 8:
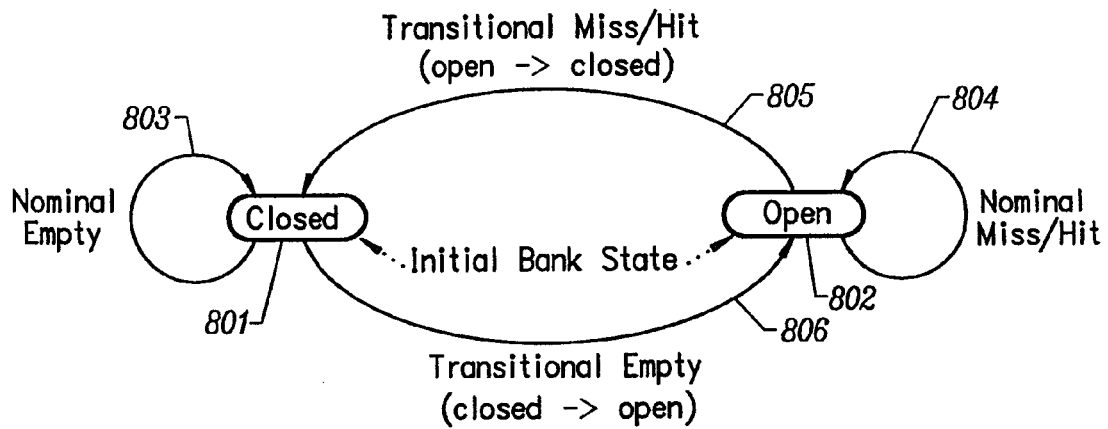
FIG. 8 illustrates initial and final bank states associated with a memory operation in accordance with the prior art.
Figure 9:
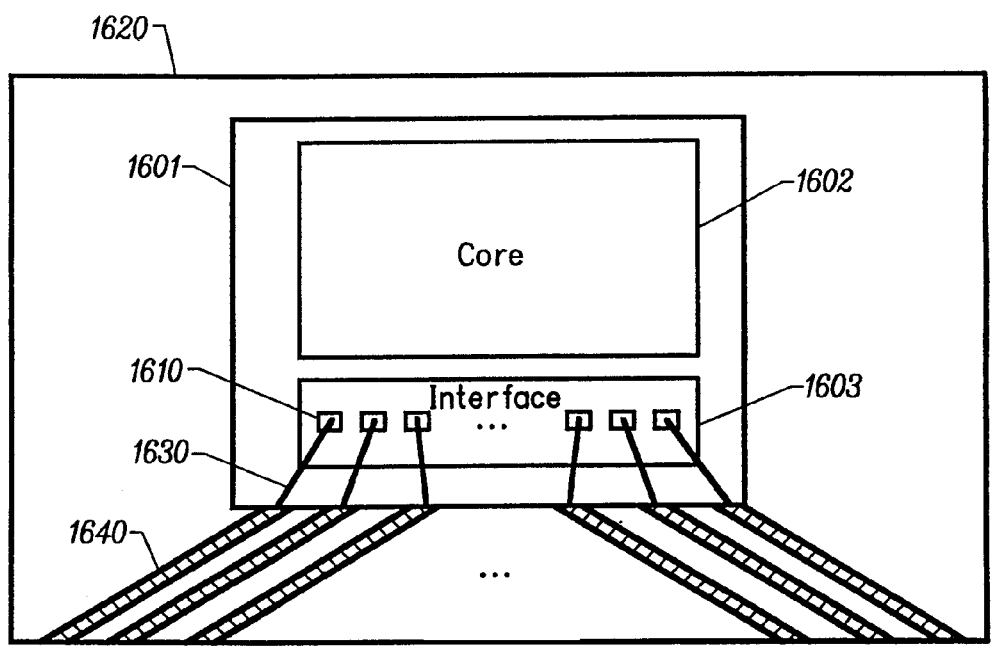
FIG. 9 illustrates a semiconductor packaging structure utilized in accordance with the prior art.
Figure 10:
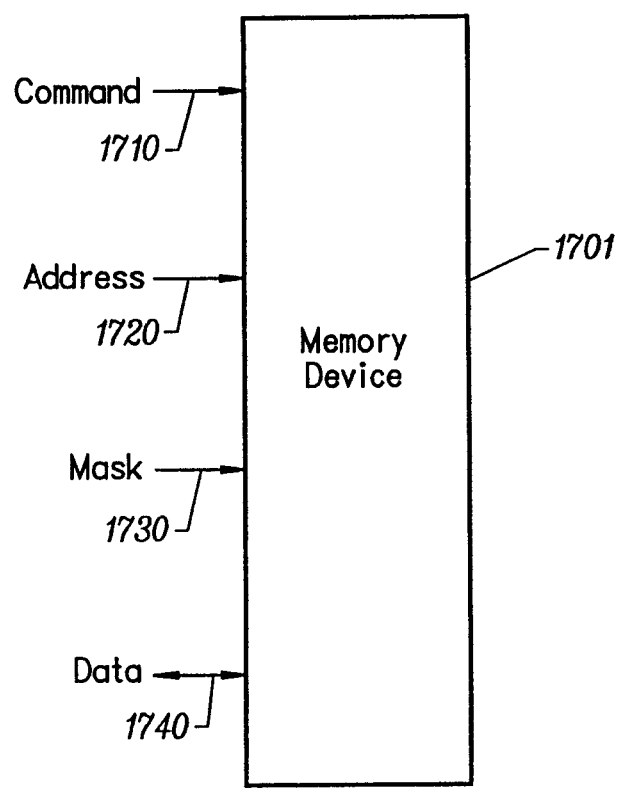
FIG. 10 illustrates DRAM interface signals in accordance with the prior art.
Figure 11:
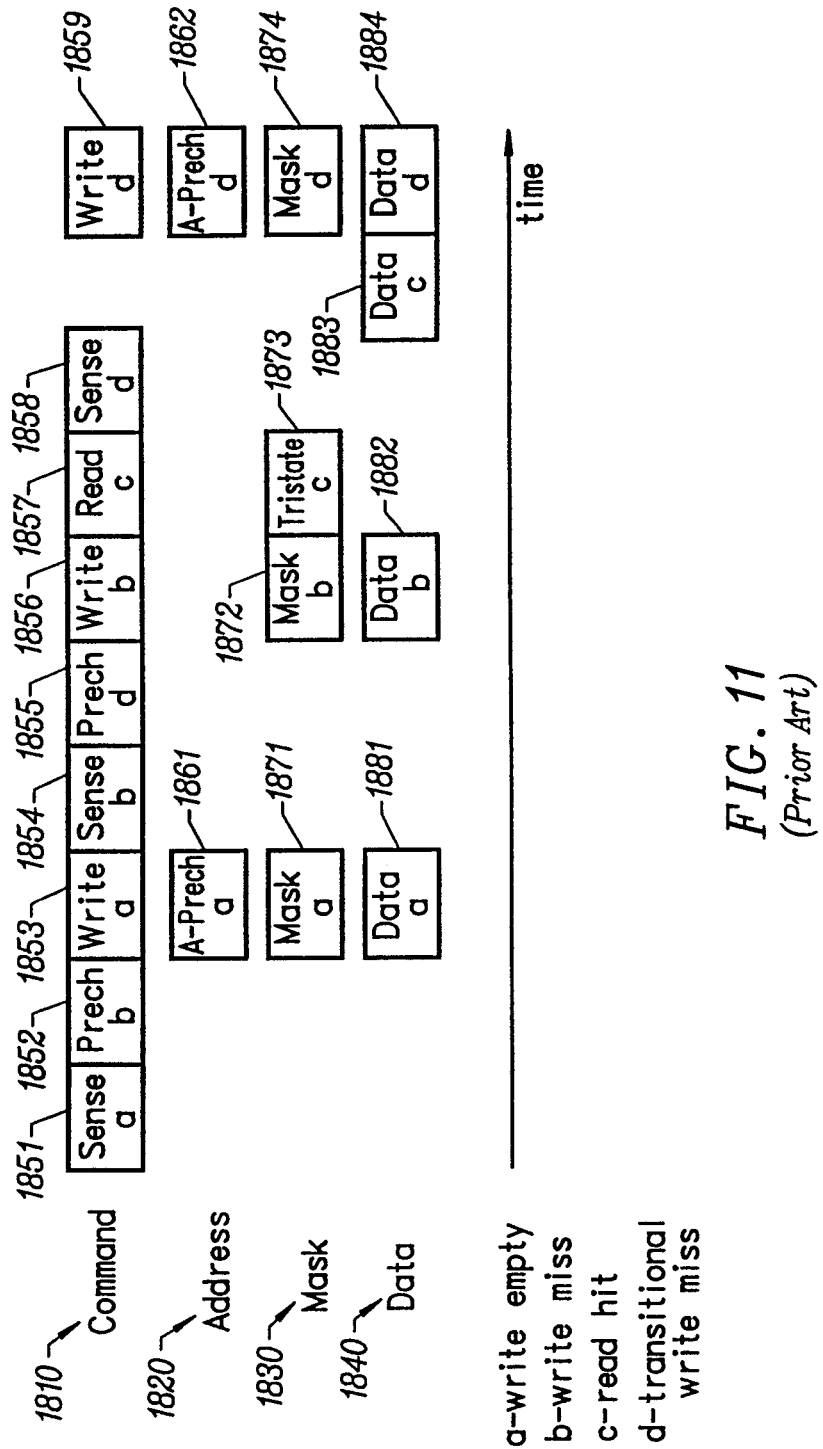
FIG. 11 illustrates a command control sequence in accordance with the prior art.
Figure 16:
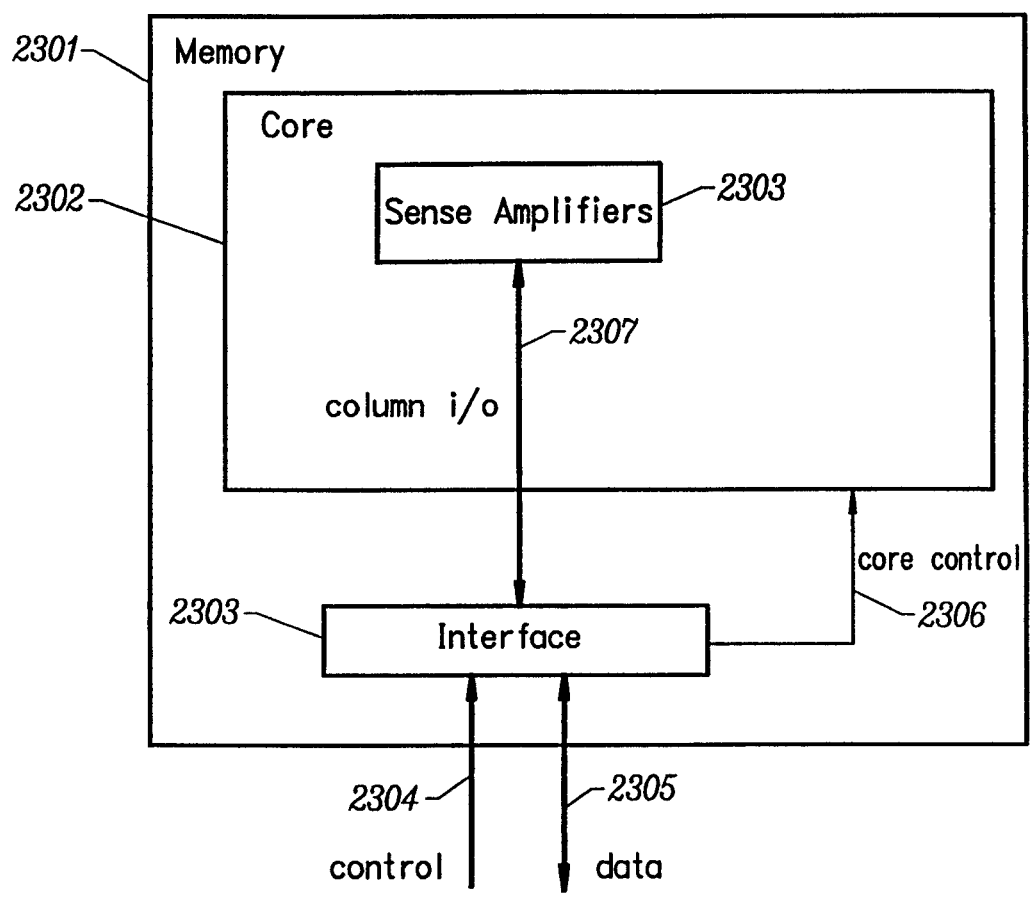
FIG. 16 illustrates a column access block diagram with no delayed write in accordance with an embodiment of the invention.

FIG. 16 shows the column access path of a memory device in an embodiment of the invention that does not delay write data with respect to read data. In FIG. 16, the delay from external control 2304 to internal column control 2306 is identical whether the access is a read or a write. As can be seen from FIG. 5 and FIG. 6, this means that the external data interconnect 2305 provides the data to the core prior to the write, while the external data interconnect is used after the core provides data for a read. In summary, a read uses resources in the order: (a) control interconnect 2304, (b) column i/o 2307, (c) data interconnect 2305. A write uses them in the order: (a) control interconnect 2304, (b) data interconnect 2305, (c) column i/o 2307.

Figure 17:
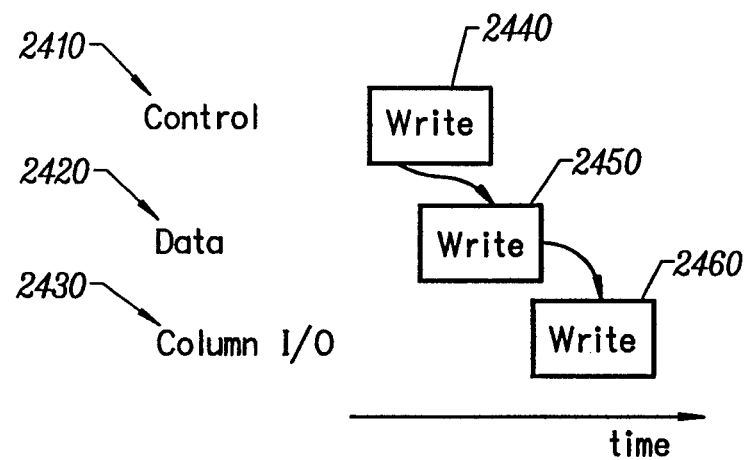
FIG. 17 illustrates timing operations associated with a write command of an embodiment of the invention.

This change in resource ordering gives rise to resource conflict problems that produce data bubbles when mixing reads and writes. The resource ordering of writes generally leads to the resource timing shown in FIG. 17. For example, a write uses resource as shown by block 2440, the data resource as shown by block 2450, and the column resource as shown by the block 2460. This resource timing minimizes the control logic and the latency of writing data into the memory core.

Figure 18:
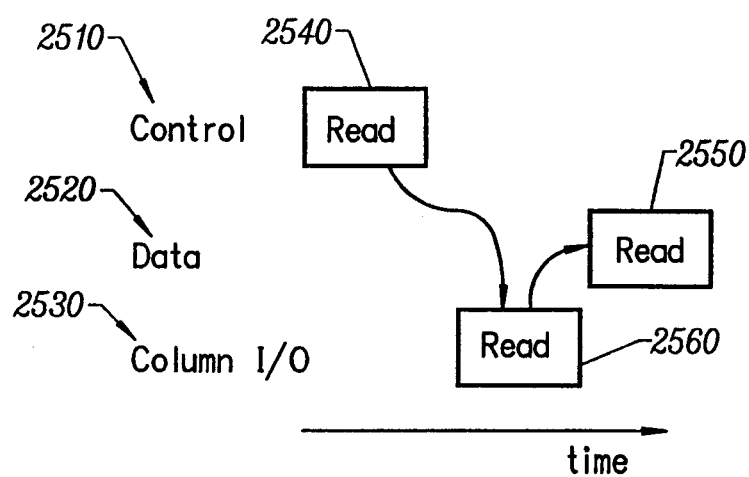
FIG. 18 illustrates timing operations associated with a read command of an embodiment of the invention.
Figure 19:
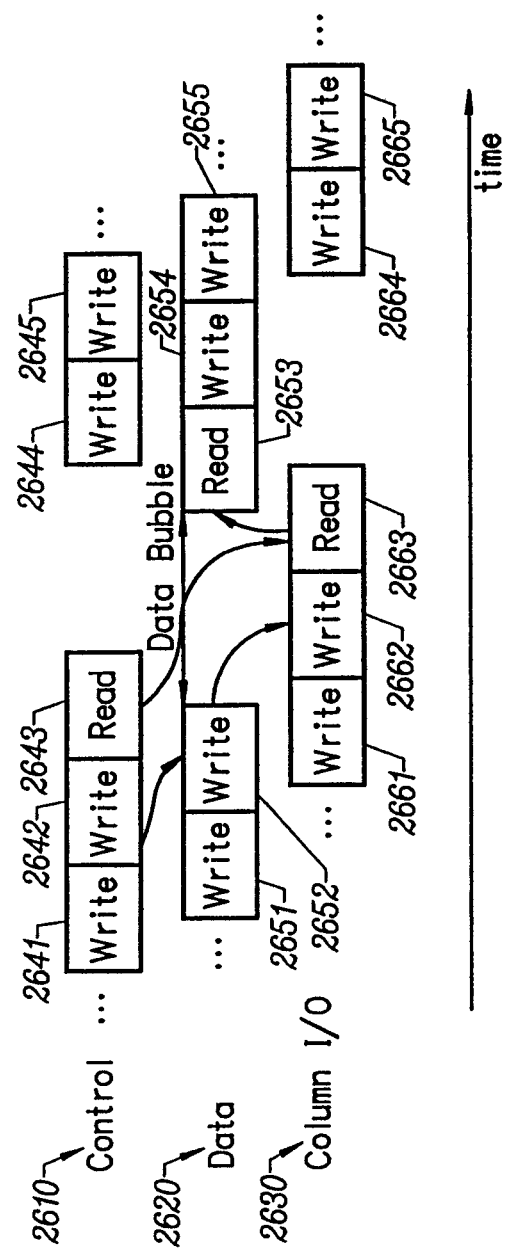
FIG. 19 illustrates mixed read and write timing in accordance with an embodiment of the invention.

The read resource timing of FIG. 18, illustrates a minimum latency read via block 2540, column i/o block 2560, and data block 2550. When these timings are combined as shown in FIG. 19, a data bubble is introduced between blocks 2652 and 2653 of FIG. 19. This data bubble constitutes time during which the data pins are not being utilized to transfer data; the pins are inactive. Forcing the data pins to do nothing as a result of mixing reads and writes is a problem.

Note that the data bubble appears regardless of whether the write 2642 and the read 2643 are directed to the same or different memory devices on the channel. Further note that the delay from the control resource to the column i/o resource is identical for reads and writes. In view of this, it is impossible for the data resource timing to be identical for reads and writes.

Matching the timing of the write-use of the data resource to the read-use of the data resource avoids the problem stated above. Since the use of the data pins in a system environment has an intrinsic turnaround time for the external interconnect, the optimal delay for a write does not quite match the delay for a read. Instead, it should be the minimum read delay minus the minimum turnaround time. Since the turnaround delay grows as the read delay grows, there is no need to change the write control to data delay as a function of the memory device position on the channel.

Figure 20:
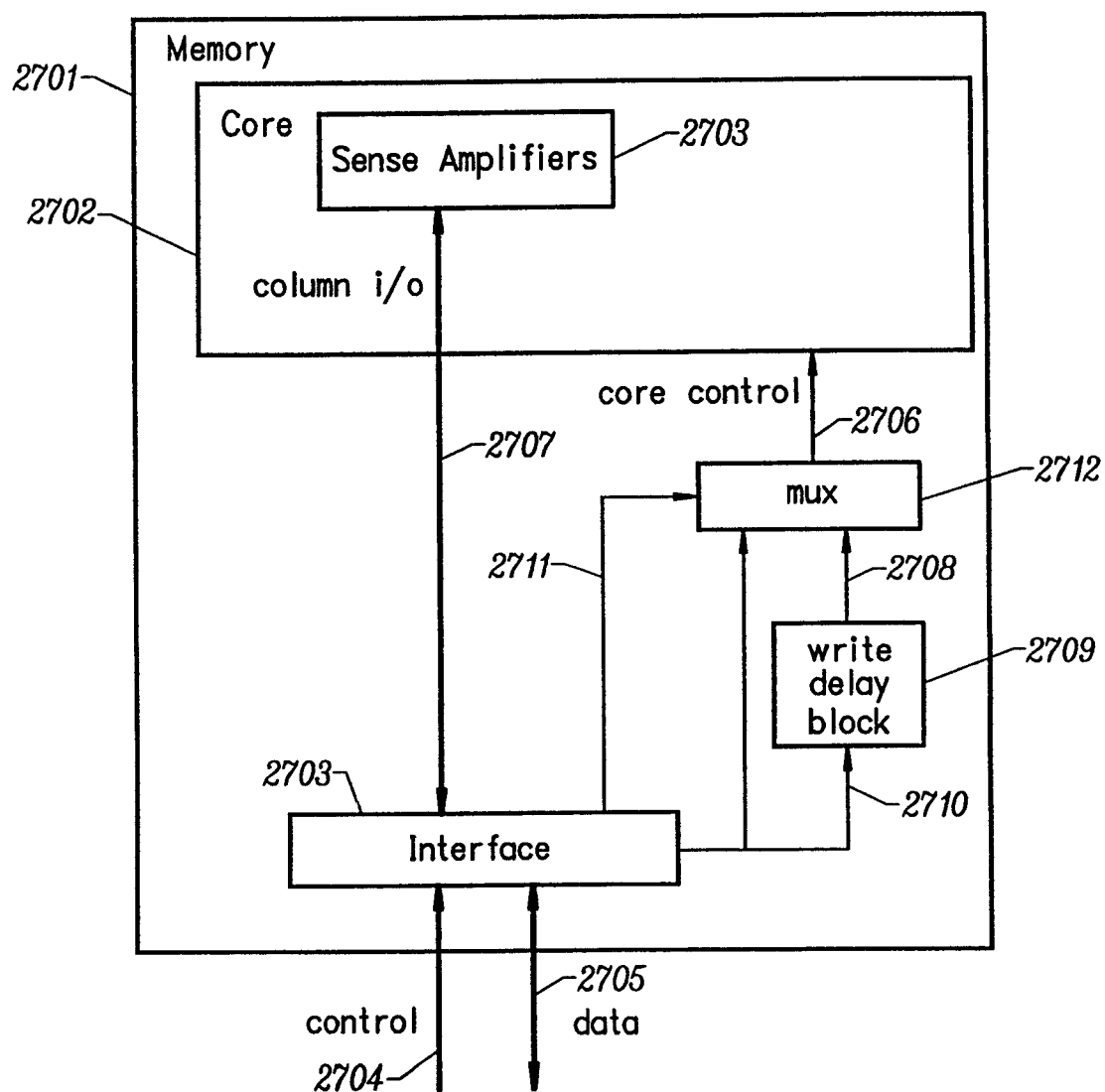
FIG. 20 illustrates a column access with a delayed write in accordance with an embodiment of the invention.

FIG. 20 shows an embodiment of the invention having delayed write circuitry. The column access control information on line 2706 is delayed for writes relative to when the column control information is presented to the core for reads. FIG. 20 shows multiplexor 2712 which selects between the write delay block 2709 and the normal column control output of the interface. The interface controls the multiplexor depending upon whether the transfer is a read or a write.

However, there are many embodiments of this mechanism. For example, a state machine could introduce new delaying state transitions when the transfer is a write.

FIG. 21 shows the operation of delaying the write to match the read in accordance with the present invention. In this figure, the delay from write control block 2842 to write data block 2852 is set to match the delay from read control 2843 block to read data 2853 block less the channel turnaround time. As long as different column data paths are used to perform the read column cycle and the write column cycle, the data bubble is reduced to the minimum required by channel turnaround requirements and is no longer a function of control or data resource conflicts.

Since write latency is not an important metric for application performance, as long as the write occurs before the expiration of $t_{RAS,MIN}$ (so that it does not extend the time the row occupies the sense amplifiers, which reduces application performance), this configuration does not cause any loss in application performance, as long as the writes and reads are directed to separate column data paths.

Delayed writes help optimize data bandwidth efficiency over a set of bidirectional data pins. One method adds delay between the control and write data packets so that the delay between them is the same or similar as that for read operations. Keeping this "pattern" the same or similar for reads and writes improves pipeline efficiency over a set of bidirectional data pins, but at the expense of added complexity in the interface.

FIG. 22 shows that the offset between write data 2984 block and read data 2985 block has been reduced by 2 units of time, compared to the analogous situation of FIG. 15.

Split Control Resources

Figure 23:
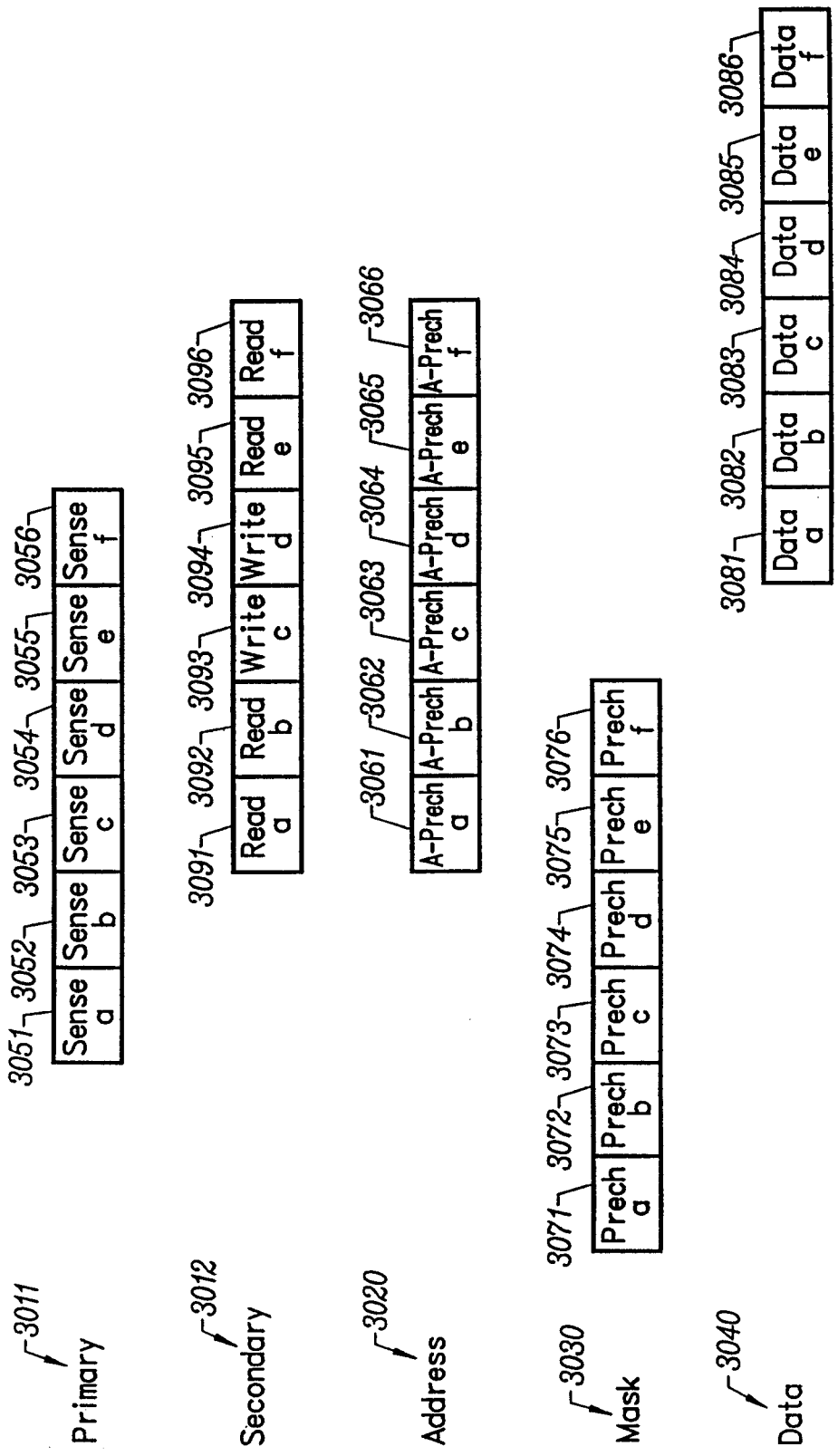
FIG. 23 illustrates a split control universal read write sequence with mask precharge and delayed write in accordance with an embodiment of the invention.

FIG. 22 shows less than full utilization of the data interconnect due to the overloaded use of the command pins 2910. The command pins can be partitioned so that these operations are delivered to the device in an independent fashion. The timing of such a control method is shown in FIG. 23 where the unified control has been partitioned into fields of control information, labeled primary field 3011 and secondary field 3012. Generally speaking the primary control pins can be used to control the sense operation while the secondary control pins control read or write operations. An embodiment of the present invention allows full utilization of the data pins and can transfer minimum size data blocks back-to-back, for any mix of reads or unmasked writes, for any mix of hits, misses, or empty traffic, to or from any device, any bank, any row, and any column address with only bank conflict, channel turnaround at the write-read boundaries, and 2nd order effects such as refresh limiting the data channel utilization. With the addition of more interconnect resources the writes could be masked or unmasked. Observe that FIG. 23 presumes that the memory device is designed for an interconnect structure that has zero turnaround delay between writes and reads.

Figure 24:
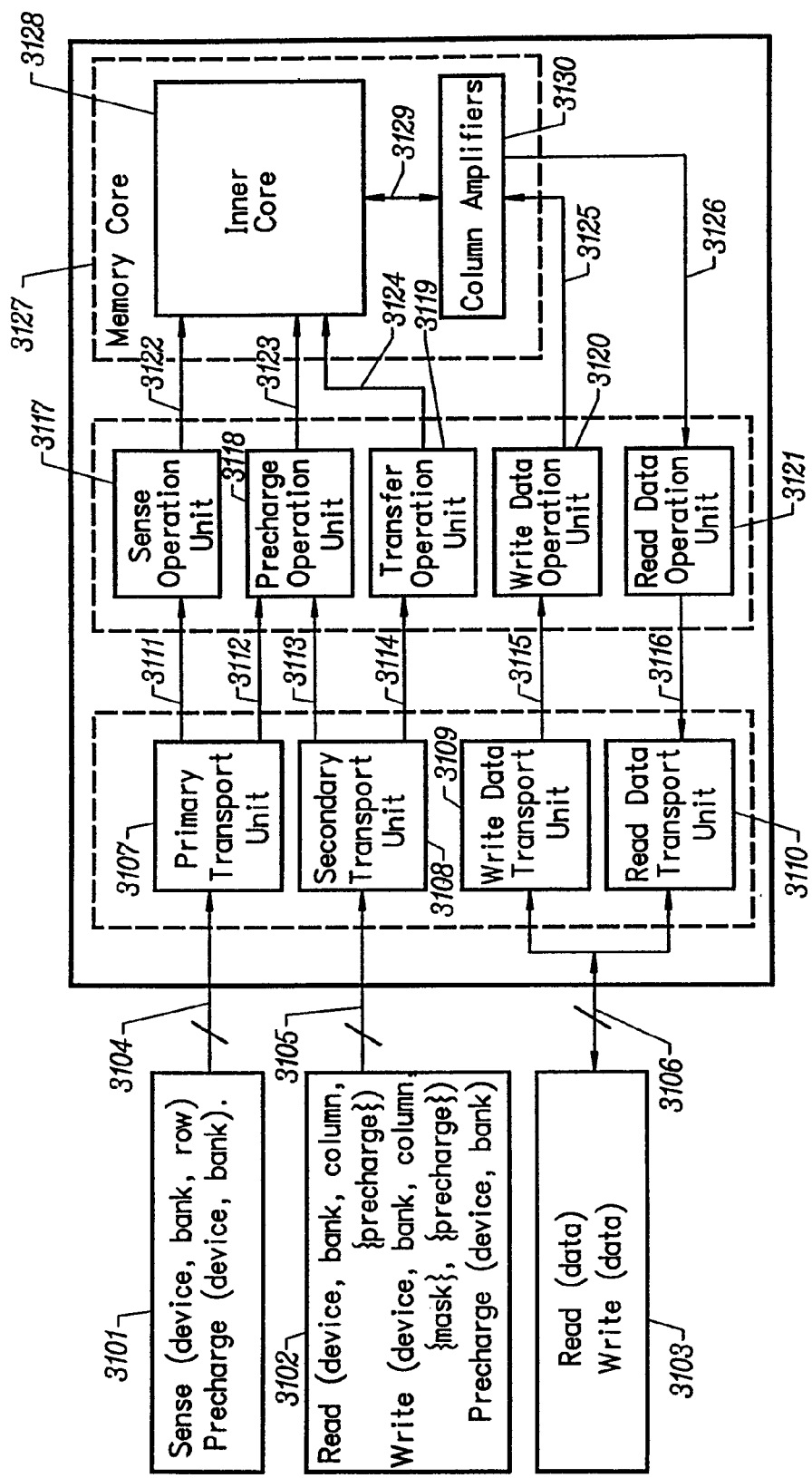
FIG. 24 illustrates a cost optimized highly concurrent memory in accordance with the invention.

FIG. 24 shows an embodiment of the invention that has separate control interconnect resources. In one embodiment it uses delayed writes. In another embodiment it can alternately specify either a masking or a precharge field, either singly or in conjunction with another field. In another embodiment it combines delayed writes and the masking versus precharge. In an alternative embodiment according to the present invention there are three methods for starting a precharge operation in the memory core:
  in the sense operation field on the primary control lines 3104, as an alternative to the sense information;
  in the mask field on the secondary control lines, 3105 as an alternative to the mask information; and
  according to the device and bank addresses specified in a read or a write.

Figure 25:
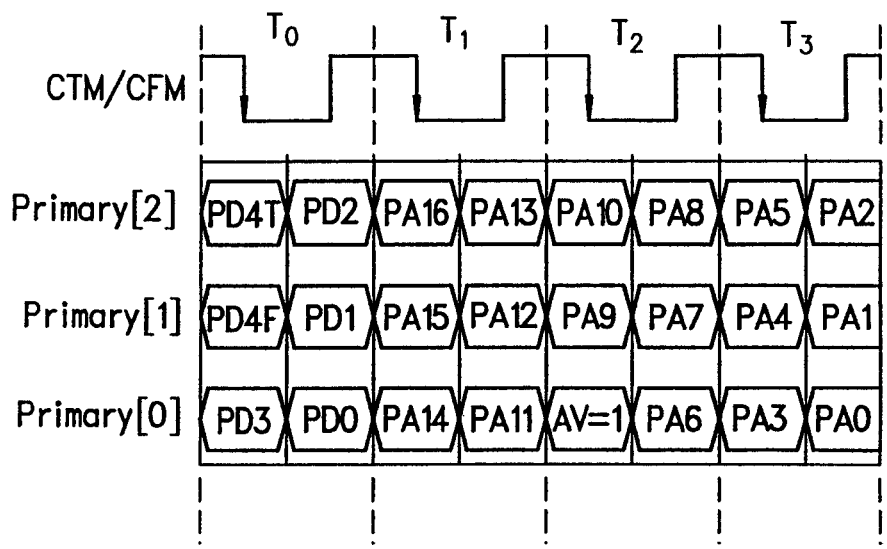
FIG. 25 illustrates a control packet format for encoding the sense operation on the primary control lines in accordance with an embodiment of the invention.
Figure 26:
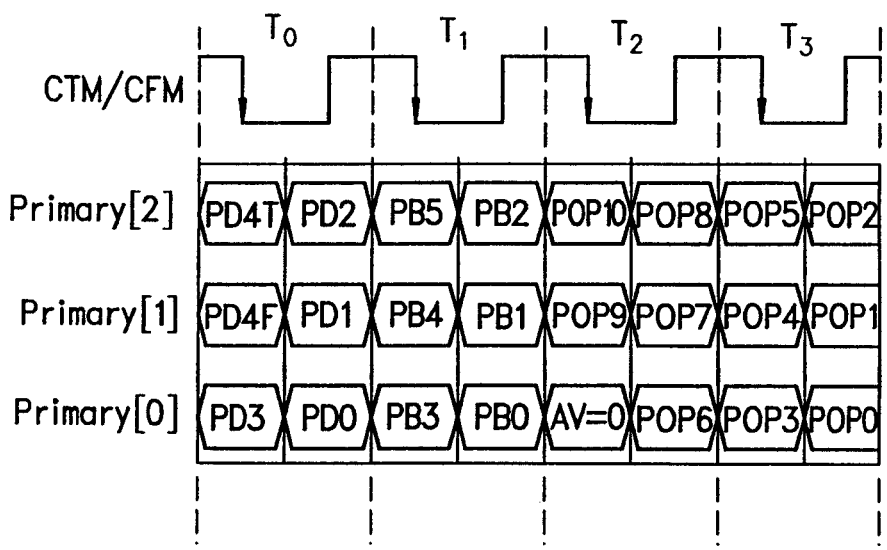
FIG. 26 illustrates a control packet format for encoding the precharge operation on the primary control lines in accordance with an embodiment of the invention.

The benefit of the present invention according to a specific embodiment is shown in Table 4 and FIG. 25 and FIG. 26. Table 4 shows the specific logical pinout of the embodiment of FIG. 24 to be used for this illustrative purpose.

TABLE 4

High Performance Logical Pin Description

| Name | Count | Description | FIG. 24 Reference |
|---|---|---|---|
| Primary[2:0] | 3 | Primary request control | 3104 |
| Secondary[4:0] | 5 | Secondary request control | 3105 |
| DQA[8:0] | 9 | Low order data byte | 3106 |
| DQB[8:0] | 9 | High order data byte | |

FIG. 25 and FIG. 26 show two alternative control packet formats for encoding, respectively, the sense and precharge operations on the primary control lines. Table 5 defines the fields in the alternative formats of the primary control packet. The PD field selects a specific memory device. A combined field carries both the bank and row address arguments of the sense operation, as previously defined.

TABLE 5

Primary Control Packet Fields

| Field | Description |
|---|---|
| PD4T | Device selector bit 4 True; for framing, device selection and broadcasting. |
| PD4F | Device selector bit 4 False; for framing, device selection and broadcasting. |
| PD[3:0] | Device selector, least significant bits. |
| AV | Activate row; also indicates format of packet. |
| PA[16:0] | Address; combining bank and row. |
| PB[5:0] | Bank address |
| POP[10:0] | Opcode of the primary control packet. |

Figure 27:
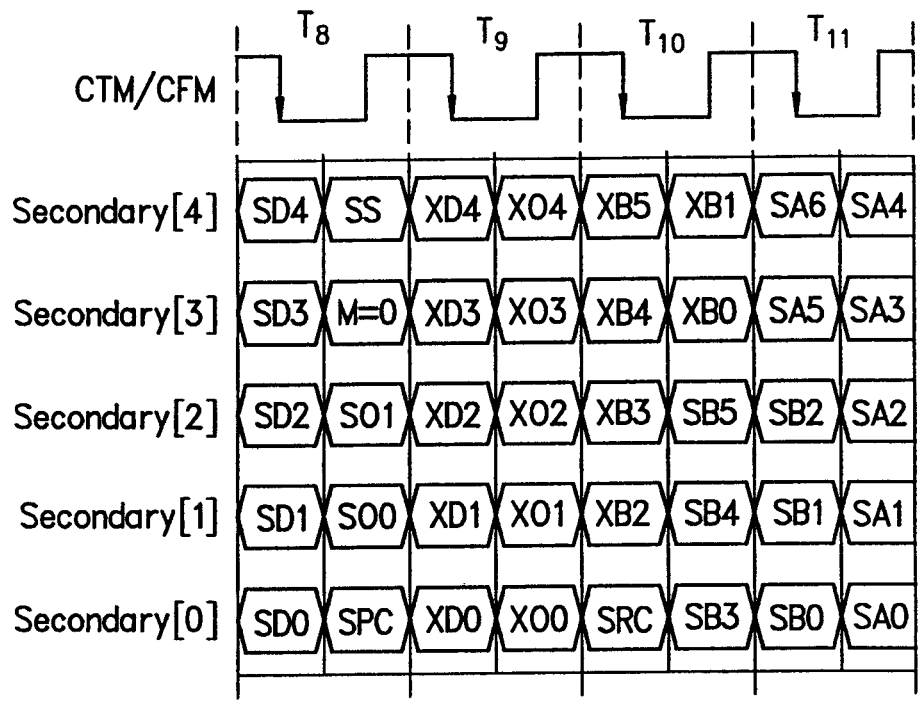
FIG. 27 illustrates a packet format when masking is not used on the secondary control lines of the invention.
Figure 28:
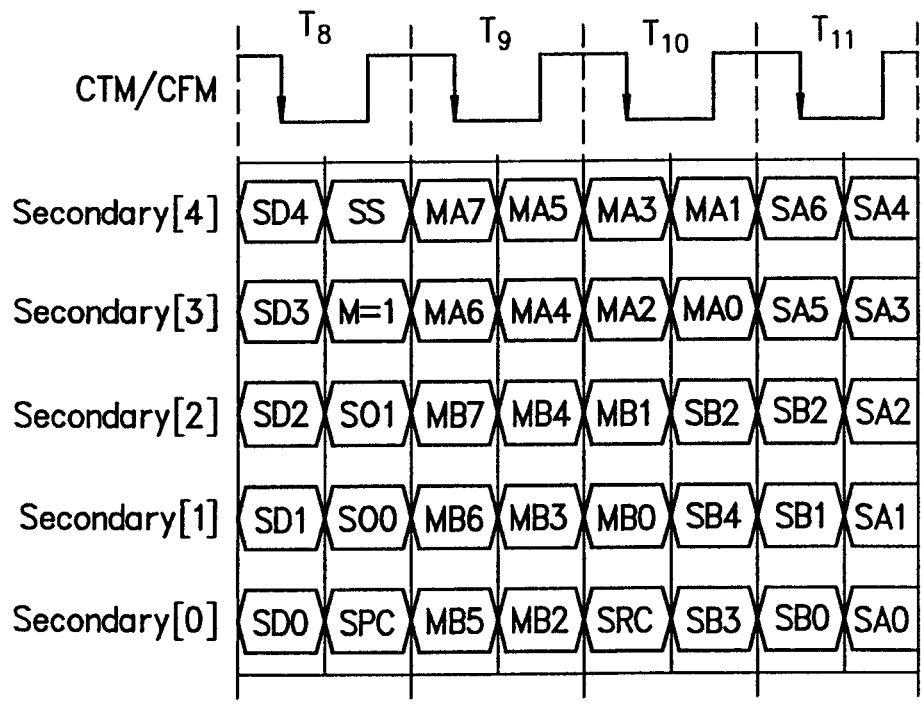
FIG. 28 illustrates a packet format when masking is used on the secondary control lines of the invention.

FIG. 27 and FIG. 28 show two alternative control packet formats for encoding various operations on the secondary control lines. FIG. 27 shows the packet format when masking is not being performed while FIG. 28 shows the format when masking is being performed. Table 6 defines the fields in either format of the secondary control packet. Packet framing is accomplished via a framing bit. The M field is used to indicate which format of the packet is being presented as well as indicating whether write data being written to the core should be masked. The SO field indicates whether a read or write operation should be performed. Device selection for SO specified operations is accomplished according to the SD field which is compared against an internal register that specifies the device address. The SA field encodes the column address of a read or write operation. The SB field encodes the bank address of a read or write operation. If the SPC field indicates precharge, then the precharge operation uses the SD device and SB bank address. The SRC field is used for power management functions. The MA and MB fields provide a byte masking capability when the M field indicates masking. The XO, XD, and XB fields provide the capability to specify a precharge operation when the M field does not indicate masking. Note that, unlike the SPC field, this specification of a precharge has a fully independent device, XD, and bank address, XB, that is not related to the read or write operations.

Figure 29:
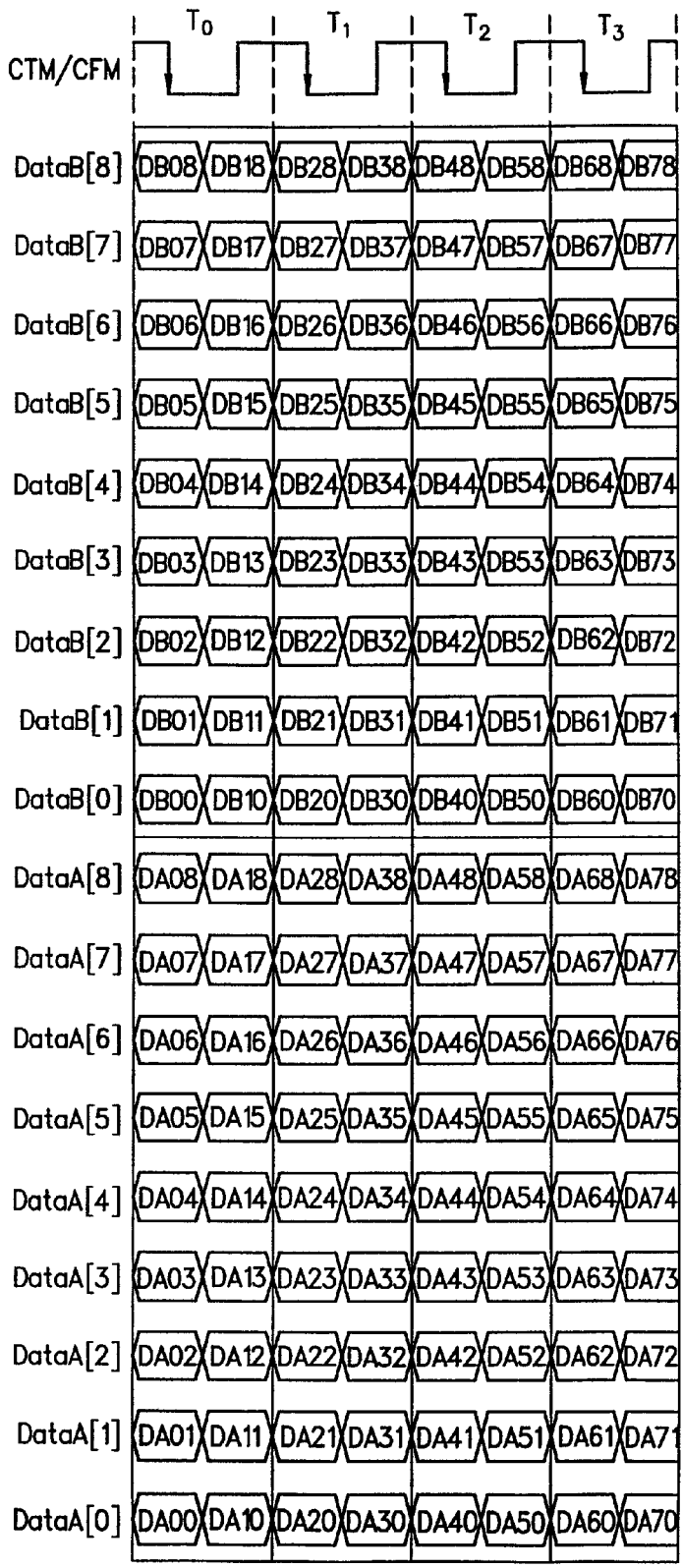
FIG. 29 illustrates a data block timing diagram for data packets transmitted on data wires of the invention.

FIG. 29 shows the format of the data packet transmitted on the data wires.

TABLE 6

Secondary Control Packet Fields

| Field | Description |
| --- | --- |
| SD[4:0] | Device selector for Column Operation |
| SS = 1 | Start bit; for framing |
| M | Mask bit, indicates if mask format is being used |
| SO[1:0] | Secondary Operation code |
| SPC | Precharge after possible Column Operation |
| SRC | Power management |
| SA[6:0] | Address for Column Operation |
| SB[5:0] | Bank for Column Operation |
| MA[7:0] | Byte mask for lower order bytes |
| MB[7:0] | Byte mask for higher order bytes |
| XD[4:0] | Device selector for Extra Operation |
| XO[4:0] | Extra Operation code |
| XB[5:0] | Bank for Extra Operation |

Figure 45:
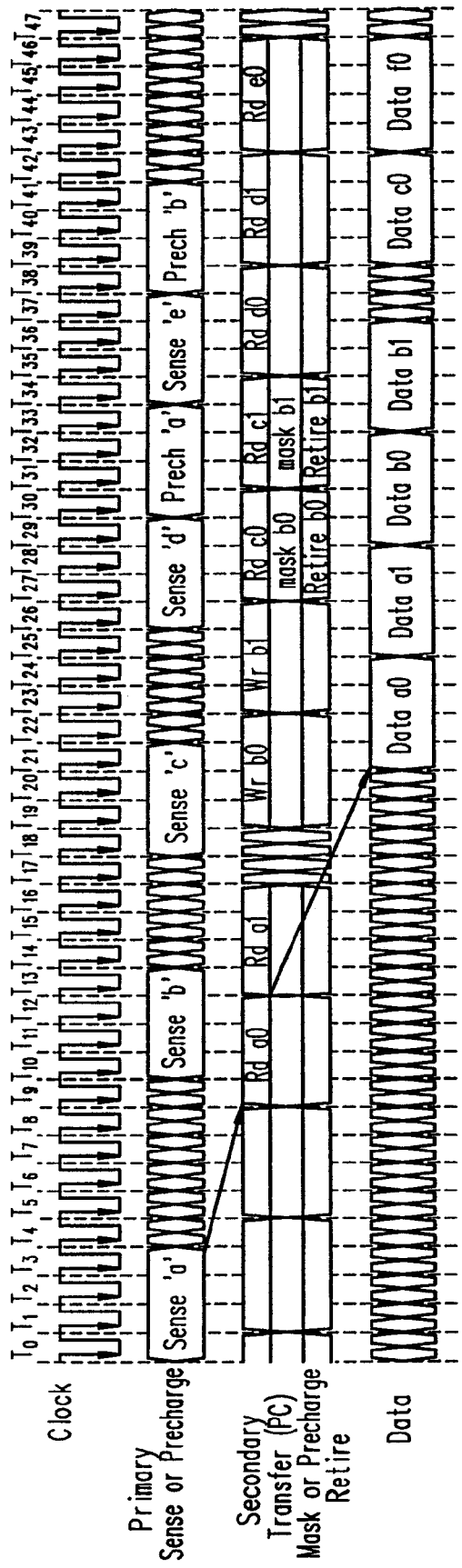
FIG. 45 illustrates transfers using a primary control packet for sense and precharge in accordance with an embodiment of the invention.

The operation of this embodiment can be most easily understood through various timing diagrams as shown in FIG. 30 through FIG. 45. These figures can be divided into several series, each of which depicts different aspects of this embodiment's operation:

FIG. 30 through FIG. 35 show a basic operation as an embodiment of the present invention, other operations can be thought of as compositions of these basic operations;

FIG. 36 through FIG. 39 show compositions of the basic operations but distinct from notions of the universal sequence;

FIG. 40 through FIG. 43 show operations according to the universal sequence, these figures demonstrate the ability of the embodiment to handle mixed read and write with mixed hit, miss, and empty traffic without control resource conflicts; and FIG. 44 through FIG. 45 show operations according to the universal sequence demonstrating less control conflicts than the prior art. Other control scheduling algorithms are possible which seek to minimize other metrics, such as service time, with or without compromising effective bandwidth.

The nominal timings for the examples are shown in Table 7.

TABLE 7

Nominal Timings

| Symbol | Value (ns) |
| --- | --- |
| $t_{RP}$ | 20 |
| $t_{RAS, min}$ | 60 |
| $t_{RCD}$ | 20 |
| $t_{CAC}$ | 20 |

A description of each of the timing diagrams follows.

Figure 30:
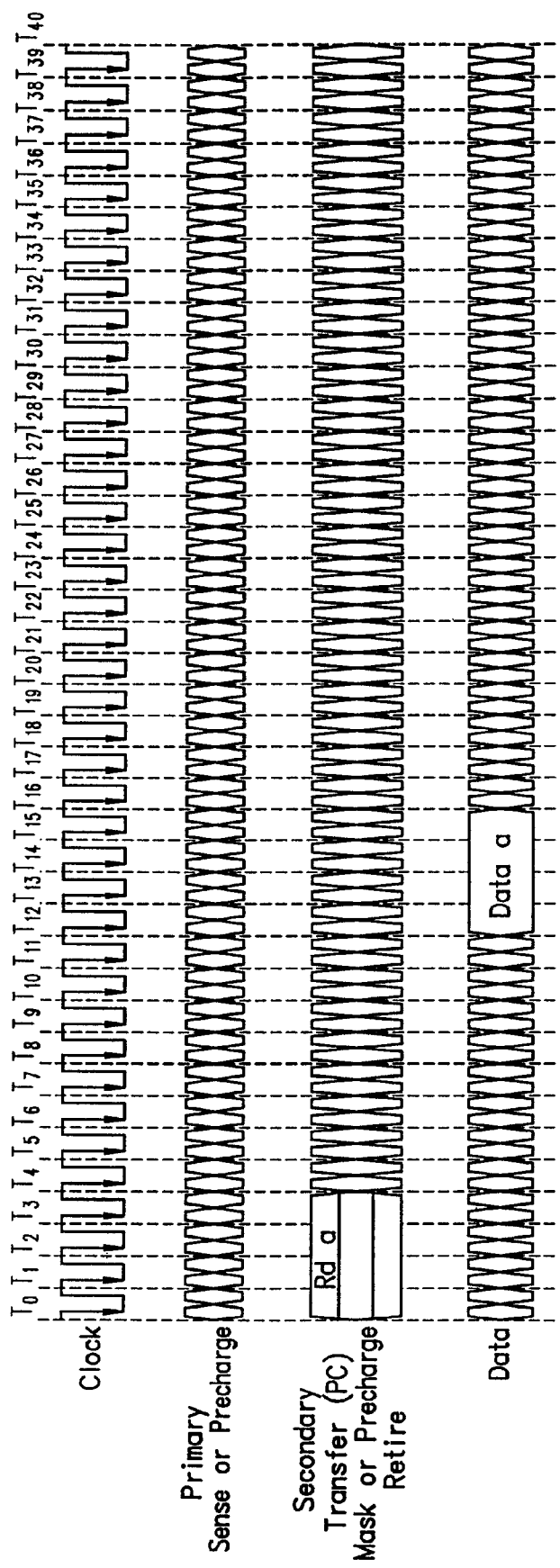
FIG. 30 illustrates a read hit in accordance with an embodiment of the invention.

FIG. 30 shows a timing diagram for a nominal read hit. Recall that a nominal hit reference means that the beginning and final state of the addressed bank is open and that the appropriate row is already in the sense amplifiers of the addressed bank. In this case no row operation is required. The secondary control packet specifies the read operation, device address, bank address, and column address. Sometime later, the read data is driven on the data pins. In an embodiment according to the present invention it as a constant time, later fixed by the design of the memory device.

Figure 31:
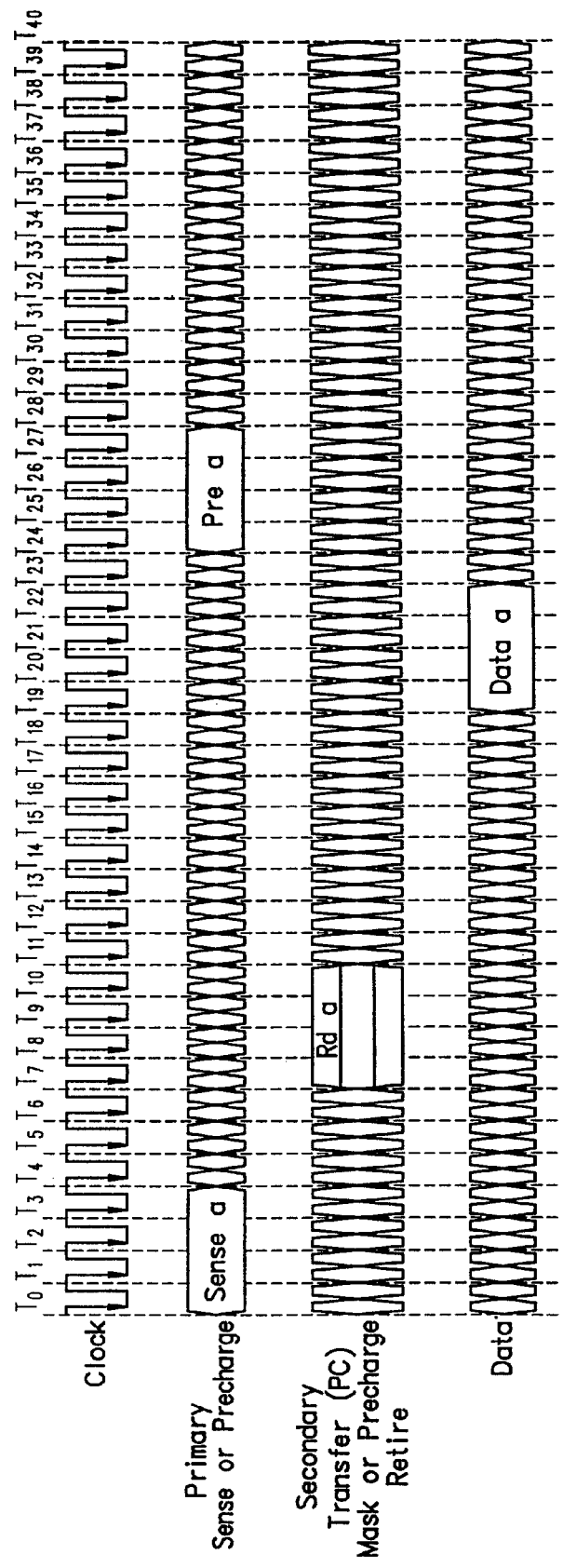
FIG. 31 illustrates an empty read in accordance with an embodiment of the invention.

FIG. 31 shows a timing diagram for a nominal read empty. Recall that a nominal empty reference means that the beginning and final state of the addressed bank is closed. In order to transfer data, the addressed bank is first sensed, and then, after $t_{RCD}$, the read operation takes place just as for the read hit of FIG. 30. Note that this particular example shows the precharge occurring using the primary control packet precharge mechanism. Alternately, other precharge mechanisms are used, since there are no other references contending for the control resources.

Figure 32:
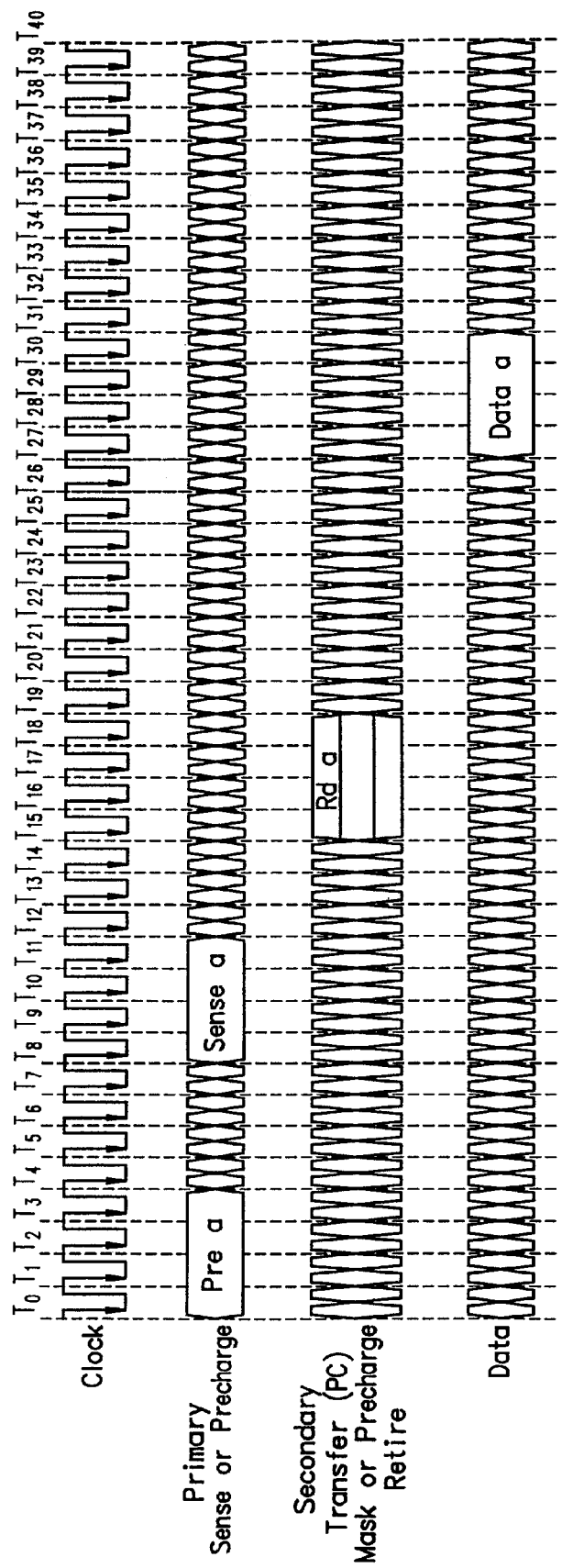
FIG. 32 illustrates a read miss in accordance with an embodiment of the invention.

FIG. 32 shows a timing diagram for a nominal read miss. Recall that a nominal miss reference means that the beginning and final state of the addressed bank is open, but that the row currently sensed in the bank is not the one addressed by the application reference. In this case, a precharge operation occurs, followed by a sense operation, and finally a read operation that causes the proper data to be driven out on the data pins. Any precharge mechanisms can be used.

Figure 33:
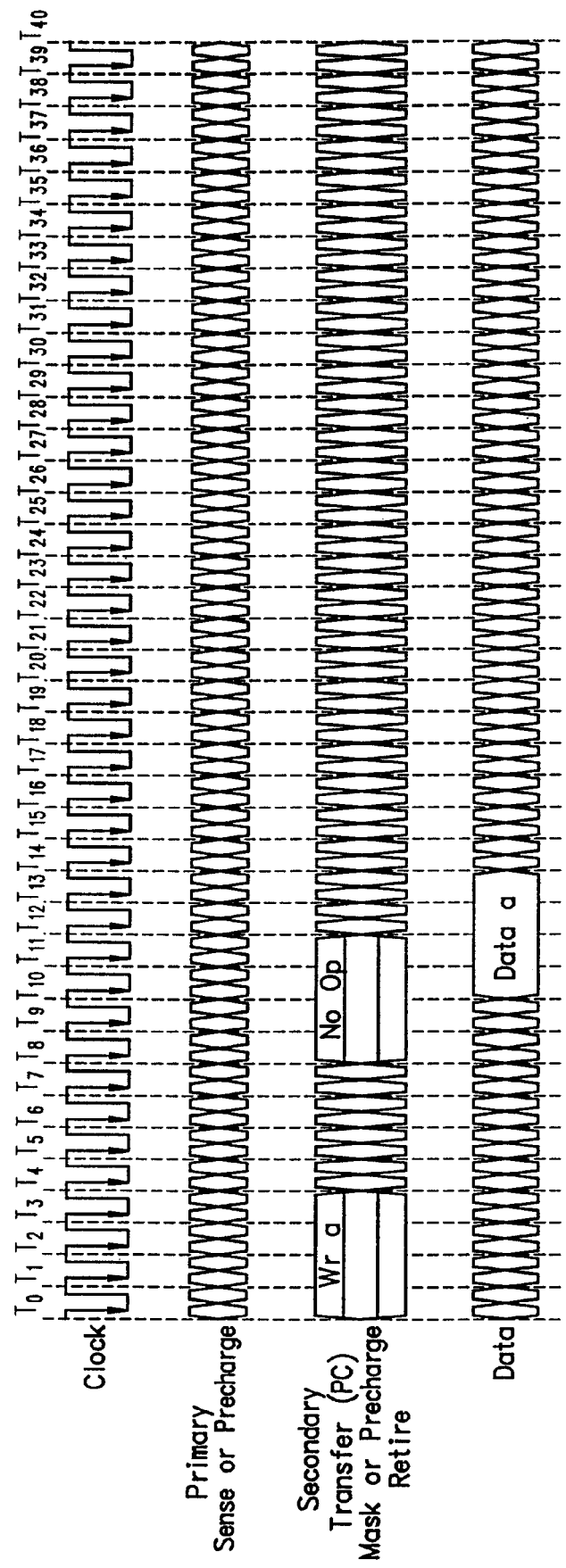
FIG. 33 illustrates a write hit in accordance with an embodiment of the invention.

FIG. 33 shows a nominal write hit. The figure relates to a multistep write operation. Thus, there is a secondary control packet in order to get the transported data sent all the way into the memory core. This second secondary control packet provides a timing reference that indicates to the memory device that it is time to send the data to the core.

Figure 34:
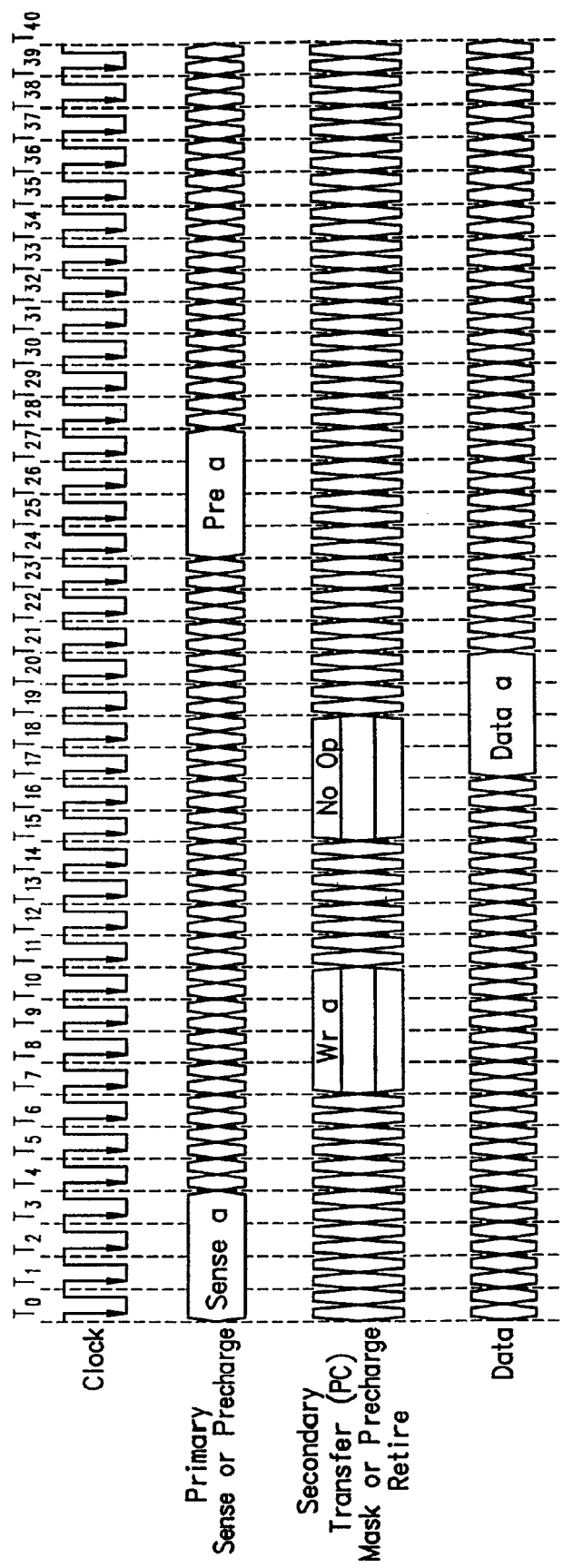
FIG. 34 illustrates an empty write in accordance with an embodiment of the invention.

FIG. 34 shows a timing diagram for a nominal write empty. A write empty operation is a combination of the actions needed for a read empty and a write hit. First, a sense operation is performed, followed by a write operation, including the secondary control packet, followed by some precharge operation, although a primary precharge operation is shown.

Figure 35:
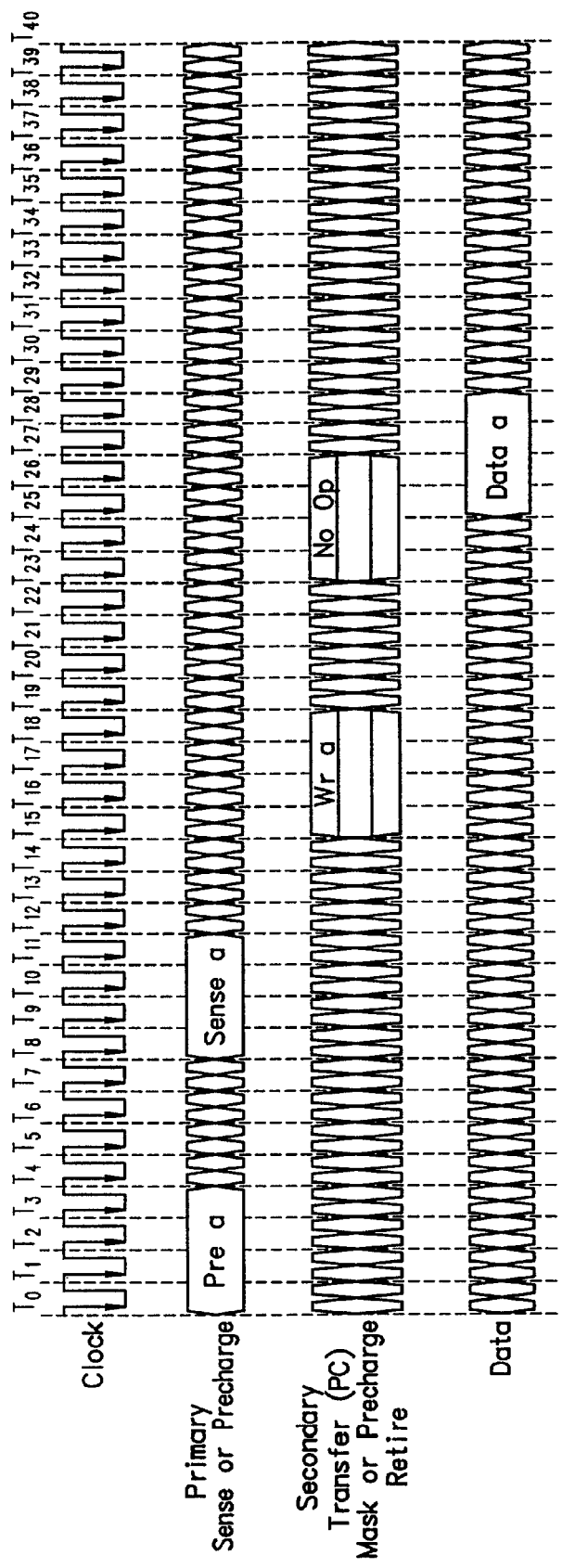
FIG. 35 illustrates a write miss in accordance with an embodiment of the invention.

FIG. 35 illustrates a timing diagram for a nominal write miss. Write miss operation is a combination of the actions needed for a read miss and a write hit. First, a precharge operation is invoked; a primary precharge operation is shown. A sense operation follows, along with the two secondary control packets needed to write the data all the way to the memory core.

Figure 36:
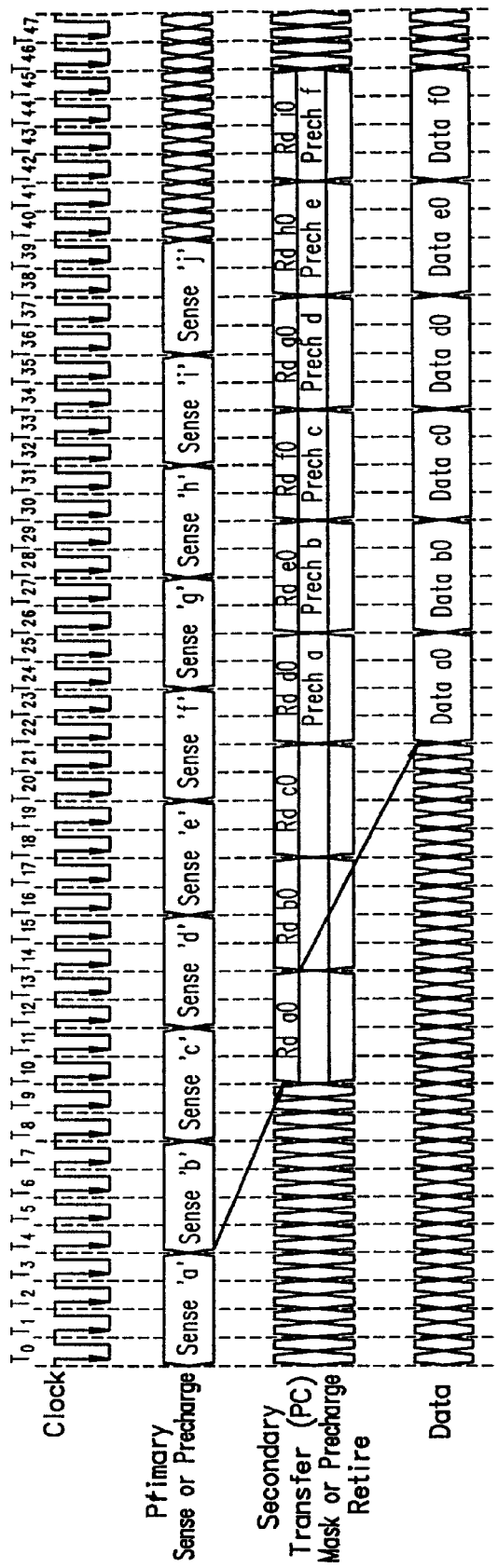
FIG. 36 illustrates reads in accordance with an embodiment of the invention.

The previous figures show how various application references can be decomposed into the memory operations. FIG. 36 illustrates how one of these isolated references can be used for a sequence of memory references. In FIG. 36 a sequence of nominal read empty references is shown. In this case the XO precharge operation is used to perform the close operation at the end of the sequence. The present invention thus provides another precharge mechanism that neither overloads the external control pin resources, nor adds logic to the memory device.

Figure 37:
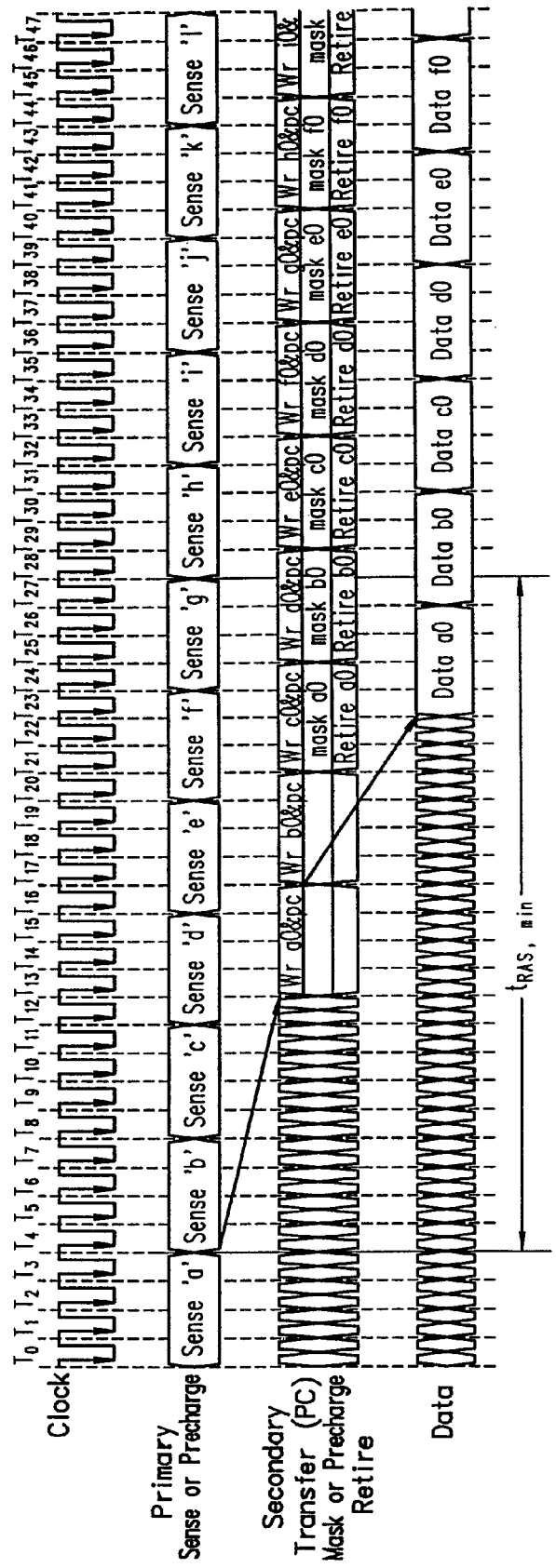
FIG. 37 illustrates empty byte masked writes in accordance with an embodiment of the invention.

FIG. 37 shows timing for a series of nominal masked write empty references. In this case, the XO precharge operation is not available because those control pin resources are being used to supply the mask information. Instead, the SPC field is used in order to avoid bubbles, since the primary control pins are already committed to the series of sense operations. Presuming that the delay between sense and write operations is such that write read conflict problems are being avoided, as shown with the previous discussion on delayed writes, there is no real penalty for using the SPC field. This is different from reads, which would normally complete, and which desire to complete, sooner. This asymmetry between reads and writes leads to the cost reductions of the present invention by reducing required control bandwidth, while minimally impacting application performance.

Figure 38:
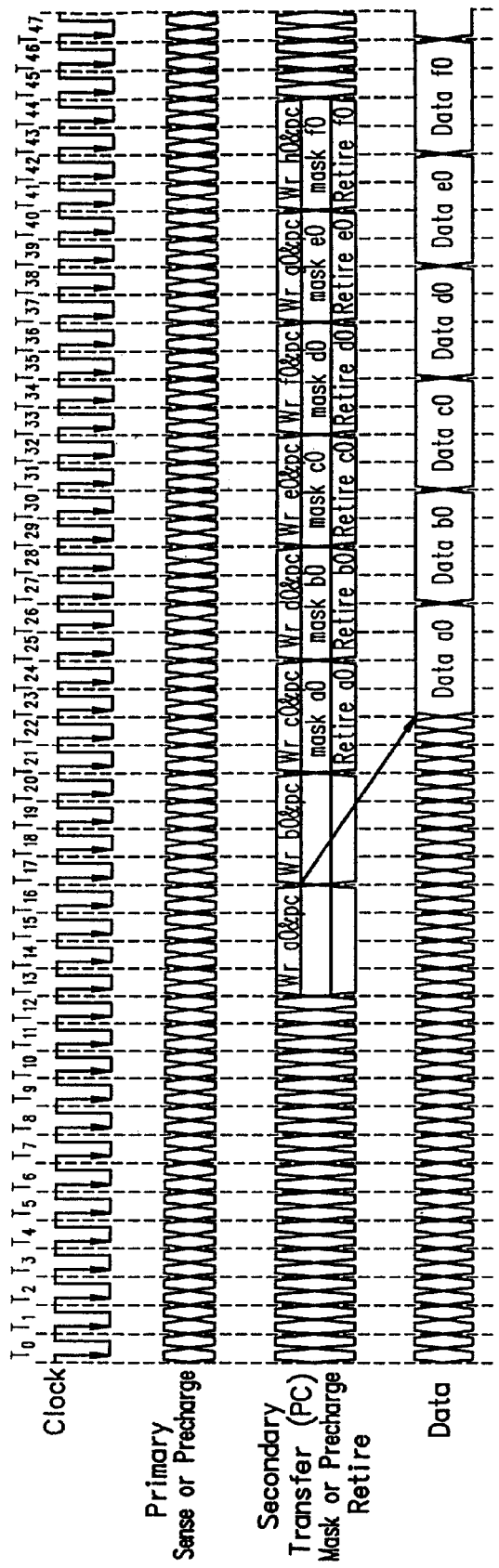
FIG. 38 illustrates byte masked write hits in accordance with an embodiment of the invention.

FIG. 38 shows a series of nominal masked write hit references. Note that although two secondary control packets were required to fully write data into the memory core for an isolated reference the average number needed is about one.

Figure 39:
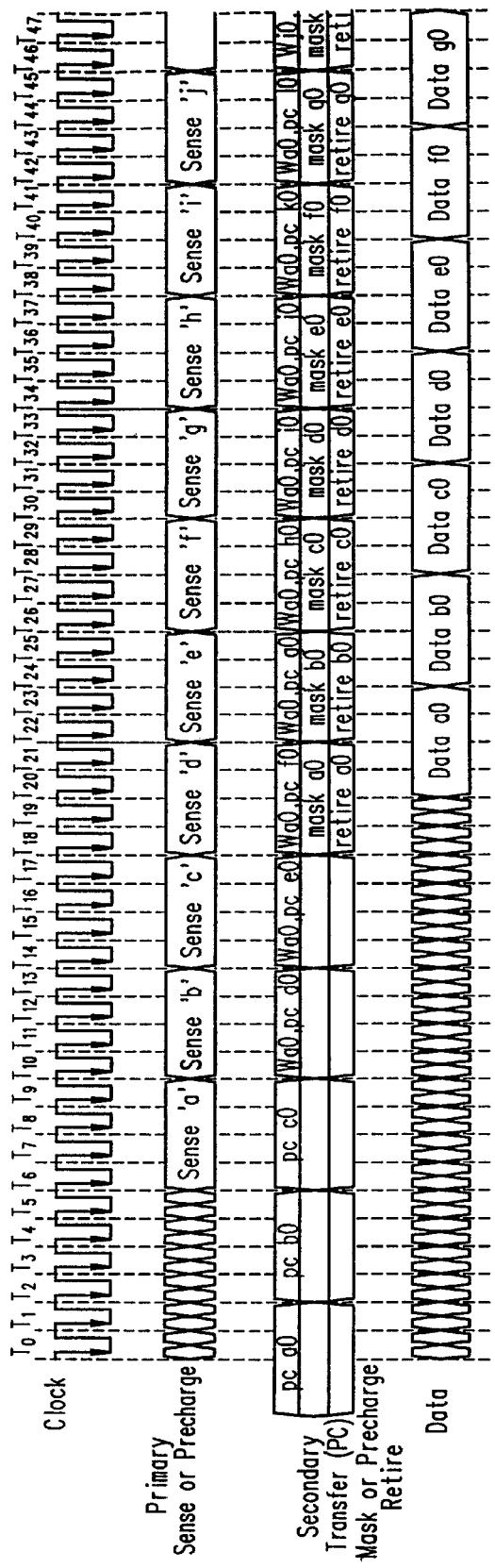
FIG. 39 illustrates byte masked write misses in accordance with an embodiment of the invention.

FIG. 39 shows a timing diagram for a series of masked writes misses. In this example the SPC field is used to precharge the bank. Such a sequence is useful in a graphics application which varies the length of time it keeps any bank open depending upon the amount of rendering to be done. If more than one transfer is directed to the same row of the same bank of the same device then some of the SPC precharge operations and the corresponding sense operations can be removed. This is useful both to eliminate unnecessary (precharge, sense) power but also to reduce the effective number of independent banks required to sustain the effective bandwidth, even when bank conflicts might occur.

FIG. 40 shows a timing diagram for the universal sequence for minimum size transfers when the write traffic is not masked. In this case the XO precharge operation can be consistently used for the precharge operation which begins the universal sequence, while the SPC field is used for the close operation which ends the universal sequence. As can be seen, once the first reference has completed its sequence every reference behind it continues without any delays due to control resource constraints. The only delays are due to external interconnect turnaround delays. The processor cache miss traffic typically does not contain frequent masked write activity but is latency sensitive. Since it does not use the masking capability it can use the XO precharge capability.

Figure 41:
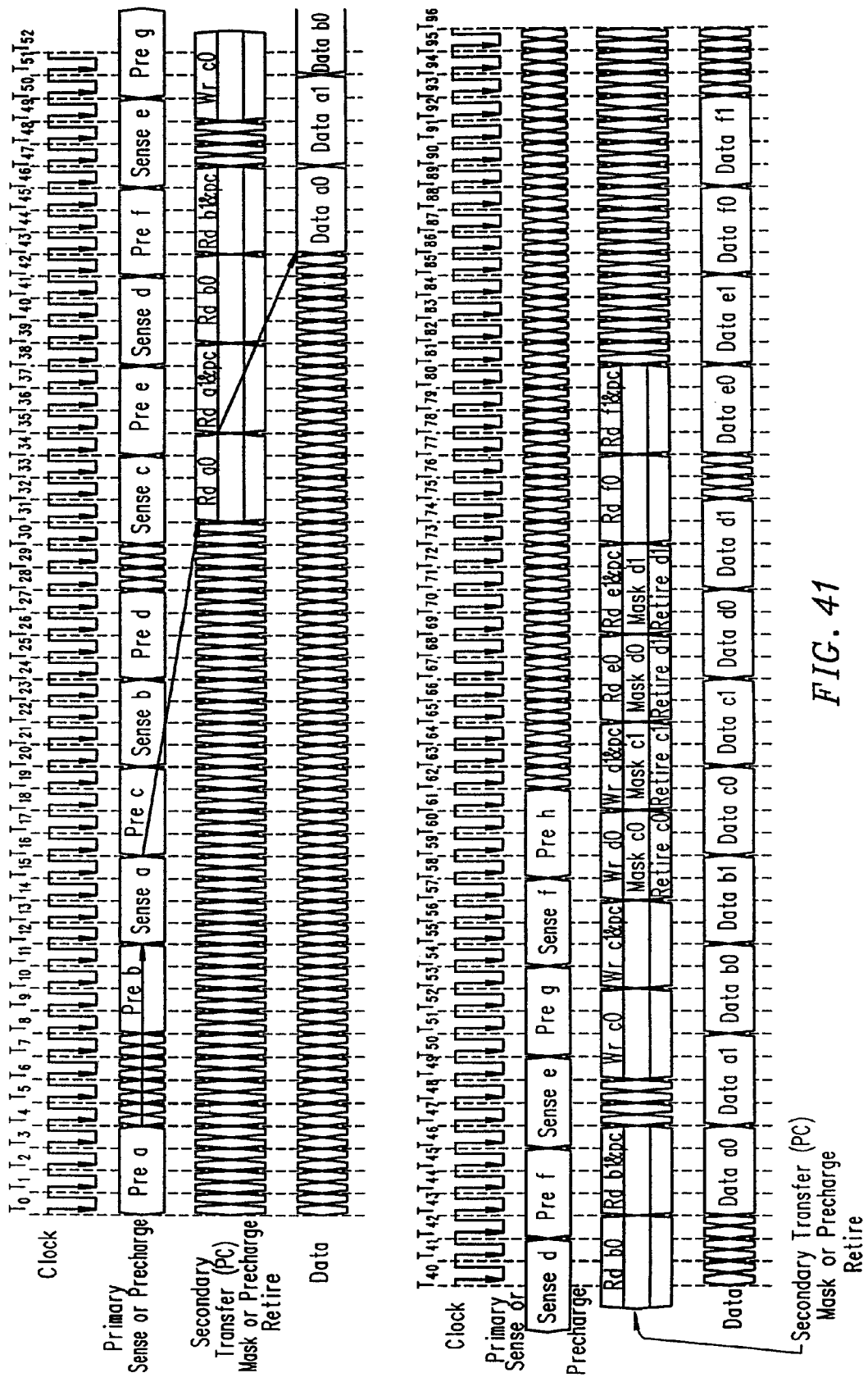
FIG. 41 illustrates universal byte masked writes in accordance with an embodiment of the invention.

FIG. 41 demonstrates the extra degree of freedom permitted when the transfer size per (sense, precharge) pair is twice the minimum transfer size. In this case some of the primary control bandwidth becomes available for precharge control. In this case the universal sequence can be implemented even for masked writes.

Figure 42:
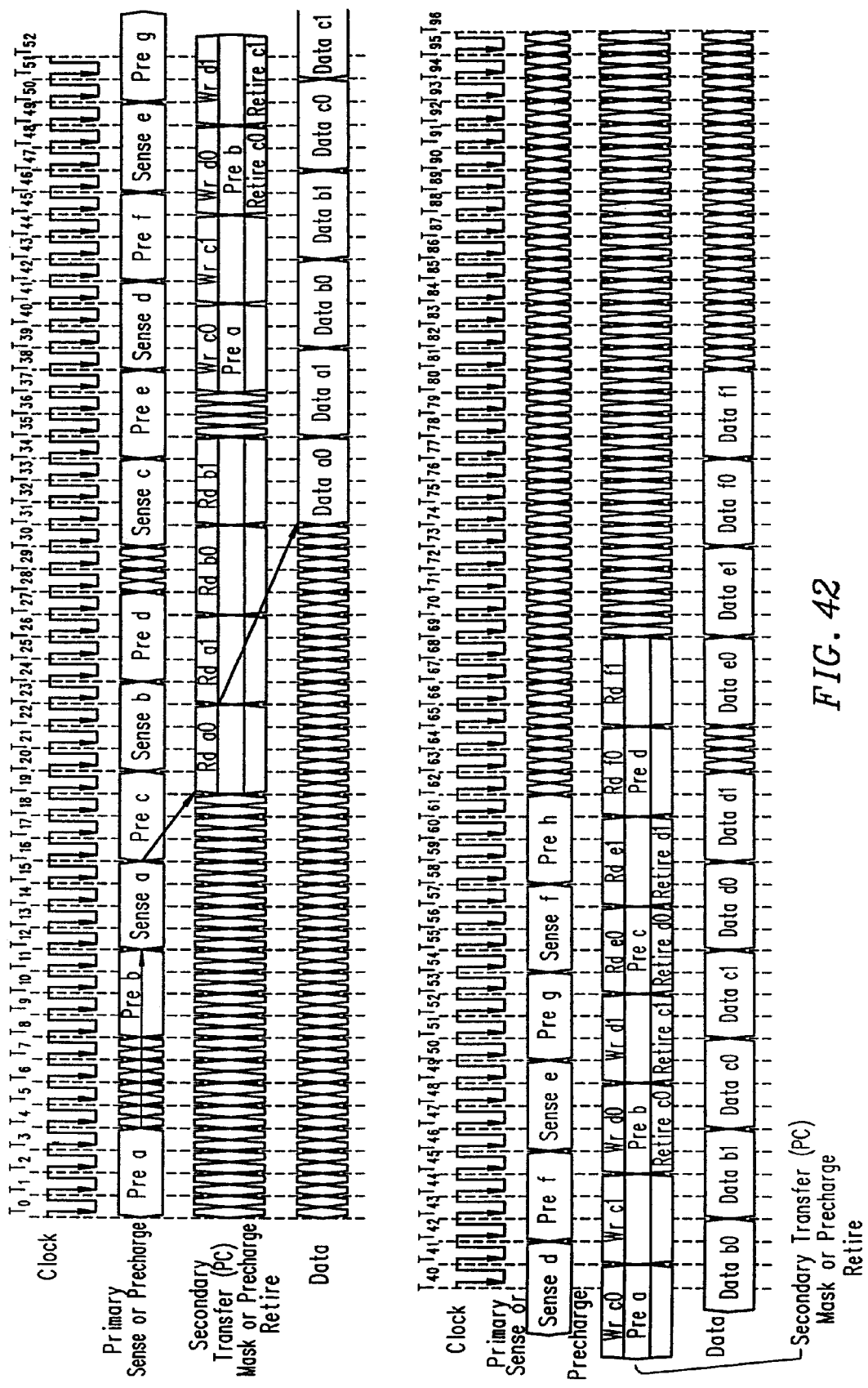
FIG. 42 illustrates reads or unmasked writes in accordance with an embodiment of the invention.

FIG. 42 shows a timing diagram for the universal sequence for reads and unmasked writes when the transfer size is twice the minimum per (precharge, sense) pair. In this case the precharge step of the universal sequence is scheduled with the primary packet precharge while the close step is scheduled with the XO precharge. In this case not only is there adequate control bandwidth but there is more scheduling freedom for each of the steps of the universal sequence compared to the minimum transfer size per (precharge, sense) pair case.

Figure 43:
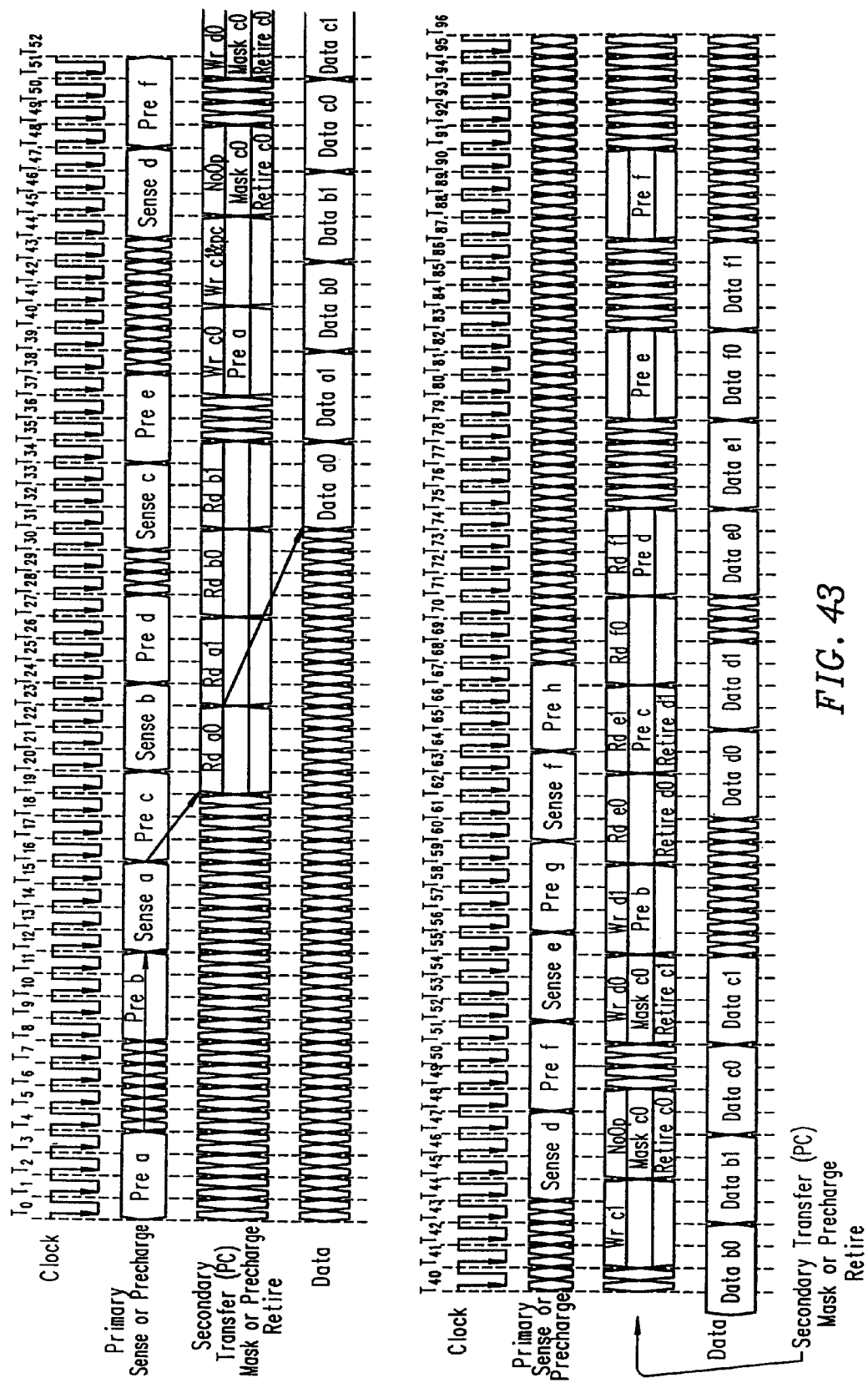
FIG. 43 illustrates reads or masked writes or unmasked writes in accordance with an embodiment of the invention.

FIG. 43 shows a timing diagram for universal reads or masked writes or unmasked writes. In this case the precharge step of the universal sequence is still scheduled in the primary control packet but the close step is scheduled with the XO precharge operation. This reduces the scheduling flexibility compared to the unmasked case 24 but still permits full data pin utilization.

The previous figures demonstrate the conditions in which the universal sequence can be scheduled. The ability to schedule the universal sequence guarantees that there will not be any control conflicts which reduce available data transfer bandwidth. However, none of the nominal reference sequences actually requires two precharges to be scheduled. So there is generally adequate control bandwidth for various mixes of miss and empty traffic as shown in FIG. 44.

FIG. 45 shows a timing diagram for another scheduling alternative when the transfer size is twice the minimum per (precharge, sense) pair and the traffic consists of all empty references. In this case both the sense and precharge can be scheduled on the primary control pins.

Figure 46:
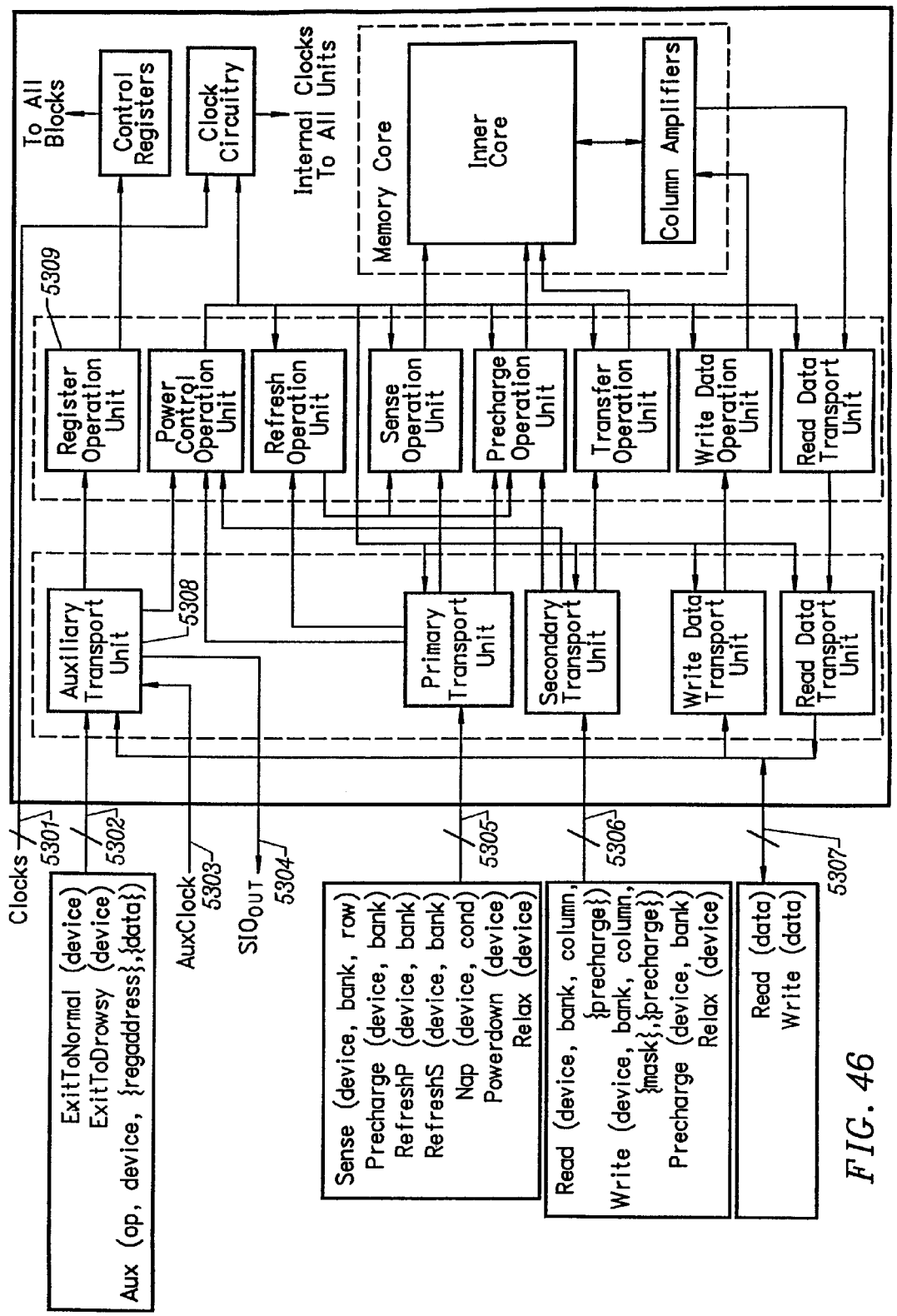
FIG. 46 illustrates a memory block constructed in accordance with an embodiment of the invention.

FIG. 46 shows an alternative embodiment that includes all of the features of FIG. 24, but includes additional capability to initialize, read and write registers, and supply power control information to the memory device. The pinout of this embodiment is summarized in Table 8.

TABLE 8

Alternative High Performance Logical Pin Description

| Name | Count | Type | Description | FIG. 46 Reference |
|---|---|---|---|---|
| CTM CTMN | 2 | RSL | Transmit Clock (Clock To Master) | 5301 |
| CFM CFMN | 2 | RSL | Receive Clock (Clock From Master) | |
| Primary[2:0] | 3 | RSL | Primary request control | 5305 |
| Secondary[4:0] | 5 | RSL | Secondary request control | 5305 |
| DQA[8:0] | 9 | RSL | Low order data byte | 5307 |
| DQB[8:0] | 9 | RSL | High order data byte | |
| SIO[1:0] | 2 | CMOS | Bidirectional serial in/out for device initialization, register ops, power mode control, and device reset. Used to form the SIO daisy chain. | 5302 and 5304 |
| SCK | 1 | CMOS | Serial clock for SIO and CMD pins. | 5303 |
| CMD | 1 | CMOS | Command input used for power mode control, configuring SIO daisy chain, and framing SIO operations. | 5302 |

Figure 47:
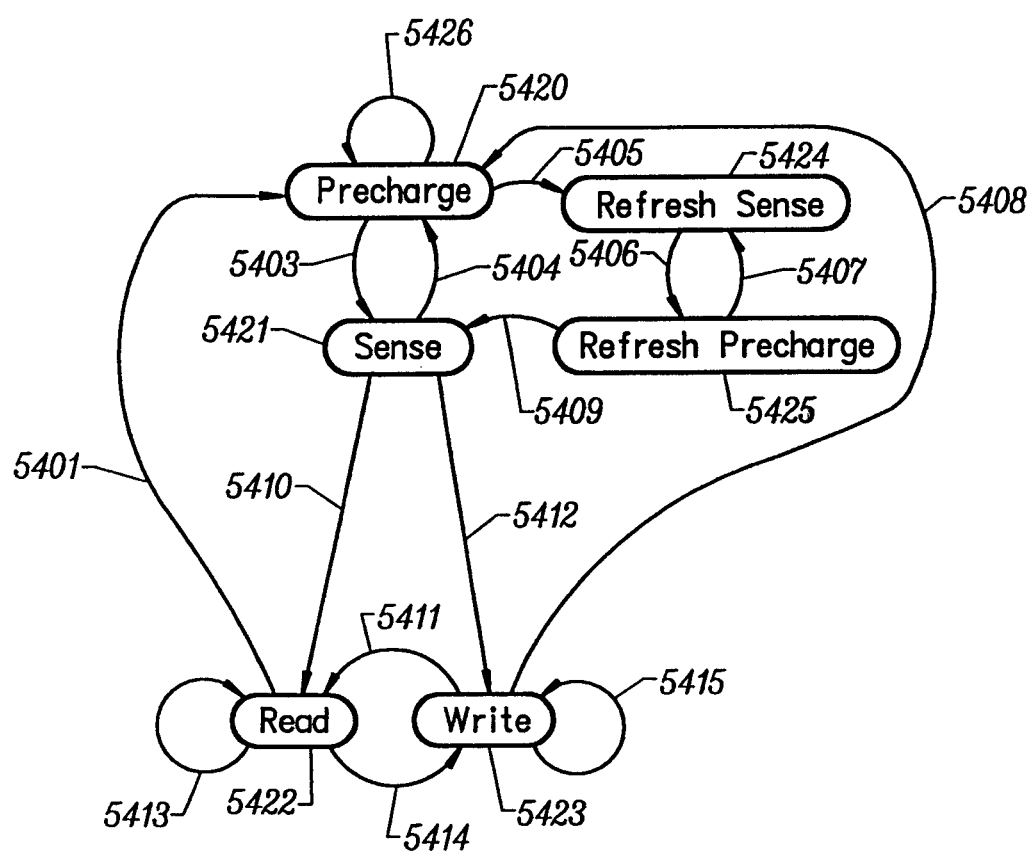
FIG. 47 illustrates DRAM refresh operations utilized in connection with an embodiment of the invention.

FIG. 47 shows the operation sequence for the alternative embodiment of FIG. 46. The refresh specific operations support a novel method of handling core refresh. These new core operations create the requirements for the Refresh and RefreshS operations coded in the primary control packet as shown in FIG. 46. In addition, various power control operations are added to the primary control packet.

Figure 48:
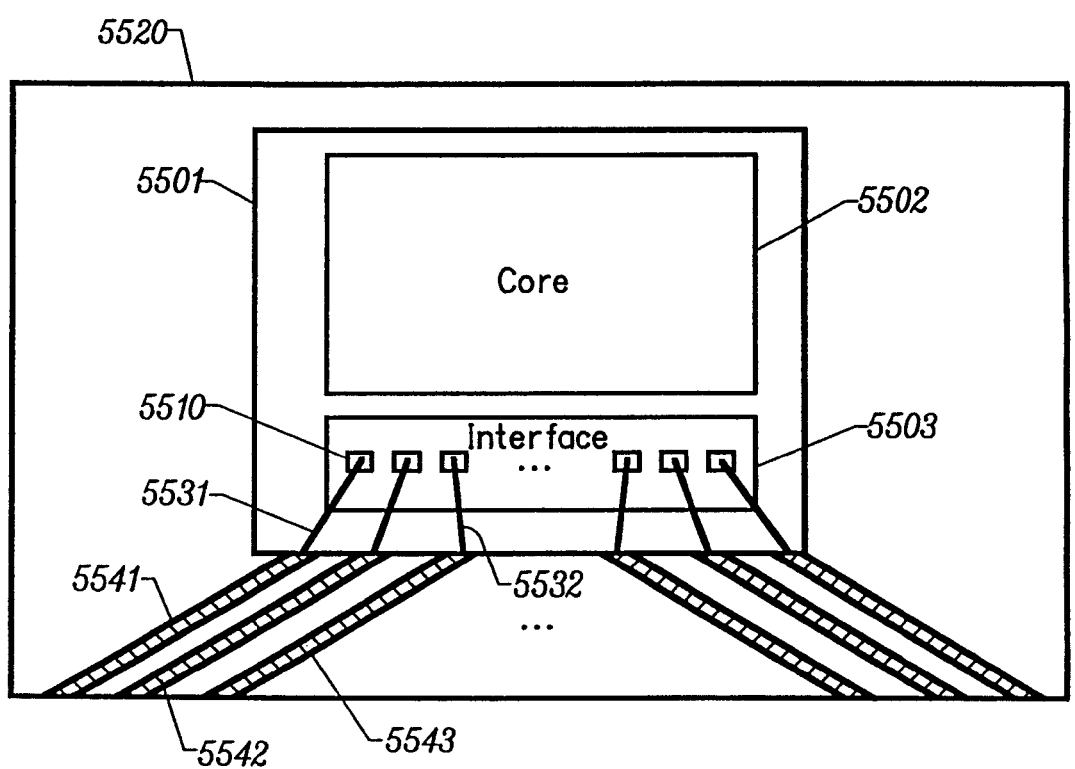
FIG. 48 illustrates isolation pins without accompanying pads in accordance with an embodiment of the invention.

FIG. 48 shows an embodiment of the physical construction in which not all of the pins of the memory device are connected to the bond pads of the die. These non-connected pins provide signal isolation and shielding, thus avoiding the expense of additional bond pads. For example, pin and internal conductor 5542 provides isolation for pin and internal conductors 5541 and 5543. In one embodiment the non-connected pins are signal returns, such as ground, which are adjacent to the connected pins.

Figure 49:
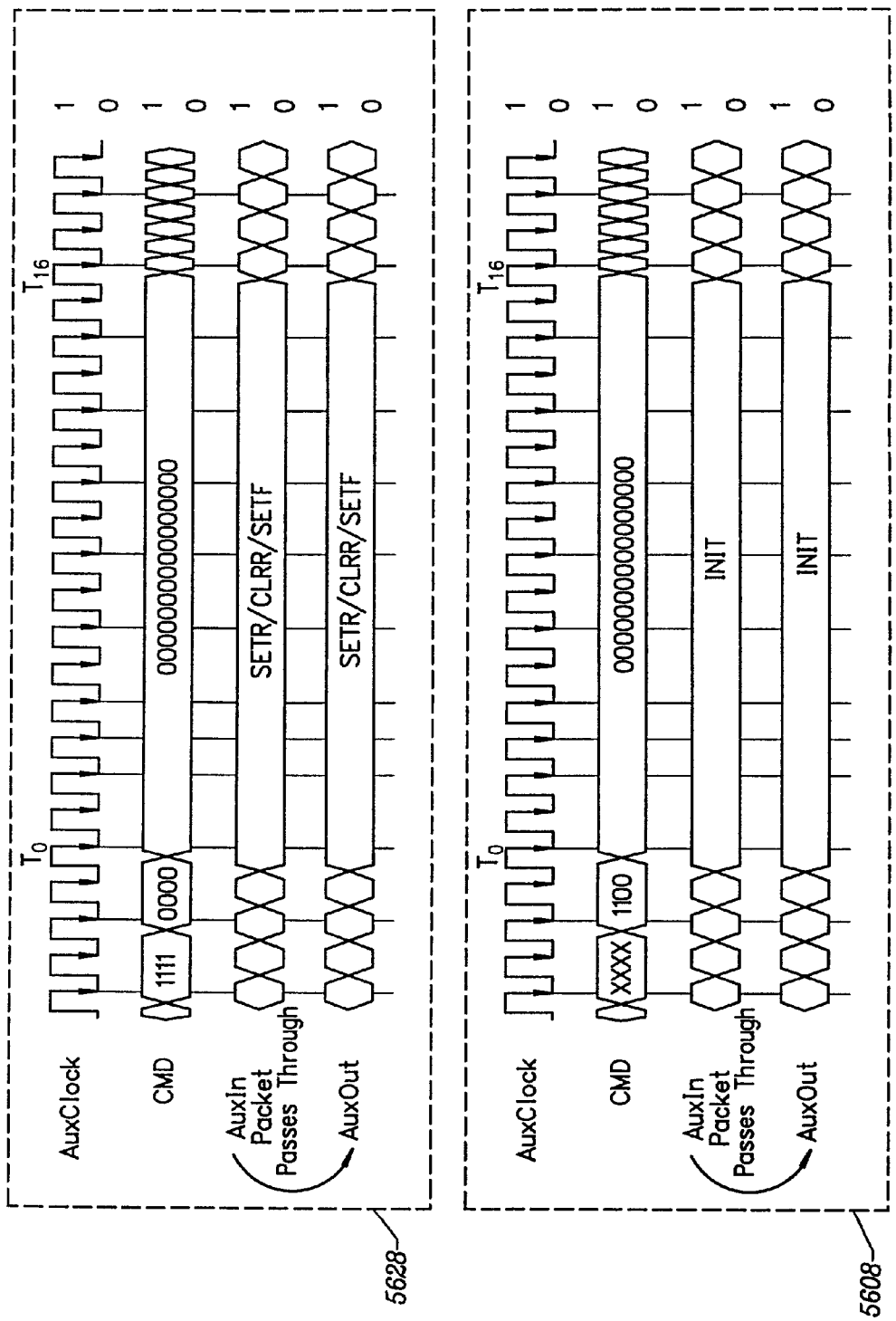
FIG. 49 illustrates the transport of auxiliary information in accordance with an embodiment of the invention.

According to an embodiment of the present invention the memory device of FIG. 46 has Auxiliary information 5302 transported in time according to FIG. 49. Auxiliary information 5302 includes a field to specify an auxiliary operation, a control register address in the memory device, and data to be read or written from or to the control register. AuxClock is the AuxClock signal to the Auxiliary Transport Unit 5308 and is used to receive information from the auxiliary connections 5302 in FIG. 46. Since Auxiliary Transport Unit 5308 operates to reset or initialize the memory device, the unit need only operate slowly. Accordingly, information is framed by the CMD signal, which can be a portion of the auxiliary connections 5302, and received on the AuxIn signal as a serial bit stream. The format of the bit stream is shown in the tables below. As can be noted from Table 9 there are sixteen clock cycles during which a packet of information is received or obtained from the Auxiliary Transport Unit. The Aux information fields are the SOP[3:0] field and the SDEV[4:0] field for the SRQ packet. The SA packet has field SA[11:0], the SINT packet has a field of all zeros and the SD packet has SD[15:0]. In this embodiment of the present invention, the SRQ, SA, SINT and SD packets are received or obtained from the Auxiliary Transport unit in the order listed, unless only the SRQ packet is needed, in which case the other packets are not sent. The functions of each of the fields in the packets is tabulated in Table 10.

TABLE 9

Control Register Packet Formats

| AuxClock | SRQ packet | SA packet | SINT | SD |
|---|---|---|---|---|
| 0 | rsrv | rsrv | 0 | SD15 |
| 1 | rsrv | rsrv | 0 | SD14 |
| 2 | rsrv | rsrv | 0 | SD13 |
| 3 | rsrv | rsrv | 0 | SD12 |
| 4 | rsrv | SA11 | 0 | SD11 |
| 5 | rsrv | SA10 | 0 | SD10 |
| 6 | SOP3 | SA9 | 0 | SD9 |
| 7 | SOP2 | SA8 | 0 | SD8 |
| 8 | SOP1 | SA7 | 0 | SD7 |
| 9 | SOP0 | SA6 | 0 | SD6 |
| 10 | SBC | SA5 | 0 | SD5 |
| 11 | SDEV4 | SA4 | 0 | SD4 |
| 12 | SDEV3 | SA3 | 0 | SD3 |
| 13 | SDEV2 | SA2 | 0 | SD2 |
| 14 | SDEV1 | SA1 | 0 | SD1 |
| 15 | SDEV0 | SA0 | 0 | SD0 |

TABLE 10

Field Description for Control Register Packets

| Field | Description |
|---|---|
| rsrv | Reserved |
| SOP3 ... SOP0 | Serial opcode. Specifies command for control register transaction.<br>0000-SRD. Serial read of control register {SA11 ... SA0} of memory device {SDEV4 ... SDEV0}.<br>0001-SWR. Serial write of control register {SA11 ... SA0} of memory device {SDEV4 ... SDEV0}.<br>0010-SETR. Set Reset bit, all control registers assume their reset values.<br>0011-CLRR. Clear Reset bit, all control registers retain their reset values.<br>0100-SETF. Set fast (normal) clock mode for the clock circuitry |
| SDEV4 ... SDEV0 | Serial device field. |
| SBC | Serial broadcast. When set, memory device ignores {SDEV4 ... SDEV0} serial device field |
| SA11 ... SA0 | Serial address. Selects which control register of the selected memory device is read or written. |
| SD15 ... SD0 | Serial data. The 16 bits of data written to or read from the selected control register of the selected memory device. |

As is shown in Table 10, the memory device is selected by the SDEV field and the SOP field determines the Auxiliary Operation to be performed by the Register Operation Unit 5309 in FIG. 46. The Auxiliary Transport Unit also supports the initialization of the memory device because the Auxiliary Transport Unit itself does not require initialization. This function is shown in FIG. 49. In this diagram the CMD signal received by the Auxiliary Transport Unit has different framing information to indicate that an initialization packet follows. This causes all of the memory devices which are connected together on the same external connections in FIG. 46 to break apart a daisy chain connection formed from AuxIn through AuxOut to AuxIn of the next memory device in the chain as the initialization packet passes through the daisy chain. Next, the first memory device in the chain receives a device identification field from the Auxiliary Transport unit into one of its control registers. This field serves to identify the device for future Auxiliary Transport Operations. After the memory device has its control registers configured properly, the device field register is written again to change a bit, causing the first device in the chain to pass the Auxiliary information it receives to the next device in the chain. The sequence is repeated until all of the memory devices have their control registers properly configured and each device has an unique identification.

Figure 50:
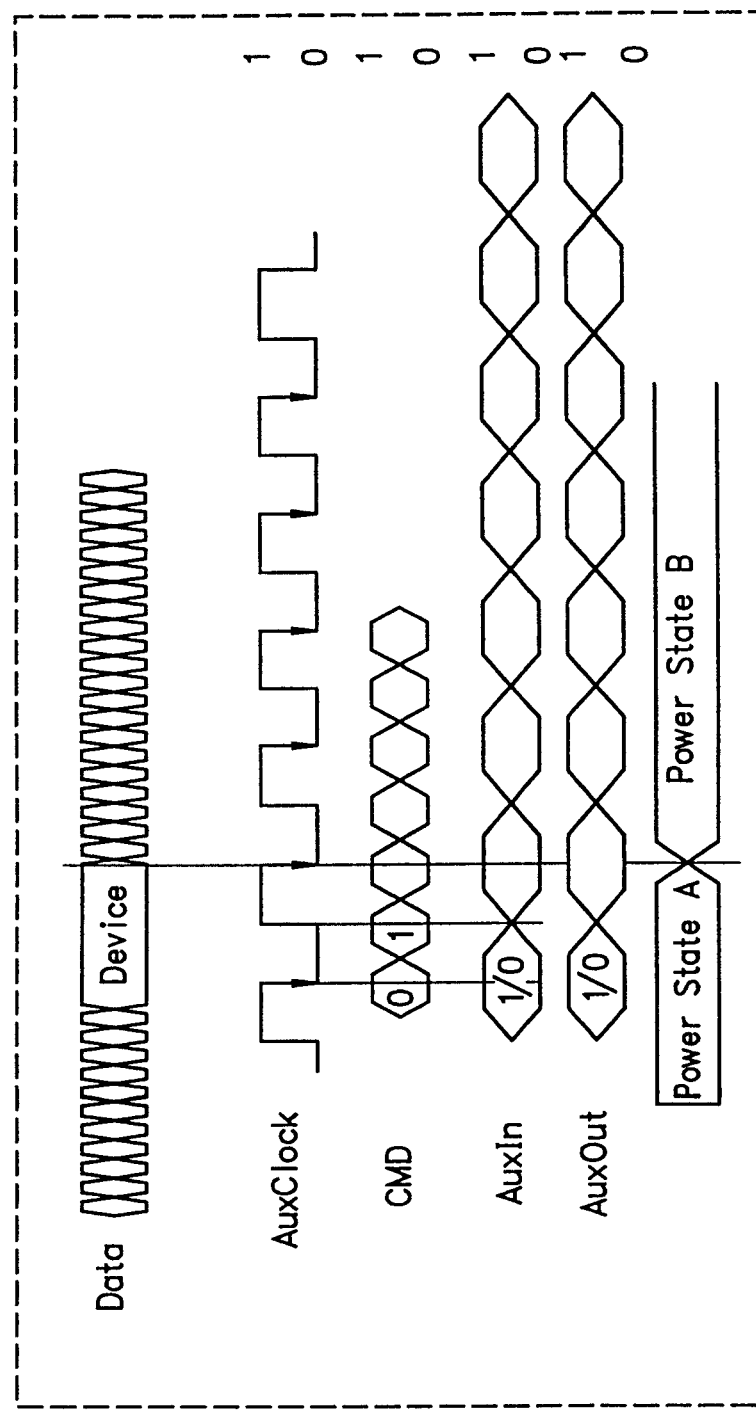
FIG. 50 illustrates framing of the CMD for processing by the auxiliary transport unit in accordance with an embodiment of the invention.

According to an embodiment of the present invention the memory device of FIG. 46 receives power control information, specifying a change in the power mode of the memory device. While power control operations such as Powerdown and Nap are encoded into the precharge packets in one embodiment according to the present invention, other power control operations, such as ExitToNormal and ExitToDrowsy come in through the Auxiliary Transport Unit because the other units in FIG. 46 are not operational due to their reduced power state and because the Auxiliary Transport Unit operates relatively slowly compared to, for example, the Transfer Units, and so does not require much power while the other units are in their reduced power state. These Exit operations may be performed according to FIG. 50. FIG. 50 shows a different framing by the CMD signal so that the Auxiliary Transport Unit can recognize the ExitToNormal or ExitToDrowsy request. According to the timing diagram, when a memory device receives a CMD signal 01 with 0 on the falling edge of AuxClock and 1 on the rising edge of Aux-Clock, the memory device will exit either the power down state or the nap state (Power State A in the timing diagram) and move to a new power state (Power State B in the diagram), depending on the state of the AuxIn Signal Line. If the AuxIn line is a 1, the memory device will exit to the normal state and if the AuxIn line is a 0 the memory device will exit to the drowsy state. In other embodiments, the meaning of the AuxIn bits is reversed. The device that is targeted for the ExitToNormal or ExitToDrowsy operation is received by the Auxiliary Transport Unit 5308 on the data input field via path 5307 of the memory device in FIG. 46.

In an alternate embodiment, each memory device receives a different CMD signal, one for each device, rather than using the data input field via path 5307 to identify the device for a ExitToNormal or ExitToDrowsy operation.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An apparatus for controlling a dynamic random access memory (DRAM), the apparatus comprising:
    an interface to transmit:
        over a first plurality of wires, to the DRAM:
            a first code to indicate that first data is to be written to the DRAM, wherein the first code is to be registered by the DRAM at one or more edges of an external clock signal received by the DRAM;

a column address to indicate a column location of a memory core in the DRAM where the first data is to be written, wherein the column address is to be registered by the DRAM at one or more edges of the external clock signal;

a second code to indicate whether mask information for the first data will be sent to the DRAM, the second code being sent over a subset of wires of the first plurality of wires, wherein:

the mask information indicates whether certain portions of the first data is to be transmitted to the DRAM; and if the second code indicates that mask information will be sent, a portion of the column address and a portion of the mask information are sent over the subset of wires after the second code is sent over the subset of wires, wherein the mask information is to be registered by the DRAM at one or more edges of the external clock signal; and over a second plurality of wires separate from the first plurality of wires, to the DRAM, the first data.

2. The apparatus of claim 1, wherein the interface is to transmit to the DRAM, a third code to indicate that second data is to be written to or read from the DRAM, wherein the third code is to be registered by the DRAM at a first edge of the external clock after the first code is registered, and wherein a portion of the first data is to be registered by the DRAM at a point in time coincident with the first edge of the external clock.

3. The apparatus of claim 1, wherein two consecutive bits of the portion of the mask information are to be transmitted during a clock cycle of the external clock signal.

4. The apparatus of claim 1, wherein the interface is to transmit to the DRAM:

a first bank address that is associated with a first command that specifies activation of a row of memory cells, wherein the first bank address identifies a bank of a plurality of memory cell banks in which to perform the activation;

a second bank address that is associated with the column address; and a second command that specifies a write operation to be performed, wherein the second bank address identifies a bank of a plurality of memory cell banks in which to perform the write operation.

5. The apparatus of claim 4, wherein:

the first command and the first bank address are to be transmitted in a first packet over the first plurality of wires; and the second command, the second bank address, the column address, the first code and the second code are to be transmitted in a second packet over the first plurality of wires.

6. The apparatus of claim 4, wherein:

a first portion of the first plurality of wires are to transmit the first command and the first bank address; and a second portion of the first plurality of wires are to transmit the second command, the second bank address, the column address, the first code and the second code, wherein the second portion of the first plurality of wires comprises the subset of the first plurality of wires.

7. The apparatus of claim 6, wherein:

the first portion of the first plurality of wires is a primary interconnect consisting of three signal lines;

the second portion of the first plurality of wires is a secondary interconnect consisting of five signal lines; and the second plurality of wires is a data bus consisting of eighteen signal lines.

8. A dynamic random access memory (DRAM) device, comprising:

clock circuitry for receiving an external clock signal;

a first interface to receive:

a first code to indicate that first data is to be written to the DRAM, wherein the first code is registered by the DRAM at one or more edges of the external clock signal;

a column address to indicate a column location of a memory core in the DRAM where the first data is to be written, wherein the column address is registered by the DRAM at one or more edges of the external clock signal;

a second code to indicate whether mask information for the first data will be sent to the DRAM, the second code being sent over a subset of wires of the first plurality of wires, wherein:

the mask information indicates whether certain portions of the first data is transmitted to the DRAM; and if the second code indicates that mask information will be sent, a portion of the column address and a portion of the mask information are received over the subset of wires after the second code is received over the subset of wires, wherein the mask information be registered by the DRAM at one or more edges of the external clock signal; and a second interface, separate from the first interface, to receive the first data.

9. The DRAM device of claim 8, wherein the first interface is to receive a third code to indicate that second data is to be written to or read from the DRAM, wherein the third code is registered by the DRAM at a first edge of the external clock after the first code is registered, and wherein a portion of the first data is registered by the DRAM at a point in time coincident with the first edge of the external clock.

10. The DRAM device of claim 8, wherein two consecutive bits of the portion of the mask information are received during a clock cycle of the external clock signal.

11. The DRAM device of claim 8, wherein the first interface is to receive:

a first bank address that is associated with a first command that specifies activation of a row of memory cells, wherein the first bank address identifies a bank of a plurality of memory cell banks in which to perform the activation;

a second bank address that is associated with the column address; and a second command that specifies a write operation to be performed, wherein the second bank address identifies a bank of a plurality of memory cell banks in which to perform the write operation.

12. A method of operation of an apparatus that controls a dynamic random access memory (DRAM), the method comprising:

over a first plurality of wires:

transmitting, to the DRAM, a first code to indicate that first data is to be written to the DRAM, wherein the first code is to be registered by the DRAM at one or more edges of an external clock signal received by the DRAM;

transmitting, to the DRAM, a column address to indicate a column location of a memory core in the DRAM where the first data is to be written, wherein the column address is to be registered by the DRAM at one or more edges of the external clock signal;

transmitting, to the DRAM, a second code to indicate whether mask information for the first data will be sent to the DRAM, the second code being sent over a subset of wires of the first plurality of wires, wherein:

the mask information indicates whether certain portions of the first data is to be transmitted to the DRAM; and if the second code indicates that mask information will be sent, a portion of the column address and a portion of the mask information are sent over the subset of wires after the second code is sent over the subset of wires, wherein the mask information is to be registered by the DRAM at one or more edges of the external clock signal; and over a second plurality of wires separate from the first plurality of wires, transmitting, to the DRAM, the first data.

13. The method of claim 12, further comprising transmitting, to the DRAM, a third code to indicate that second data is to be written to or read from the DRAM, wherein the third code is to be registered by the DRAM at a first edge of the external clock after the first code is registered and a portion of the first data is to be registered by the DRAM at a point in time coincident with the first edge of the external clock.

14. The method of claim 12, further comprising transmitting, to the DRAM, two consecutive bits of the portion of the mask information during a clock cycle of the external clock signal.

15. The method of claim 12, further comprising transmitting, to the DRAM:

a first bank address that is associated with a first command that specifies activation of a row of memory cells, wherein the first bank address identifies a bank of a plurality of memory cell banks in which to perform the activation;

a second bank address that is associated with the column address; and a second command that specifies a write operation to be performed, wherein the second bank address identifies a bank of a plurality of memory cell banks in which to perform the write operation.

16. A method of operation of a dynamic random access memory (DRAM) device, the method comprising:

receiving an external clock signal;

receiving, at a first interface, a first code to indicate that first data is to be written to the DRAM, wherein the first code is registered at one or more edges of the external clock signal;

receiving, at the first interface, a column address to indicate a column location of a memory core in the DRAM where the first data is to be written, wherein the column address is registered by the DRAM at one or more edges of the external clock signal;

receiving, at the first interface, a second code to indicate whether mask information for the first data will be sent to the DRAM, the second code being sent over a subset of wires of the first plurality of wires, wherein:

the mask information indicates whether certain portions of the first data is transmitted to the DRAM; and if the second code indicates that mask information will be sent, a portion of the column address and a portion of the mask information are received over the subset of wires after the second code is received over the subset of wires, wherein the mask information be registered by the DRAM at one or more edges of the external clock signal; and receiving at a second interface that is separate from the first interface, the first data.

17. The method of claim 16, further comprising receiving, at the first interface, a third code to indicate that second data is to be written to or read from the DRAM, wherein the third code is registered by the DRAM at a first edge of the external clock after the first code is registered and a portion of the first data is registered by the DRAM at a point in time coincident with the first edge of the external clock.

18. The method of claim 16, further comprising receiving, at the DRAM, two consecutive bits of the portion of the mask information during a clock cycle of the external clock signal.

19. The method of claim 16, further comprising receiving, at the first interface:

a first bank address that is associated with a first command that specifies activation of a row of memory cells, wherein the first bank address identifies a bank of a plurality of memory cell banks in which to perform the activation;

a second bank address that is associated with the column address; and a second command that specifies a write operation to be performed, wherein the second bank address identifies a bank of a plurality of memory cell banks in which to perform the write operation.

* * * * *